(12) United States Patent
Havens et al.

(10) Patent No.: US 10,180,565 B2
(45) Date of Patent: Jan. 15, 2019

(54) VIEWING OPTIC WITH AN INTEGRATED DISPLAY SYSTEM

(71) Applicant: Sheltered Wings, Inc., Middleton, WI (US)

(72) Inventors: Calen Havens, Middleton, WI (US); Will Lowry, Middleton, WI (US); Ian Klemm, Middleton, WI (US); Samuel Hamilton, Middleton, WI (US); Garrison Bollig, Middleton, WI (US); Craig Schultz, Middleton, WI (US); Andrew Carlson, Middleton, WI (US); Jason Lyle, Middleton, WI (US); David M. Hamilton, Middleton, WI (US)

(73) Assignee: Sheltered Wings, Inc., Barneveld, WI (US)

( * ) Notice: Subject to any disclaimer, the term of this patent is extended or adjusted under 35 U.S.C. 154(b) by 0 days.

(21) Appl. No.: 15/889,534

(22) Filed: Feb. 6, 2018

(65) Prior Publication Data

US 2018/0224244 A1 Aug. 9, 2018

Related U.S. Application Data

(60) Provisional application No. 62/455,274, filed on Feb. 6, 2017, provisional application No. 62/466,150, filed
(Continued)

(51) Int. Cl.
*G02B 23/00* (2006.01)
*G02B 23/04* (2006.01)
(Continued)

(52) U.S. Cl.
CPC .............. *G02B 23/04* (2013.01); *F41G 1/38* (2013.01); *F41G 1/383* (2013.01); *F41G 3/065* (2013.01);
(Continued)

(58) Field of Classification Search
CPC ... F41G 1/065; F41G 1/30; F41G 1/32; F41G 1/35; F41G 1/38; F41G 1/42; F41G 1/44;
(Continued)

(56) References Cited

U.S. PATENT DOCUMENTS 2,514,257 A 7/1950 Reavis
3,058,391 A 10/1962 Leupold
(Continued)

FOREIGN PATENT DOCUMENTS

EP 1340956 B1 12/2006
EP 1772695 B2 7/2010
(Continued)

OTHER PUBLICATIONS

ATN X-Sight 3-12x Digital Scopes for Rifles—Day & Night vision optics, https://www.atncorp.com/x-sight-night-vision-rifle-scope-3-12x, printed Jul. 12, 2016, 10 pages.
(Continued)

*Primary Examiner* — Mustak Choudhury
(74) *Attorney, Agent, or Firm* — Husch Blackwell LLP

(57) ABSTRACT

The disclosure relates to a viewing optic. In one embodiment, the disclosure relates to a viewing optic having an integrated display system. In one embodiment, the disclosure relates to a viewing optic having an integrated display system for generating images that are projected into the first focal plane of an optical system.

24 Claims, 53 Drawing Sheets

Related U.S. Application Data on Mar. 2, 2017, provisional application No. 62/485,129, filed on Apr. 13, 2017, provisional application No. 62/616,799, filed on Jan. 12, 2018.

(51) Int. Cl.

| | | |
|---|---|---|
| *G02B 7/04* | (2006.01) | |
| *G02B 23/16* | (2006.01) | |
| *F41G 1/38* | (2006.01) | |
| *F41G 3/06* | (2006.01) | |
| *G02B 23/14* | (2006.01) | |
| *G02B 9/60* | (2006.01) | |
| *G02B 27/28* | (2006.01) | |
| *H01L 27/32* | (2006.01) | |
| *F41G 3/14* | (2006.01) | |
| *F41G 3/16* | (2006.01) | |
| F41G 3/26 | (2006.01) | |
| F41G 3/08 | (2006.01) | |
| F41G 1/30 | (2006.01) | |

(52) U.S. Cl.
CPC ............ *F41G 3/142* (2013.01); *F41G 3/165* (2013.01); *G02B 7/04* (2013.01); *G02B 9/60* (2013.01); *G02B 23/14* (2013.01); *G02B 23/16* (2013.01); *G02B 27/283* (2013.01); *H01L 27/3225* (2013.01); *F41G 1/30* (2013.01); *F41G 3/08* (2013.01); *F41G 3/2605* (2013.01)

(58) Field of Classification Search
CPC ... F41G 1/46; F41G 1/54; F41G 1/345; F41G 1/383; F41G 1/387; F41G 1/393; F41G 1/473; F41G 1/545; F41G 3/02; F41G 3/04; F41G 3/06; F41G 3/08; F41G 3/12; F41G 3/165; F41G 3/323; F41G 11/00; F41G 11/003; F41G 1/48; F41G 3/065; F41G 3/142; F41G 3/145; F41A 21/48; F41C 27/22; G02B 11/00; G02B 7/022; G02B 7/023; G02B 1/01; G02B 23/10; G02B 23/14; G02B 23/16; G02B 23/18; G02B 23/20; G02B 23/105; G02B 23/2407; G02B 27/017; G02B 27/0172; G02B 27/0189; G02B 27/0101; G02B 27/32; G02B 27/36; H01L 27/3225; G01C 3/08; G06T 5/20; G06T 5/50
USPC ................ 359/352–354, 399, 419, 630, 634; 42/111–123; 235/404–407; 250/330–333
See application file for complete search history.

(56) References Cited

U.S. PATENT DOCUMENTS

| | | |
|---|---|---|
| 3,464,770 A | 9/1969 | Schmidt |
| 3,533,696 A | 10/1970 | Winter |
| 4,248,496 A | 2/1981 | Akin et al. |
| 4,395,096 A | 7/1983 | Gibson |
| 4,554,744 A | 11/1985 | Huckenbeck |
| 4,561,204 A | 12/1985 | Binion |
| 4,695,161 A | 9/1987 | Reed |
| 4,965,439 A | 10/1990 | Moore |
| 5,026,158 A | 6/1991 | Golubic |
| 5,052,801 A | 10/1991 | Downes, Jr. et al. |
| 5,092,670 A | 3/1992 | Preston |
| 5,225,838 A | 7/1993 | Kanter et al. |
| 5,291,263 A | 3/1994 | Kong |
| 5,311,203 A | 5/1994 | Norton |
| 5,339,720 A | 8/1994 | Pellarin et al. |
| 5,355,224 A | 10/1994 | Wallace |
| 5,375,072 A | 12/1994 | Cohen |
| 5,491,546 A | 2/1996 | Wascher et al. |
| 5,528,354 A | 6/1996 | Uwira |
| 5,669,174 A | 9/1997 | Teetzel |
| 5,686,690 A | 11/1997 | Lugheed et al. |
| 5,721,641 A | 2/1998 | Aoki |
| 5,771,623 A | 6/1998 | Pemstich et al. |
| 5,903,996 A * | 5/1999 | Morley ................ G02B 23/12 359/353 |
| 5,926,259 A | 7/1999 | Bamberger et al. |
| 6,128,054 A | 10/2000 | Schwarzenberger |
| 6,132,048 A | 10/2000 | Gao et al. |
| 6,247,259 B1 | 6/2001 | Tsadka et al. |
| 6,252,706 B1 | 6/2001 | Kaladgew |
| 6,269,581 B1 | 8/2001 | Groh |
| 6,516,551 B2 | 2/2003 | Gaber |
| 6,516,699 B2 | 2/2003 | Sammut et al. |
| 6,640,482 B2 | 11/2003 | Carlson |
| 6,691,447 B1 | 2/2004 | Otteman |
| 6,862,832 B2 | 3/2005 | Barrett |
| 7,124,531 B1 | 10/2006 | Florence et al. |
| 7,196,329 B1 | 3/2007 | Wood et al. |
| 7,269,920 B2 | 9/2007 | Staley, III |
| 7,295,296 B1 | 11/2007 | Galli |
| 7,296,358 B1 | 11/2007 | Murphy et al. |
| 7,310,071 B2 | 12/2007 | Cuprys |
| 7,325,320 B2 | 2/2008 | Gnepf et al. |
| 7,333,270 B1 | 2/2008 | Pochapsky et al. |
| 7,516,571 B2 | 4/2009 | Scrogin et al. |
| 7,575,327 B2 | 8/2009 | Uchiyama |
| 7,586,586 B2 | 9/2009 | Constantikes |
| 7,654,029 B2 | 2/2010 | Peters et al. |
| 7,690,145 B2 | 4/2010 | Peters et al. |
| 7,703,679 B1 | 4/2010 | Bennetts et al. |
| 7,719,769 B2 | 5/2010 | Sugihara et al. |
| 7,721,481 B2 | 5/2010 | Houde-Walter |
| 7,805,020 B2 | 9/2010 | Trudeau et al. |
| 7,859,650 B2 | 12/2010 | Vermillion et al. |
| 7,864,432 B2 | 1/2011 | Ottney |
| 7,905,046 B2 | 3/2011 | Smith et al. |
| 8,001,714 B2 | 8/2011 | Davidson |
| 8,046,951 B2 | 11/2011 | Peters et al. |
| 8,051,597 B1 | 11/2011 | D'Souza et al. |
| 8,081,298 B1 | 12/2011 | Cross |
| 8,201,741 B2 | 6/2012 | Bennetts et al. |
| 8,353,454 B2 | 1/2013 | Sammut et al. |
| 8,365,455 B2 | 2/2013 | Davidson et al. |
| 8,448,372 B2 | 5/2013 | Peters et al. |
| 8,468,930 B1 | 6/2013 | Bell |
| 8,656,630 B2 | 2/2014 | Sammut |
| 8,713,843 B2 | 5/2014 | Windauer |
| 8,826,583 B2 | 9/2014 | Kepler et al. |
| 8,833,655 B2 | 9/2014 | McCarty et al. |
| 8,857,714 B2 | 10/2014 | Benson |
| 9,038,901 B2 | 5/2015 | Paterson et al. |
| 9,121,671 B2 | 9/2015 | Everett |
| 9,151,574 B2 | 10/2015 | Lowrey, III |
| 9,175,927 B2 | 11/2015 | Tubb |
| 9,279,975 B2 | 3/2016 | Berlips |
| 9,310,163 B2 | 4/2016 | Bay |
| 9,323,061 B2 | 4/2016 | Edwards et al. |
| 9,389,425 B2 | 7/2016 | Edwards et al. |
| 9,429,745 B2 | 8/2016 | Brumfield |
| 2002/0159148 A1 | 10/2002 | Huber |
| 2003/0010190 A1 | 1/2003 | Sammut et al. |
| 2003/0012035 A1 | 1/2003 | Bernard |
| 2003/0132860 A1 | 7/2003 | Feyereisen et al. |
| 2004/0025396 A1 | 2/2004 | Schlierbach |
| 2004/0201886 A1 | 10/2004 | Skinner et al. |
| 2005/0021282 A1 | 1/2005 | Sammut et al. |
| 2005/0046706 A1 | 3/2005 | Sesek et al. |
| 2005/0198885 A1 | 9/2005 | Staley, III |
| 2005/0250085 A1 | 11/2005 | Lemp, III et al. |
| 2005/0268521 A1 | 12/2005 | Cox et al. |
| 2006/0048432 A1 | 3/2006 | Staley et al. |
| 2006/0201047 A1 | 9/2006 | Lowrey |
| 2006/0254115 A1 | 11/2006 | Thomas et al. |
| 2007/0044364 A1 | 3/2007 | Sammut et al. |
| 2007/0097351 A1 | 3/2007 | York et al. |
| 2007/0137008 A1 | 6/2007 | Anstee |

(56) References Cited

U.S. PATENT DOCUMENTS

| | | |
|---|---|---|
| 2007/0137088 A1 | 6/2007 | Peters et al. |
| 2007/0157502 A1 | 7/2007 | Holmberg |
| 2007/0180751 A1 | 8/2007 | Joannes |
| 2007/0234626 A1 | 10/2007 | Murdock et al. |
| 2007/0277421 A1 | 12/2007 | Perkins et al. |
| 2008/0039962 A1 | 2/2008 | Mcrae |
| 2008/0163536 A1 | 7/2008 | Koch et al. |
| 2008/0290164 A1 | 11/2008 | Papale et al. |
| 2009/0200376 A1 | 8/2009 | Peters et al. |
| 2009/0205239 A1 | 8/2009 | Smith, III |
| 2009/0225236 A1 | 9/2009 | Yoon |
| 2009/0320348 A1 | 12/2009 | Kelly |
| 2010/0207152 A1 | 8/2010 | Won |
| 2010/0225833 A1 | 9/2010 | Methe et al. |
| 2010/0275768 A1 | 11/2010 | Quinn |
| 2011/0121159 A1 | 5/2011 | Mourar et al. |
| 2011/0141381 A1 | 6/2011 | Minikey et al. |
| 2011/0162250 A1 | 7/2011 | Windauer et al. |
| 2011/0314720 A1 | 12/2011 | Cheng |
| 2012/0000108 A1 | 1/2012 | Zusman |
| 2012/0075168 A1 | 3/2012 | Osterhout et al. |
| 2012/0097741 A1 | 4/2012 | Karcher |
| 2012/0126001 A1 | 5/2012 | Justice et al. |
| 2012/0186131 A1 | 7/2012 | Windauer |
| 2013/0033746 A1 | 2/2013 | Brumfield |
| 2013/0167425 A1 | 7/2013 | Crispin |
| 2013/0199074 A1 | 8/2013 | Paterson et al. |
| 2013/0279013 A1 | 10/2013 | Edwards et al. |
| 2014/0059915 A1 | 3/2014 | Sammut et al. |
| 2014/0063261 A1 | 3/2014 | Betensky et al. |
| 2014/0075820 A1 | 3/2014 | Ben-Ami |
| 2014/0101982 A1 | 4/2014 | McPhee |
| 2014/0110482 A1 | 4/2014 | Bay |
| 2014/0182187 A1 | 7/2014 | McHale |
| 2014/0226214 A1* | 8/2014 | Edwards ............... G02B 23/10 359/630 |
| 2015/0055119 A1 | 2/2015 | Hamilton |
| 2015/0106046 A1 | 4/2015 | Chen et al. |
| 2015/0233674 A1 | 8/2015 | Beckman |
| 2015/0247702 A1 | 9/2015 | Davidson et al. |
| 2015/0362288 A1 | 12/2015 | Sammut et al. |
| 2015/0369565 A1 | 12/2015 | Kepler |
| 2016/0061566 A1 | 3/2016 | Chen |
| 2016/0138890 A1 | 5/2016 | Hofmann et al. |
| 2016/0169625 A1 | 6/2016 | Richards et al. |
| 2016/0223293 A1 | 8/2016 | Maryfield et al. |
| 2016/0223805 A1 | 8/2016 | Waterman et al. |
| 2016/0265880 A1 | 9/2016 | Maryfield et al. |
| 2017/0227327 A1 | 8/2017 | Thomas et al. |

FOREIGN PATENT DOCUMENTS

| | | |
|---|---|---|
| WO | 2006/060007 A1 | 6/2006 |
| WO | 2014/167276 A1 | 10/2014 |
| WO | 2015/103155 A1 | 7/2015 |

OTHER PUBLICATIONS

Barska 2013 Master Catalog, 2013, 124 pages.
T. Edwards et al., High-brightness display in integrated weapon sight systems abstract, http://proceedings.spiedigitallibrary.org/proceeding.aspx?articleid=1882790, printed Jul. 12, 2016, 2 pages.
3-9x First Focal Plane Adjustable Objective Rifle Scope—Monstrum Tactical; http://monstrumtractical.com/products/3-9x-first-focal-plan-rifle-scope-adjustable-objective-range-finder-reticle?variant=15621625091, printed Jul. 12, 2016, 7 pages.
Nighforce Optics, Inc., RETICLE MIL-R product sheets, 2013, 2 pages.
International Search Report dated Apr. 26, 2018 for International Patent Appln. No. PCT/US2018/017079, filed on Feb. 6, 2018, 3 pages.
Written Opinion of the International Search Authority dated Apr. 26, 2018 for International Patent Appln. No. PCT/US2018/017079, filed on Feb. 6, 2018, 26 pages.

* cited by examiner

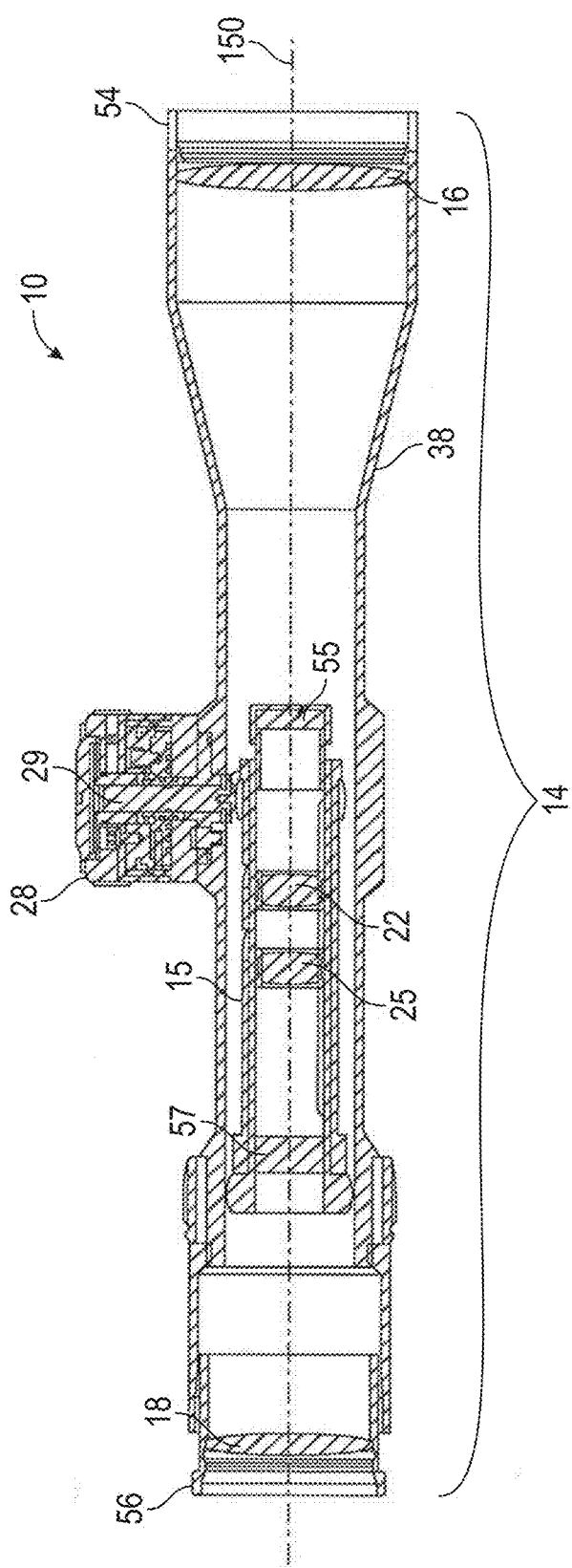

VIEWING OPTIC WITH AN INTEGRATED
DISPLAY SYSTEM

CROSS-REFERENCE TO RELATED
APPLICATIONS

This application is a non-provisional application and claims priority to U.S. Provisional Patent Application No. 62/455,274 filed Feb. 6, 2017, U.S. Provisional Patent Application No. 62/466,150 filed Mar. 2, 2017, U.S. Provisional Patent Application No. 62/485,129 filed Apr. 13, 2017, and U.S. Provisional Patent Application No. 62/616,799 filed Jan. 12, 2018, all of which are incorporated herein by reference in their entirety.

FIELD

The disclosure relates to a viewing optic with an integrated display system. In one embodiment, the viewing optic has an active display system that generates and projects the image into a first focal plane of the optical system. In yet another embodiment, the viewing optic has a main body and a base coupled to the main body.

BACKGROUND

Riflescopes have been used for well over a century and while the quality and features of these devices have improved tremendously over the years, the core components (and the limitations of those components) used in their design, manufacture and use are still very much the same today as they were 100 years ago. Riflescopes create a magnified or unmagnified image of a scene that is distant from the shooter on a focal plane, which is coincident with an aiming feature, or reticle. The reticle consists of wire or a material deposited in a pattern onto a glass surface and it is used as an aiming reference, which corresponds to the trajectory of the rifle to which it's attached. The reticle may also have specific features included to aid the shooter in making distance judgements and in compensating for bullet deviation at different distances.

Turrets are also used to make adjustments to the reticle position in relation to the target in order to compensate for bullet deviation. This is a very developed and reliable system that can be used in the hands of the experienced and skilled shooter to make challenging long range shots. With the aid of a laser rangefinder (LRF) and a ballistic computer and careful attention to detail, an experienced shooter can routinely hit targets at the maximum effective range of their firearm by making the necessary mechanical adjustments to the firearm and/or executing the correct holds on the reticle pattern.

While this system performs well, there is always a desire to improve upon the system. In particular, there is a desire to reduce the complexity involved in hitting long range targets. A large amount of information is needed on a shot-by-shot basis in order to effectively hit long range targets and the shooter must be able to process this information and make the correct judgments and calculations in real time. In addition to the riflescope, other tools are needed by the shooter to ensure accurate shot placement. For instance, a bubble level mounted externally to the riflescope is needed to ensure that the optic is level before executing a shot. This requires the shooter to remove his head from the pupil of the optic to check his or her level.

A laser rangefinder and ballistic computer are also needed to measure target range and calculate a bullet trajectory. This once again requires the shooter to attend to an external device and then remember the data when making the necessary adjustments. If a weapon mounted laser rangefinder is used, then the shooter needs to take special care to ensure that the aiming point of the optic is corresponding exactly with the aiming point of the LRF.

Additionally, and not trivial to the use of riflescopes, is that they are only useful during daylight hours. Once night begins to descend, thermal and/or night vision devices must be attached to the weapon in front of the riflescope. These devices capture other forms of radiation that are not visible to the human eye due to their wavelength or low intensity. These devices then either recreate the image of the scene or intensify it and reimage the scene into the objective of the riflescope. Effective and necessary for low light conditions, these devices are also heavy and large.

In the particular case of thermal imaging devices, a thermal scene is imaged via infrared optics onto a special thermal sensor. The image is then recreated on a micro display and the micro display is, in turn, reimaged into the objective of the riflescope with a visible optics system. The two separate optical systems required to accomplish this result in a rather large, heavy, and expensive device.

As technology advances, there is a need for some level of system integration in order to reduce the heavy processing requirements placed on the shooter. This integration is also required to decrease the "time to engagement" that is traditionally quite long when multiple devices have to be referenced and calculations and adjustments have to be made. And finally, the size and weight of additional devices needed for effective use of the riflescope in low light conditions can be reduced with a more integrated solution.

Previous devices have attempted to address some of these issues in different ways with varying degrees of success. However, all attempts prior have implemented their solutions in the Second Focal Plane of the optic. This is very disadvantageous because the second focal plane in a riflescope is only well correlated to the image of the scene at a single magnification setting. The location of the aiming point is only accurate at one location in the turret adjustment as well. Because of this serious limitation, additional electronics are necessary to track the variables in the rest of the system and adjust the aiming point accordingly. Other systems provide approximate aiming point solutions through the illumination of features at generic, coarsely-spaced intervals instead of having a quasi-infinite range of points to select. Weaker systems are only capable of displaying basic information such as distance to target or current weather conditions.

Thus, a need still exists for a viewing optic that can project information into the first focal plane of an optical system. The apparatuses, systems, and methods disclosed herein address all of these shortcomings in an innovative fashion.

SUMMARY

In one embodiment, a viewing optic is provided including a main tube, an objective system coupled to a first end of the main tube and an ocular system coupled to a second end of the main tube. The main tube, the objective system and the ocular system are cooperatively configured to define at least one focal plane. The viewing optic further includes a beam combiner located between the objective system and the first focal plane. The viewing optic further includes an integrated display system comprising an active display, wherein the active display generates and projects a digital image to the beam combiner so the digital image and the target image from the objective lens system can be combined at the first focal plane.

In one embodiment, the disclosure relates to a viewing optic with a first optical system comprised of an objective lens system that focuses an image from a target down to a first focal plane (hereafter referred to as the "FFP Target Image"), followed by an erector lens system that inverts the FFP Target Image and focuses it to a second focal plane (hereafter referred to as the "SFP Target Image"), a beam combiner that is placed between the objective lens system and the FFP Target Image, an eyepiece lens system that collimates the SFP Target Image so that it can be observed by the human eye, and a second optical system. In one embodiment, the second optical system has an active display for generating an image, and a lens system that collects the light from the active display. The image from the digital display is directed to the beam combiner so that the digital image and the target image from the objective lens system can be combined at the first focal plane and viewed simultaneously.

In one embodiment, the disclosure relates to a viewing optic having a main body with an optics system for viewing an outward scene and a base coupled to the main body with an integrated display system for generating images and directing the generated images for simultaneous overlaid viewing of the generated images and images of the outward scene in the first focal plane of the main body. In one embodiment, the base is separable from the main body. In one embodiment, the base couples to a bottom portion of the main body. In yet another embodiment, the base has a cavity that contains the integrated display system. In another embodiment, the cavity can also have a compartment for one or more power sources.

In one embodiment, the disclosure relates to a viewing optic having a body with direct viewing optics for viewing images of an outward scene and a base having an integrated display system, wherein the integrated display system generates images with an active display and directs the images for simultaneous overlaid viewing of the generated images and images of the outward scene.

In one embodiment, the disclosure relates to a viewing optic with a body having a main optical system comprised of an objective lens system that focuses an image from a target down to a first focal plane (hereafter referred to as the "FFP Target Image"), a beam combiner that is placed between the objective lens system and the FFP Target Image, followed by an erector lens system that inverts the FFP Target Image and focuses it to a second focal plane (hereafter referred to as the "SFP Target Image"), and finally an eyepiece lens system that collimates the SFP Target Image so that it can be observed by the human eye, and a base coupled to a bottom portion of the body having a cavity with an integrated display system for generating images and directing the generated images for simultaneous overlaid viewing of the generated images and images of the outward scene in the first focal plane of the body.

In another embodiment, the disclosure relates to a viewing optic having a body with an optical system for viewing an outward scene and a base with an active display for generating an image, wherein the generated image is combined into the image of the outward scene in the first focal plane of the optical system.

In another embodiment, the disclosure relates to a viewing optic having a main body with an optical system for viewing an outward scene and a base coupled to a bottom portion of the main body with a cavity having an active display for generating an image, wherein the generated image is combined into the image of the outward scene in the first focal plane of the optical system.

In one embodiment, the disclosure relates to a viewing optic having a body with a first optical system for viewing an outward image and a second optical system comprised of a digital display mounted in a housing, wherein the housing is parallel to the first optical system, wherein the image of the second optical system is combined into the image of the first optical system in the first focal plane of the optic. In one embodiment, the second optical system comprises an active display. In yet another embodiment, the second optical system comprises a lens system that collects the light from the active display.

In one embodiment, the disclosure relates to a viewing optic having a main body with a first optical system for viewing an outward image and a housing coupled to the main body with an integrated display system for generating an image, wherein the image of the integrated display system is combined into the image of the first optical system in the first focal plane of the optic.

In one embodiment, the integrated display system comprises an active display, collector optics and a reflective surface or material, including but not limited to a mirror. In one embodiment, the active display can generate images including but not limited to text, alpha-numerics, graphics, symbols, and/or video imagery, icons, etc., including active target reticles, corrected aim-points, range measurements, and wind information.

In one embodiment, the disclosure relates to a viewing optic comprising: a body having (i) a first optical system having an objective lens system that focuses a target image from an outward scene to a first focal plane, an erector lens system that inverts the target image, a second focal plane, an ocular lens system for viewing the target image, (ii) a beam combiner; (iii) a second optical system with an active display for generating an image, and a reflective material that directs the generated image from the active display to the beam combiner, and one or more adjustment mechanisms for performing one or more of the following: (a) moving the active display in relation to the reflective material, (b) moving the reflective material in relation to the active display, (c) moving the reflective material in relation to the beam combiner, (d) moving the beam combiner in relation to the reflective material, and (e) moving the erector lens system in relation to the beam combiner, wherein the image from the active display and the target image from the objective lens system are combined into the first focal plane and viewed simultaneously.

In one embodiment, the disclosure relates to a viewing optic comprising: (a) a main tube; (b) an objective system coupled to a first end of the main tube that focuses a target image from an outward scene; (c) an ocular system coupled to the second end of the main tube, the main tube, objective system and ocular system being configured to define at least a first focal plane; and (d) a beam combiner positioned between the objective assembly and the first focal plane, (e) an active display for generating an image and a reflective material that directs the image from the active display to the beam combiner, wherein the image from the active display and the target image from the objective lens system are combined into the first focal plane and viewed simultaneously and (f) an adjustment mechanism for performing one or more of the following: (i) moving the active display in relation to the reflective material, or (ii) moving the reflective material in relation to the active display.

In one embodiment, the disclosure relates to a viewing optic comprising: a viewing optic comprising: an optical system configured to define a first focal plane; an active display for generating an image, and a reflective material for directing the image to the first focal plane; and one or more adjustment mechanisms for performing one or more of the following: (a) moving the active display in relation to the reflective material, and (b) moving the reflective material in relation to the active display.

In one embodiment, the integrated display system has collector optics or a lens system to collect light from an active display. The light from the display is directed to a reflective surface or material, including but not limited to a mirror, and from the reflective surface to a beam combiner in the main tube assembly of the viewing optic and an image of the display is formed, which is coincident with the first focal plane of the optical system. This image of the display is combined with the image coming from the scene (target) and is perceived as being "underneath" the traditional wire or glass etched reticle.

In one embodiment, the disclosure relates to housing coupled to a main body of a viewing optic, wherein the housing contains a display for generating images that can be injected into the first focal plane of the main body, such that the image of the display on the first focal plane is not tied to the movement of the erector tube.

In one embodiment, the active display is configured to emit light in a direction that is substantially parallel to an optical axis of the viewing scope.

In one embodiment, the active display is configured to emit light in a direction that is substantially perpendicular to an optical axis of the viewing scope.

In one embodiment, the mirror is oriented at an angle of approximately 45° relative to the emitted light of the display.

In one embodiment, the display and the mirror are located on a common side of the viewing optic main body.

In one embodiment, the display and the mirror are located on opposite sides of the viewing optic main body.

In one embodiment, the display and the mirror are located on a common side of a base coupled to the viewing optic main body.

In one embodiment, the display and the mirror are located on opposite sides of a base coupled to the viewing optic main body.

In one embodiment, the mirror is located on the objective side of the base coupled to the viewing optic main body.

In one embodiment, the active display is located on the ocular side of the base coupled to the viewing optic main body.

In one embodiment, the methods and apparatuses disclosed herein allow the end user to easily discern a digital overlay from a day optic scene.

In one embodiment, the disclosure relates to a viewing optic that has both an analog reticle and a digital reticle visible to the user when looking through the scope.

In one embodiment, the viewing optic is used in conjunction with a firearm. In one embodiment, the viewing optic is a riflescope. In one embodiment, the riflescope can be used with an external laser rangefinder with ballistic calculation capability. In one embodiment, the riflescope is rigidly mounted to the firearm and the laser rangefinder is mounted to either the firearm or the riflescope.

In one embodiment, the disclosure relates to sighting system comprising a riflescope having a main body with a first optical viewing system for viewing an outward scene and a base having an integrated display system for generating an image, wherein the base is coupled to a bottom portion of the main body, and further wherein the generated image and an image of the outward scene are combined in a first focal plane of the optics system, a laser rangefinder that measures the distance to the target and components to compute the ballistics for hitting that target. In one embodiment, the integrated display system can digitally display computed information and the correct point of aim, which corresponds with the point of impact of the rifle bullet, wherein the digitally displayed aim point and the outward scene are overlaid and displayed in the first focal plane of the riflescope.

In one embodiment, the disclosure relates to sighting system comprising a riflescope having a main body with a first optical viewing system for viewing an outward scene and a base having an integrated display system for generating an image, wherein the base is coupled to a bottom portion of the main body, and further wherein the generated image and an image of the outward scene are combined in a first focal plane of the optics system, a laser rangefinder that measures the distance to the target and the components to compute the ballistics for hitting that target are located in the main body of the riflescope.

In one embodiment, the disclosure relates to a viewing optic having a parallax adjustment system in the main body of a viewing optic to allow for the remote location of the parallax adjustment lenses (focusing cell), which provides space to integrate the necessary prismatic lenses (beam combiner) forward of the first focal plane.

In one embodiment, the disclosure relates to a riflescope with an internal magnification tracking device to scale a digital image projected on the first focal plane reticle.

In another embodiment, the disclosure relates to a magnification tracking device to scale a digital image projected on the first focal plane with the change of magnification.

In one embodiment, the disclosure relates to methods and apparatuses for orientation of a display in an active reticle rifle optic for maximum vertical compensation.

In another embodiment, the methods and apparatuses disclosed herein allows for the maximized range of vertical adjustment of an active reticle within a riflescope by specifically orientating the device responsible for emitting the augmentation image.

In another embodiment, the disclosure relates to a method for aligning the tilt of the vertical axis of a micro display and the vertical axis of a reticle in the optical system of a viewing optic, which is compact, simple, and accurate.

In one embodiment, the methods and apparatuses disclosed herein allow for the seamless combination of a processed digital image into a day visible optic.

In one embodiment, the disclosure relates to an active display integrated into the first focal plane (FFP) utilizing axially orientated data or communication ports thereby maintaining a minimized physical top down profile.

An advantage of the apparatuses and methods disclosed herein is that a multitude of advanced targeting functions can be utilized while preserving a direct view of the target scene.

An advantage of the apparatuses and methods disclosed herein is that the generated image from the integrated display system is combined with the outward image from the target in front of the first focal plane and then focused onto the first focal plane, as such, the target image and generated image from the integrated display system never move in relation to one another.

An advantage of the apparatuses and methods disclosed herein is that the injection of the generated image from the active display into the first focal plane of the optics system allows the generated image to be unaffected by any change in the turret adjustment or position of the erector system.

An advantage of the apparatuses and methods disclosed herein is that by superimposing the generated image of an active display onto the first focal plane, the user is able to use a traditional glass etched reticle for aiming purposes if the electronics should fail or the power supply be exhausted. This is an important failsafe which the apparatuses and methods disclosed herein supplies.

An advantage of the apparatuses and methods disclosed herein is that by displaying the generated image from the integrated display system on the first focal plane, the location of the electronic aiming point stays accurate in relation to the target regardless of the current magnification setting of the riflescope or any other adjustments.

Features, components, steps or aspects of one embodiment described herein may be combined with features, components, steps or aspects of other embodiments without limitation.

BRIEF DESCRIPTION OF THE DRAWINGS

FIG. 1C is a cross section view of the viewing optic of FIG. 1B showing a moveable optic element inside the optic body according to one embodiment of the disclosure.

DETAILED DESCRIPTION

Figure 1A:
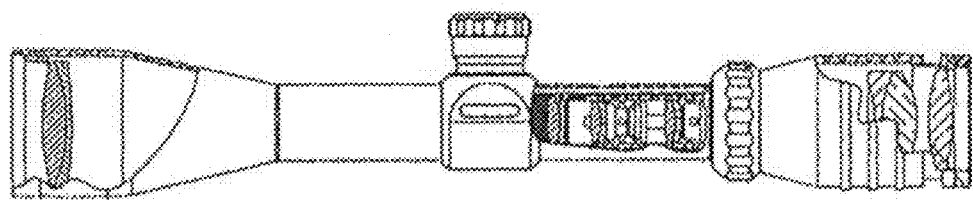
FIG. 1A is a schematic depicting parts of a riflescope.

The apparatuses and methods disclosed herein will now be described more fully hereinafter with reference to the accompanying drawings, in which embodiments of the disclosure are shown. The apparatuses and methods disclosed herein may, however, be embodied in many different forms and should not be construed as limited to the embodiments set forth herein. Rather, these embodiments are provided so that the disclosure will be thorough and complete and will fully convey the scope of the invention to those skilled in the art.

It will be appreciated by those skilled in the art that the set of features and/or capabilities may be readily adapted within the context of a standalone weapons sight, front-mount or rear-mount clip-on weapons sight, and other permutations of filed deployed optical weapons sights. Further, it will be appreciated by those skilled in the art that various combinations of features and capabilities may be incorporated into add-on modules for retrofitting existing fixed or variable weapons sights of any variety.

It will be understood that when an element or layer is referred to as being "on", "connected to" or "coupled to" another element or layer, it can be directly on, connected or coupled to the other element or layer. Alternatively, intervening elements or layers may be present. In contrast, when an element is referred to as being "directly on," "directly connected to" or "directly coupled to" another element or layer, there are no intervening elements or layers present.

Like numbers refer to like elements throughout. As used herein, the term "and/or" includes any and all combinations of one or more of the associated listed items.

It will be understood that, although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, region, or section without departing from the disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

I. Definitions

The numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property, such as, for example, molecular weight, viscosity, etc., is from 100 to 1,000, it is intended that all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges are provided within this disclosure for, among other things, distances from a user of a device to a target.

The term "and/or" as used in a phrase such as "A and/or B" herein is intended to include both A and B; A or B; A (alone); and B (alone). Likewise, the term "and/or" as used in a phrase such as "A, B, and/or C" is intended to encompass each of the following embodiments: A, B, and C; A, B, or C; A or C; A or B; B or C; A and C; A and B; B and C; A (alone); B (alone); and C (alone).

As used herein, an "active display" comprises image-creating pixel modulation. In one embodiment, the active display is an emissive active display. Emissive active displays, including but not limited to Organic light-emitting diodes (OLED) and Light-Emitting Diodes (LED), feature the image and light source in a single device, and therefore an external light source is not required. This minimizes system size and power consumption, while providing exceptional contrast and color space. OLEDs are made from ultra-thin organic semiconducting layers, which light up when they are connected to voltage (charge carriers become injected and luminance mainly is proportional to the forward current). The major layers comprise several organic materials in sequence (for example, charge transport, blocking and emission layers each with a thickness of several nanometers), which are inserted between an anode and a cathode. The terms "active display" and "microdisplay" are used interchangeably.

As used herein, an "erector sleeve" is a protrusion from the erector lens mount which engages a slot in the erector tube and/or cam tube or which serves an analogous purpose. This could be integral to the mount or detachable.

As used herein, an "erector tube" is any structure or device having an opening to receive an erector lens mount.

As used herein, a "firearm" is a portable gun, being a barreled weapon that launches one or more projectiles often driven by the action of an explosive force. As used herein, the term "firearm" includes a handgun, a long gun, a rifle, shotgun, a carbine, automatic weapons, semi-automatic weapons, a machine gun, a sub-machine gun, an automatic rifle, and an assault rifle.

As used herein, an "integrated display system" refers to a system for generating an image. In one embodiment, the integrated display system includes an active display. In one embodiment, the integrated display system includes an active display and collector optics. In yet another embodiment, the integrated display system includes an active display, collector optics, and a reflective surface.

In one embodiment, the integrated display system can be used to generate a digital image with an active display and direct the digital image into a first focal plane of an optical system for simultaneous viewing of the digital image and an image of an outward scene. As used herein, a "sighting system" refers to one or more optical devices and other systems that assist a person in aiming a firearm or other implement.

As used herein, the term "viewing optic" refers to an apparatus used by a shooter or a spotter to select, identify or monitor a target. The "viewing optic" may rely on visual observation of the target, or, for example, on infrared (IR), ultraviolet (UV), radar, thermal, microwave, or magnetic imaging, radiation including X-ray, gamma ray, isotope and particle radiation, night vision, vibrational receptors including ultra-sound, sound pulse, sonar, seismic vibrations, magnetic resonance, gravitational receptors, broadcast frequencies including radio wave, television and cellular receptors, or other image of the target. The image of the target presented to the shooter by the "viewing optic" device may be unaltered, or it may be enhanced, for example, by magnification, amplification, subtraction, superimposition, filtration, stabilization, template matching, or other means. The target selected, identified or monitored by the "viewing optic" may be within the line of sight of the shooter, or tangential to the sight of the shooter, or the shooter's line of sight may be obstructed while the target acquisition device presents a focused image of the target to the shooter. The image of the target acquired by the "viewing optic" may be, for example, analog or digital, and shared, stored, archived, or transmitted within a network of one or more shooters and spotters by, for example, video, physical cable or wire, IR, radio wave, cellular connections, laser pulse, optical, 802.11b or other wireless transmission using, for example, protocols such as html, SML, SOAP, X.25, SNA, etc., Bluetooth™, Serial, USB or other suitable image distribution method. The term "viewing optic" is used interchangeably with "optic sight."

As used herein, the term "outward scene" refers to a real world scene, including but not limited to a target.

As used herein, the term "shooter" applies to either the operator making the shot or an individual observing the shot in collaboration with the operator making the shot.

II. Viewing Optic

Figure 1B:
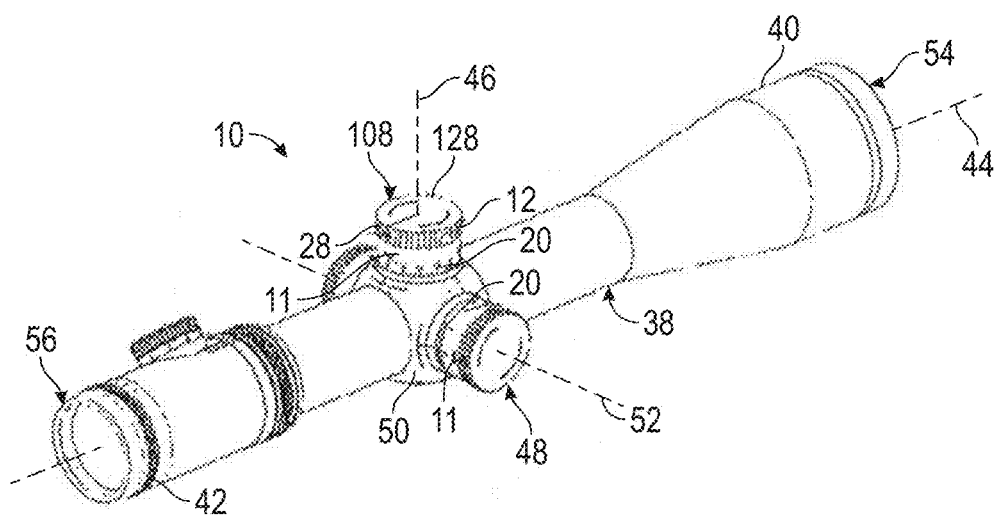
FIG. 1B is a schematic depicting additional parts and components of a viewing optic in accordance with one embodiment of the disclosure.

FIG. 1A illustrates the traditional design of a riflescope, which is a representative example of a viewing optic. FIG. 1B illustrates an exemplary viewing optic 10 in accordance with embodiments of the disclosure. Specifically, FIG. 1B illustrates a riflescope. More particularly, the riflescope 10 has a body 38 that encloses a movable optical element 15. The body 38 is an elongate tube tapering from a larger opening at its front 40 to a smaller opening at its rear 42. An eyepiece 56 is attached to the rear of the scope body, and an objective lens 54 is attached to the front of the scope body. The center axis of the movable optical element defines the optical axis 44 of the rifle scope.

An elevation turret 12 and a windage turret 48 are two dials that are often found in the outside center part of the body 38. They are marked in increments by indicia 20 on their perimeters 11 and are used to adjust the elevation and windage of the movable optical element for points of impact change. These dials protrude from the turret housing 50. The turrets are arranged so that the elevation turret rotation axis 46 is perpendicular to the windage turret rotation axis 52.

FIG. 1C shows a cross-section view of the sighting device from FIG. 1B with the basic components of optical system 14 and moveable optical element 15. As shown in FIG. 1C, optical system 14 includes an objective lens system 16, erector system 25, and eyepiece lens system 18. FIG. 1C shows a riflescope having a body 38, but optical system 14 could be used in other types of sighting devices as well. Erector system 25 may be included within a moveable optic element 15. In FIG. 1C, moveable optic element 15 also includes a collector 22, as well as first focal plane reticle 55 and second focal plane reticle 57. When in use, adjustment of turret assembly 28 and turret screw 29 causes adjustment of moveable optic element 15.

The movable optical element 15 is adjusted by rotating the turret assembly 28 one or more clicks. As the turret is rotated, a turret screw 29 moves in and out of the scope, which pushes the erector tube. The erector tube is biased by a spring so when the turret screw is adjusted, it locates the erector tube against the bottom face of the turret screw. The erector tube provides a smaller view of the total image. As the erector tube is adjusted, the position of the reticle is modified against the image.

A reticle is a circular, planar or flat transparent panel or disk mounted within the scope body in perpendicular relationship to the optical axis or line-of-sight through the scope, and is positioned between the objective lens element 54 and the erector lens element, typically at a site considered to be a front focal plane of the optical system within the housing. In one embodiment, the reticle contains fine etched lines or hairline indicia comprising a center vertical hairline and a center horizontal hairline, which orthogonally or perpendicularly intersect at a center point.

Figure 1D:
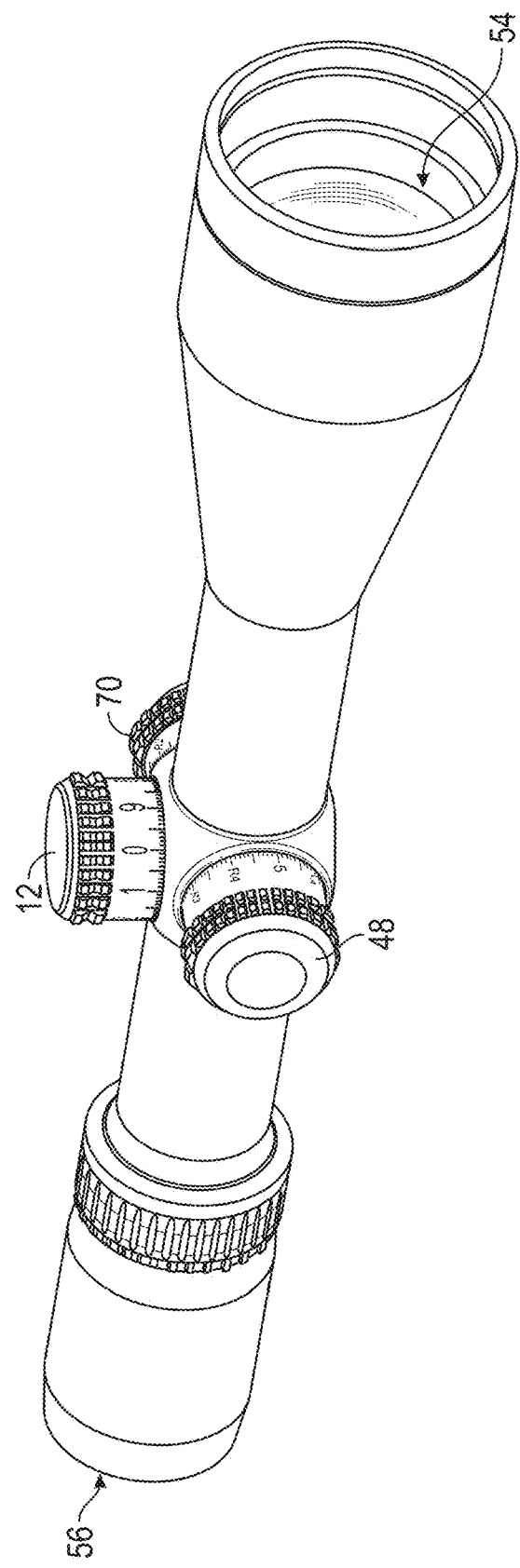
FIG. 1D is a schematic of a viewing optic depicting a parallax adjustment knob according to one embodiment of the disclosure.

In one embodiment, as shown in FIG. 1D, the viewing optic can have a parallax adjustment knob 70 or a focus knob. Parallax occurs when the optical plane of the image of a target is not coplanar with the optical plane of the image of the reticle. As a result of the offset between the two optical planes, the reticle can appear to move relative to the target when the marksman moves their eye around the center of the reticle. This parallax error can result in a shift in the point of impact from firing. The parallax adjustment of a viewing optic enables the marksman to eliminate optical error at different distances, by enabling the optical system to be adjusted to show the image of the target and the image of the reticle in the same optical plane. Parallax compensation changes neither the focus of the reticle nor the focus of the image; it simply moves the planes at which these two objects are in focus so that they share the same plane (are coincident).

As shown in FIG. 1D, the viewing optic can have a side wheel mounted to the rotatable parallax adjustment knob 70. The larger diameter of the side wheel provides more space for markers, such as range marker, to be applied, and is easier for the marksman to rotate and read when in use. The larger diameter of the side wheel serves to increase the accuracy and resolution of the range finding markers.

Figure 1E:
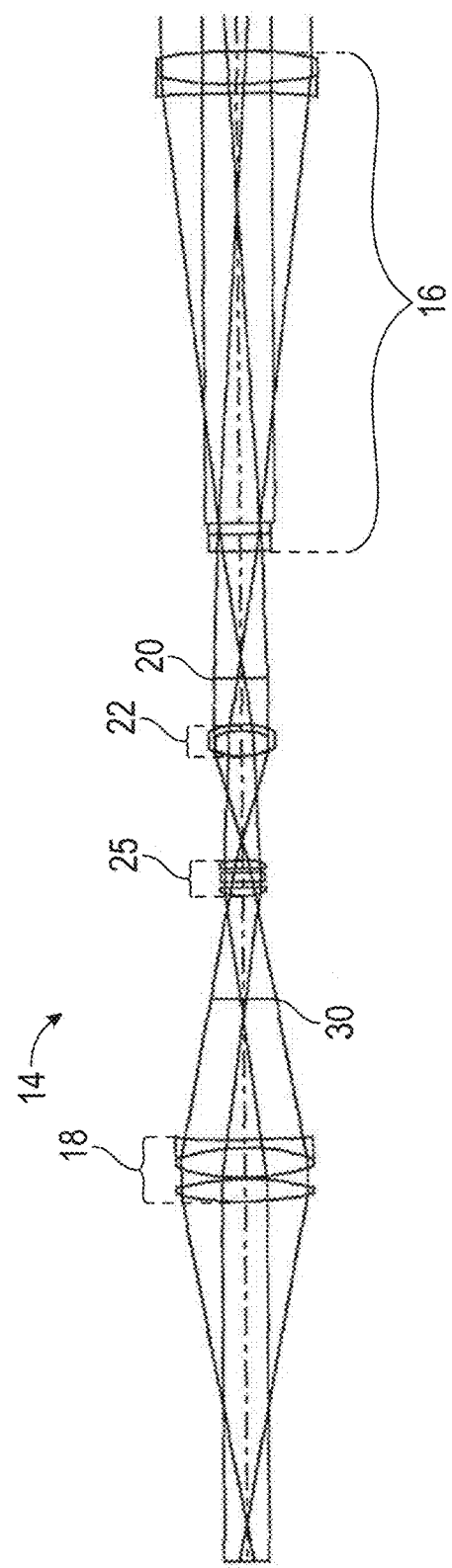
FIG. 1E is a schematic of the erector system in the optical element of the viewing optic according to one embodiment of the disclosure.

FIG. 1E shows a close-up view of an optical system 14 in cross-section, illustrating how light rays travel through the optical system 14. Optical system 14 may have additional optical components such as collector 22, and it is well known within the art that certain components, such as objective lens system 16, erector system 25, and eyepiece lens system 18 may themselves have multiple components or lenses.

In one embodiment, the viewing optic can have a focusing cell having one or more adjustable lens for providing parallax adjustment. In one embodiment, the one or more adjustable lens is one or parallax lenses.

In one embodiment, a focus lens is located between an ocular lens and an objective lens. The relative distance between the focus lens and the objective lens is adjustable, for providing parallax adjustment. In addition, erector lenses are located between the ocular lens and the focus lens. The relative distance between the erector lenses and the objective lens is adjustable, for providing magnification adjustment.

III. Viewing Optic with an Active Display

In one embodiment, the disclosure relates to a viewing optic having an active display that generates a digital image and projects the digital image into the first focal plane of the viewing optic. In one embodiment, the disclosure relates to a viewing optic that has an analog reticle and a digital image, including but not limited to a digital reticle, visible to the user when looking through the viewing optic. In one embodiment, the viewing optic can be used with an external laser rangefinder with ballistic calculation capability.

In one embodiment, the viewing optic has a moveable erector tube with an analog reticle or a glass etched reticle that is mounted to the erector tube in such a way that the analog or glass etched reticle moves in conjunction with said erector tube. In one embodiment, the digitally injected reticle does not move in conjunction with the erector tube. Thus, the digital reticle is accurate regardless of the turret or erector tube position.

In one embodiment, the disclosure relates to viewing optic with a digital display that can be injected into the first focal plane of the viewing optic such that the image of the digital display on the first focal plane is not tied to the movement of the erector tube. In one embodiment, the display can give users accurate ballistic hold points of aim, regardless of the erector tube/turret position of the riflescope.

In one embodiment, the disclosure relates to viewing optic with an aiming point that is agnostic to the position of the erector tube and/or turret position of the viewing optic. In one embodiment, if a ballistically determined aim point is beyond the field of view of the erector unit, the turrets can be dialed to bring the ballistically determined aimpoint into the field of view.

In one embodiment, the viewing optic has a main optical system comprised of an objective lens system that focuses an image from a target down to a first focal plane (hereafter referred to as the "FFP Target Image"), followed by an erector lens system that inverts the FFP Target Image and focuses it to a second focal plane (hereafter referred to as the "SFP Target Image"), a beam combiner that is placed between the objective lens system and the FFP Target Image, an eyepiece lens system that collimates the SFP Target Image so that it can be observed by the human eye, and a second optical system.

In one embodiment, the second optical system has an active display, and a lens system that collects the light from the active display. The image from the digital display is directed to the beam combiner so that the digital image and the target image from the objective lens system can be combined at the first focal plane and viewed simultaneously. In one embodiment, the second optical system can have a reflective material, including but not limited to a mirror.

Referring to the description above, the digital display is injected into the main optical system, between the objective lens system and the first focal plane, and then is focused onto the first focal plane. At the first focal plane, both the digital image from the digital display and the analog/glass etched reticle attached to the erector lens system share the same plane. However, the analog reticle is attached to a moveable erector lens system, while the image from the digital display is not. Therefore, if the erector lens system is moved, the analog reticle will move, but the digital image will remain stationary.

In one embodiment, the viewing optic can be rigidly mounted to a firearm. In another embodiment, a laser rangefinder can be mounted to either the firearm or the viewing optic. The laser rangefinder measures the distance to the target, computes the ballistics for hitting that target, provides that information into the active display so that the correct point of aim can be displayed with the point of impact of the rifle bullet.

It is important that the digital image remain stationary because the laser range finder is rigidly attached to viewing optic and its point of aim does not move. This allows the digital display to be digitally adjusted so that the digital laser designator corresponds with the laser on initial setup, and then the two will always remain in alignment, no matter how the erector lens system is moved.

Additionally, the barrel of a firearm is rigidly attached to the viewing optic, so the point of aim of the barrel never changes in relation to the digital display. This allows the digital display to be digitally adjusted so that a digital aim point corresponds with the barrel of the firearm at its initial "sight-in" distance during initial setup, and then the two will always remain in alignment.

When the need arises to shoot at different distances than the initial sight-in distance, the laser range finder can measure the distance and then do ballistic calculations to determine the new location of the point of aim. That new point of aim location is always relative to the initial sight in distance, so the riflescope simply needs to adjust the digital display aim point to correspond with the new point of aim.

A side benefit of this system is that, because the digital aim point is stationary, the user can easily test the accuracy of the turrets on the viewing optic that adjust the erector tube position using a reticle that has predetermined marks on it at regular intervals. As the erector tube moves, the reticle can be measured against the stationary digital aim point to see if the adjustment dialed on the turrets match the amount of movement measured between the digital aim point and the reticle attached to the erector lens system.

IV. Viewing Optic with A Base

In one embodiment, the disclosure relates to a viewing optic, including but not limited to a riflescope, having a first housing coupled to a second housing. In one embodiment, the first housing is a main body. In yet another embodiment, the second housing is a base.

In one embodiment, the disclosure relates to a riflescope having a main body and a base coupled to the main body. In one embodiment, the base is separable from the main body. In one embodiment, the base is attached to a bottom portion of the main body. In one embodiment, a gasket is used to enclose the main body and the base.

In one embodiment, the disclosure relates to a riflescope having a main body with an optics system for generating images of an outward scene and a base coupled to the main body with an integrated display system for generating digital images and directing the digital images into a first focal plane of the optics system, thereby providing simultaneous viewing of the digital images and images of the outward scene.

In another embodiment, the disclosure relates to a riflescope having a main body with an optics system for generating images of an outward scene and a base coupled to the main body with an integrated display system having an active display for generating images and directing the generated images into a first focal plane of the optics system providing simultaneous viewing of the generated images and images of the outward scene when looking through an eyepiece of the scope body.

Figure 2:
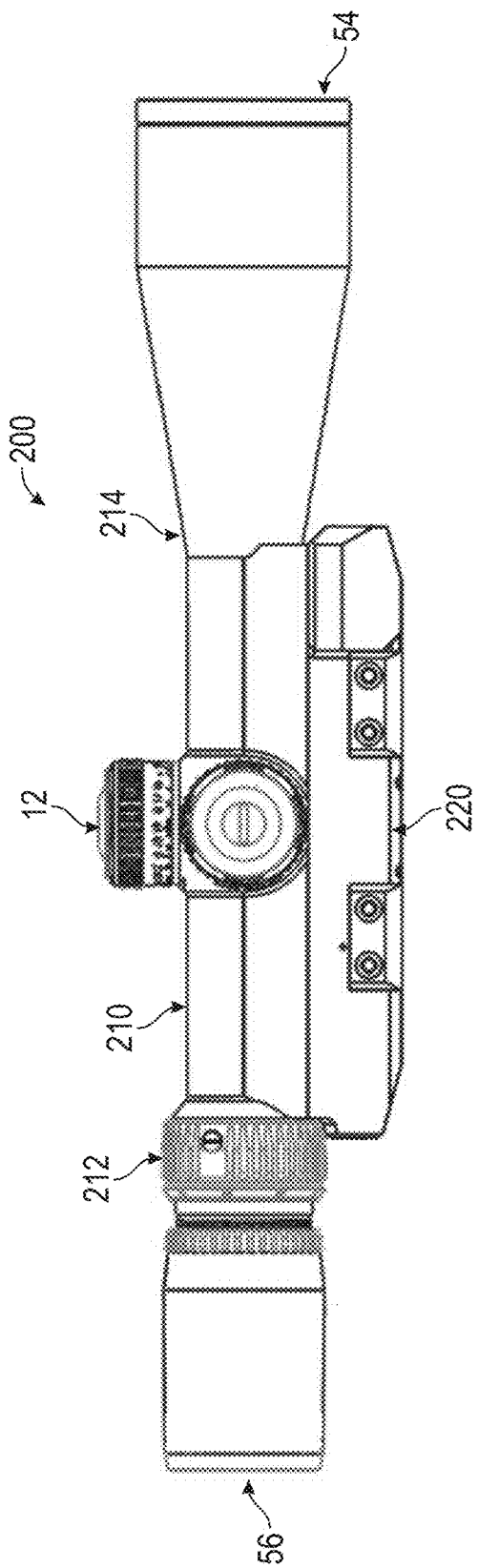
FIG. 2 is a side view of a riflescope having a main body and a base coupled to the main body according to one embodiment of the disclosure.

In a representative embodiment, FIG. 2 displays a side view of a riflescope 200 with a main body 210 and a base 220. In one embodiment, the base 220 is separable from the main body 210. The base 220 attaches at one end of the scope body near the magnification ring 212 and at the other end of the scope body near the objective assembly 214. In one embodiment, the main body 210 and the base 220 are made of the same material. In another embodiment, the scope body and the base are made of different material.

In one embodiment, the base 220 is approximately the length of the erector tube of the main body.

In one embodiment, the base has an integrated display system that can generate and display situational, geographical, and ballistic information in the first focal plane of the viewing optic including but not limited to: real time ballistic solutions; next round ballistic correction through in-flight tracer round detection and tracking; weapon pointing angle tracking using integrated high performance inertial sensors; precise pointing angle comparisons for advanced ballistic targeting and correction; target location and designation; pressure, humidity, and temperature; anti-fratricide and situational awareness data can be processed by the device and viewed while sighting; reticle targeting correction beyond scopes field of view for convenient ballistic drop correction at long ranges; weapon, round, and environmental characterization data.

In one embodiment, the viewing optic has one or more of the following capabilities and/or components: one or more microprocessors, one or more computers, a fully integrated ballistic computer; an integrated near infrared Laser Rangefinder; an integrated GPS and digital compass with the viewing optic capable of full coordinate target location and designation; integrated sensors for pressure, humidity, and temperature with the viewing optic capable of automatically incorporating this data in ballistic calculations; conventional viewing optic capabilities in all conditions, including zero-power off mode; wired and wireless interfaces for communication of sensor, environmental, and situational awareness data; ability to support digital interfaces such as Personal Network Node (PNN) and Soldier Radio Waveform (SRW); integrated tilt sensitivity with respect to vertical with ballistic correction possible for uphill and downhill shooting orientations; integrated imaging sensor; acquiring and processing target scene image frames; ability to record firing time history for purposes of applying cold bore/hot bore shot correction in an automated fashion; and built in backup optical range estimation capability with automatic angular to linear size conversion.

In one embodiment, the viewing optic can communicate wirelessly with one or more devices. In another embodiment, the viewing optic can communicate via a physical cable with one or more devices.

A. Main Body

In one embodiment, the main body is the shape of an elongate tube, which tapers from a larger opening at its front to a smaller opening at its rear and an eyepiece attached to the rear of the elongate tube, and an objective lens attached to the front of the elongate tube. In one embodiment, the first housing is a main body of a riflescope.

In one embodiment, the main body has a viewing input end, and a viewing output end, which can be aligned along viewing optical axis 44 (FIG. 1B), and can be inline. Objects or targets can be directly viewed by the eye of the user through the viewing input end, along the viewing direct view optics, and out the viewing output end. The main body can include an objective lens or lens assembly at the viewing input end. A first focal plane reticle can be positioned and spaced along the viewing optical axis A from the objective lens assembly.

In one embodiment, a picture or image reversal lens assembly can be positioned and spaced rearwardly along the viewing optical axis A from the first focal plane reticle. An erector tube having an erecting image system is located within the main body between the objective lens and the ocular lens in order to flip the image. This gives the image the correct orientation for land viewing. The erecting image system is usually contained within an erector tube.

The reversal lens assembly or erecting image system can comprise one or more lenses spaced apart from each other. The erector image system may include one or more movable optical elements, such as a focus lens that is movable along its optical axis to adjust the focus of the image and a magnification lens movable along its optical axis to optically magnify the image at the rear focal plane so that the target appears closer than its actual distance. Typically, the erector assembly includes a mechanical, electro-mechanical, or electro-optical system to drive cooperative movement of both the focus lens and one or more power-varying lens elements of the magnification lens to provide a continuously variable magnification range throughout which the erector assembly produces a focused, erect image of the distant target at the rear focal plane.

Variable magnification can be achieved by providing a mechanism for adjusting the position of the erector lenses in relationship to each other within the erector tube. This is typically done through the use of a cam tube that fits closely around the erector tube. Each erector lens (or lens group) is mounted in an erector lens mount that slides within the erector tube. An erector sleeve attached to the erector lens mount slides in a straight slot in the body of the erector tube to maintain the orientation of the erector lens. The erector sleeve also engages an angled, or curving, slot in the cam tube. Turning the cam tube causes the erector lens mount to move lengthwise within the guide tube, varying the magnification. Each erector lens will have its own slot in the cam tube and the configuration of these slots determines the amount and rate of magnification change as the cam tube is turned.

An aperture in a second focal plane can be positioned and spaced rearwardly along the viewing optical axis A from the picture reversal assembly. An ocular lens assembly can be positioned and spaced rearwardly along the viewing optical axis A from the aperture in the second focal plane, at the eyepiece. The ocular lens assembly can include one or more lenses spaced apart from each other. In some embodiments, the viewing optical axis A and the direct viewing optics can be folded.

In one embodiment, the main body has a beam combiner. In one embodiment, the beam combiner can be positioned on and optically coupled to a viewing optical axis 44 as shown in FIG. 1B. In one embodiment, a beam combiner can be positioned near a viewing optic reticle. In another embodiment, a beam combiner can be positioned near a first focal plane viewing optic reticle.

In one embodiment, the beam combiner is located between the objective assembly and the first focal plane.

In still another embodiment, the main body has a beam combiner, wherein the beam combiner is not located near the ocular assembly. In one embodiment, the beam combiner is not located beneath the ocular assembly.

In one embodiment, the main body has a beam combiner that is located closer to the objective assembly as compared to the ocular assembly in the main tube of the viewing optic.

Figure 3:
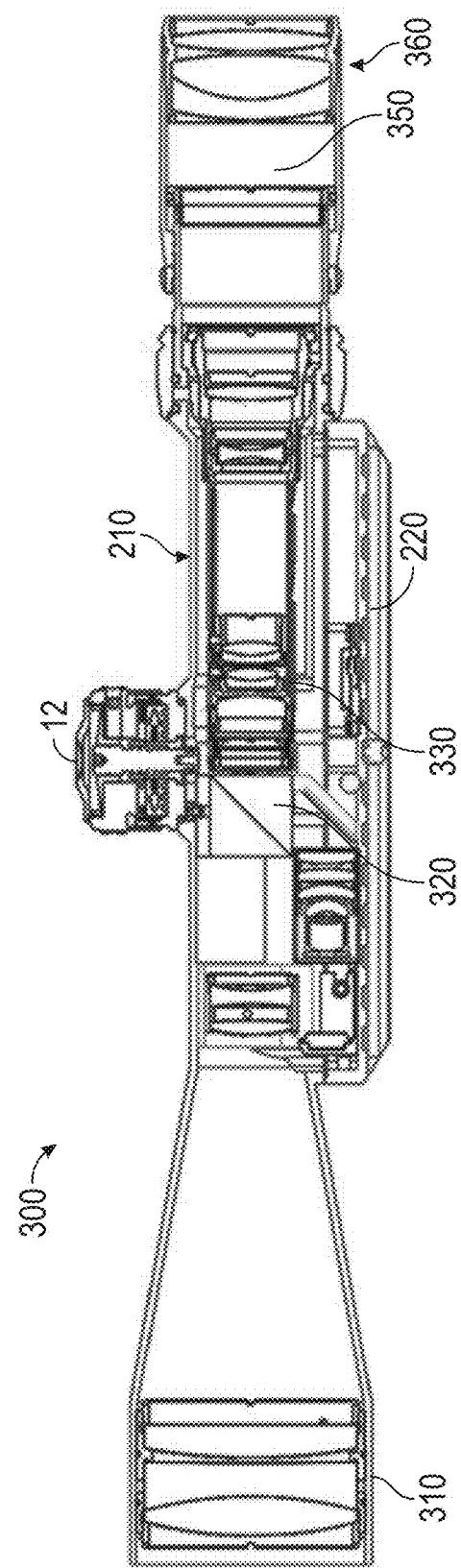
FIG. 3 is a cross-sectional view of a viewing optic with a main body having a beam combiner located between the objective assembly and the first focal plane according to one embodiment of the disclosure.

FIG. 3 displays a side cut-away view of a riflescope 300 with a main body 210 and a base 220. As shown, riflescope 300 has an objective assembly 310, a beam combiner 320, a first focal plane 330, a second focal plane 350, and an ocular assembly 360. The beam combiner 320 is located between the objective assembly 310 and the first focal plane 330.

Figure 4:
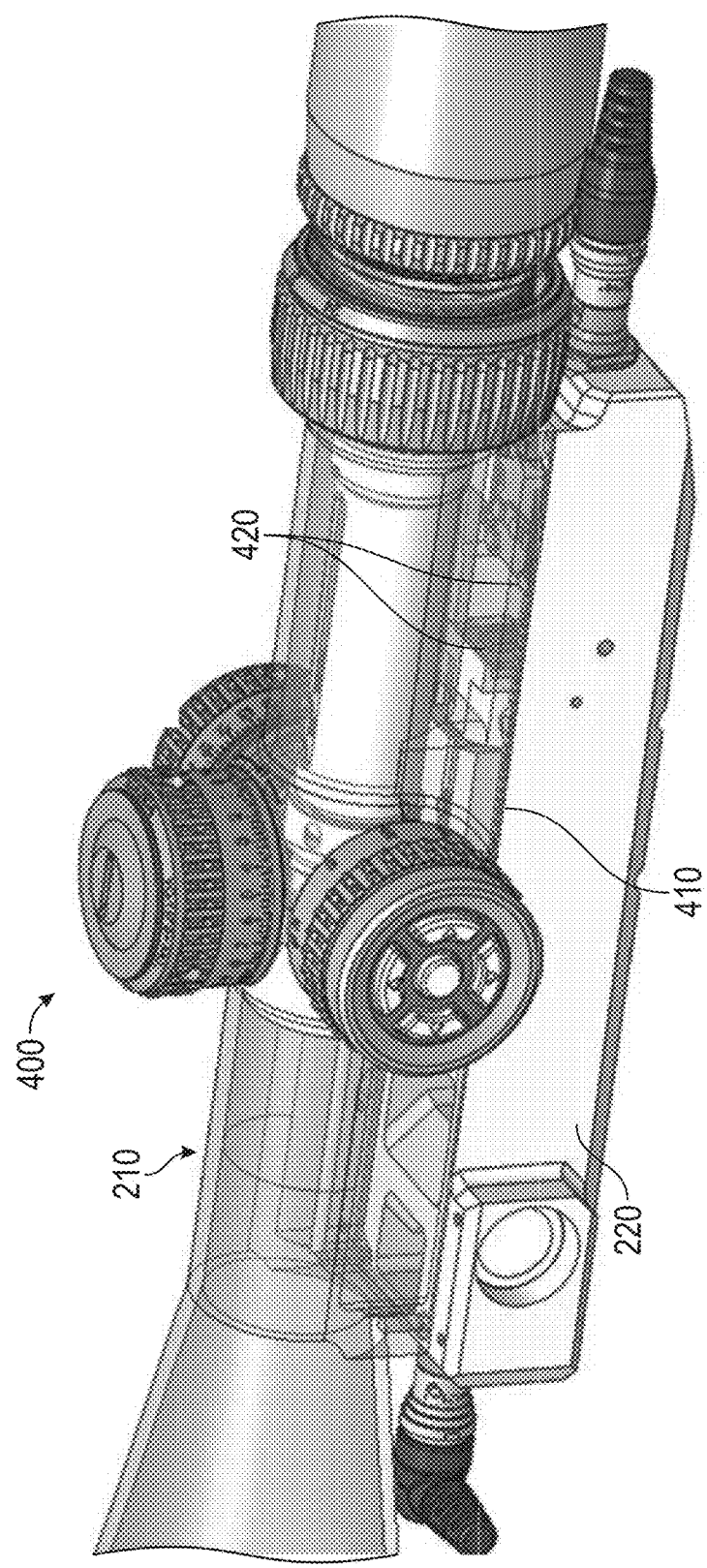
FIG. 4 is a representative schematic displaying a longitudinally-split main body of a viewing optic according to one embodiment of the disclosure.

In one embodiment, the viewing optic 400 can have a main body 210 that is longitudinally split to allow for assembly of the associated lenses and circuitry in the base 220. FIG. 4 is a representative example of a longitudinally split main tube 210 of a riflescope 400. FIG. 4 depicts the parting line 410 of the longitudinally split main tube. The split 420 in the bottom side of the main body 210 allows for coupling of a base 220 having an integrated display system.

In one embodiment, the bottom side of the main body has a longitudinal split. In one embodiment, the longitudinal split is approximately the length of the base that couples to the main body.

1. Beam Combiner

In one embodiment, the main body of the viewing optic has a beam combiner. In one embodiment, the beam combiner is one or more prismatic lenses (the prismatic lenses constitute the beam combiner). In another embodiment, the main body of the riflescope has a beam combiner that combines images generated from an integrated display system with images generated from the viewing optics along the viewing optical axis of the riflescope. In one embodiment, the integrated display system is located in a housing, which is separate and distinct from the main body. In one embodiment, the integrated display system is in a base that couples to the first housing or main body. In one embodiment, the integrated display system is in a cavity of a base that couples to the first housing or main body.

In one embodiment, a beam combiner is used to combine a generated image from an integrated display system with an image from an optical system for viewing an outward image, wherein the optical system is located in a main body of a riflescope, in front of a first focal plane in the main body, and then the combined image is focused onto the first focal plane, such that the generated image and the viewed image did not move in relation to one another. With the combined image focused onto the first focal plane, an aiming reference generated by the integrated display system will be accurate regardless of adjustments to the movable erector system.

In one embodiment, a beam combiner can be aligned with the integrated display system along the display optical axis, and positioned along the viewing optical axis of the viewing optics of the main body of a riflescope, thereby allowing for the images from the integrated display to be directed onto the viewing optical axis for combining with the field of view of the viewing optics in an overlaid manner.

In another embodiment, the beam combiner and the integrated display system are in the same housing. In one embodiment, the beam combiner is approximately 25 mm from the objective assembly.

In one embodiment, the beam combiner is approximately 5 mm distance from the objective assembly. In one embodiment the beam combiner is positioned at a distance from the objective assembly including but not limited to from 1 mm to 5 mm, or from 5 mm to 10 mm or from 5 mm to 15 mm, or from 5 mm to 20 mm, or from 5 mm to 30 mm, or from 5 mm to 40 mm or from 5 to 50 mm.

In yet another embodiment, the beam combiner is positioned at a distance from the objective assembly including but not limited to from 1 mm to 4 mm, or from 1 mm to 3 mm, or from 1 mm to 2 mm.

In one embodiment, the beam combiner is positioned at a distance from the objective assembly including but not limited to at least 3 mm, at least 5 mm, at least 10 mm, and at least 20 mm. In yet another embodiment, the beam combiner is positioned at a distance from the objective assembly from 3 mm to 10 mm.

In another embodiment, the beam combiner is approximately 150 mm distance from the ocular assembly. In one embodiment the beam combiner is positioned at a distance from the ocular assembly including but not limited to from 100 mm to 200 mm or from 125 mm to 200 mm or from 150 mm to 200 mm or from 175 mm to 200 mm.

In one embodiment the beam combiner is positioned at a distance from the ocular assembly including but not limited to from 100 mm to 175 mm or from 100 mm to 150 mm or from 100 mm to 125 mm.

In one embodiment the beam combiner is positioned at a distance from the ocular assembly including but not limited to from 135 mm to 165 mm or from 135 mm to 160 mm or from 135 mm to 155 mm or from 135 mm to 150 mm or from 135 mm to 145 mm or from 135 mm to 140 mm.

In one embodiment the beam combiner is positioned at a distance from the ocular assembly including but not limited to from 140 mm to 165 mm or from 145 mm to 165 mm or from 150 mm to 165 mm or from 155 mm to 165 mm or from 160 mm to 165 mm.

In one embodiment the beam combiner is positioned at a distance from the ocular assembly including but not limited to at least 140 mm or at least 145 mm or at least 150 mm or at least 155 mm.

In still another embodiment, the main body has a beam combiner, wherein the beam combiner is located beneath the elevation turret on the outside center part of the scope body.

In one embodiment, the beam combiner can have a partially reflecting coating or surface that reflects and redirects the output or at least a portion of the active display output from the integrated display system onto the viewing axis to the viewer's eye at eyepiece while still providing good transmissive see-through qualities for the direct viewing optics path.

In one embodiment, the beam combiner can be a cube made of optical material, such as optical glass or plastic materials with a partially reflective coating. The coating can be a uniform and neutral color reflective coating, or can be tailored with polarizing, spectrally selective or patterned coatings to optimize both the transmission and reflection properties in the eyepiece. The polarization and/or color of the coating can be matched to the active display. This can optimize reflectance and efficiency of the display optical path with minimal impact to the direct viewing optics transmission path.

Although the beam combiner is shown as a cube, in some embodiments, the beam combiner can have different optical path lengths for the integrated display system, and the direct viewing optics along viewing optical axis A. In some embodiments, the beam combiner can be of a plate form, where a thin reflective/transmissive plate can be inserted in the direct viewing optics path across the optical axis A.

In one embodiment, the position of the beam combiner can be adjusted in relation to the reflective material to eliminate any errors, including but not limited to parallax error. The position of the beam combiner can adjusted using a screw system, a wedge system or any other suitable mechanism.

In one embodiment, the position of the beam combiner can be adjusted in relation to the erector tube to eliminate any errors, including but not limited to parallax error.

2. Parallax System

In one embodiment, main body has a parallax adjustment system. In one embodiment, the parallax adjustment system uses a device to connect a focusing cell to the parallax adjustment element.

In one embodiment, the viewing optic disclosed herein has a main body with a focusing cell located closer to the objective end as compared to a traditional focusing cell and a beam combiner located in a space traditionally occupied by the focusing cell. In one embodiment, a connecting element connects the focusing cell to a parallax adjustment element.

Figure 5A:
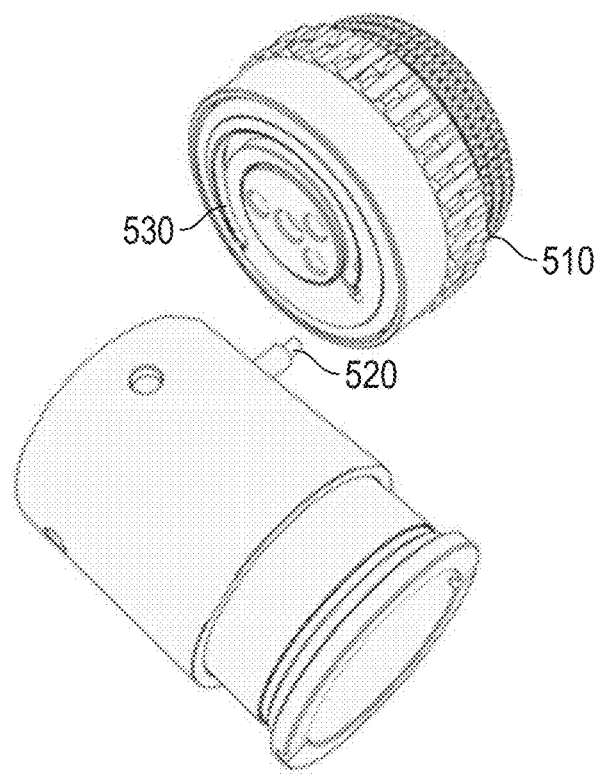
FIG. 5A is a representative schematic of a traditional parallax adjustment knob with a cam pin that rests in a cam grove on the parallax knob.
Figure 5B:
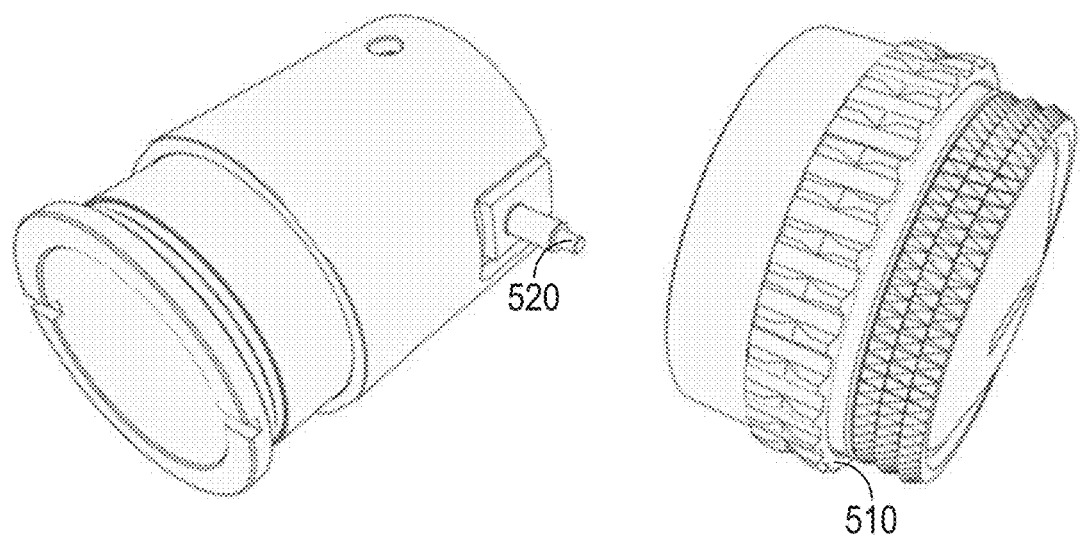
FIG. 5B is a representative schematic of traditional parallax adjustment knob showing a cam pin connecting aspects of a focus cell to a parallax knob.

In a typical riflescope, as depicted in FIG. 5A and FIG. 5B, the parallax knob 510 is connected to the focusing cell via a simple cross pin 520 that rides on a cam groove 530 in the parallax knob, converting the rotational motion of the knob into linear motion within the focusing cell. However, in some embodiments disclosed herein, the focusing cell is shifted toward the objective side, and thus, a connecting device is needed to connect the focusing cell to the parallax adjustment element.

The parallax adjustment system can eliminate or reduce parallax error between the image of the active display and a reticle in the main body of the viewing optic. The parallax adjustment system disclosed herein allows for a viewing optic having a digital display image and an image of an outward scene integrated into a first focal plane (FFP) of an optic system without parallax error.

In another embodiment, the focusing cell is located closer to the objective side of the main body as compared to the focusing cell of a traditional riflescope. In one embodiment, the focusing cell is shifted from about 5 mm to about 50 mm closer to the objective as compared to a focusing cell of a traditional riflescope. In one embodiment, the focusing cell is shifted at least 20 mm closer to the objective as compared to a focusing cell of a traditional riflescope. In one embodiment, the focusing cell is shifted at least 10 mm closer to the objective as compared to a focusing cell of a traditional riflescope. In yet another embodiment, the focusing cell is shifted no more than 50 mm closer to the objective side as compared to a focusing cell of a traditional riflescope. In one embodiment, the focusing cell is shifted 30 mm closer to the objective assembly as compared to a the location of a focusing cell in a Vortex Diamondback riflescope, Vortex Viper riflescope, Vortex Crossfire riflescope, Vortex Razor riflescope.

In one embodiment the focusing cell is shifted closer to the objective as compared to a focusing cell of a traditional riflescope including but not limited to 15, 16, 17, 18, 19, 20, 21, 22, 23, 24, 25, 26, 27, 28, 29, 30, 31, 32, 33, 34, 35, 36, 37, 38, 39, and 40 mm closer to the objective side of the viewing optic.

In one embodiment, a device connects the shifted focusing cell to the adjustment knob. In one embodiment, the device allows for the remote location of the parallax adjustment lenses located in the focusing cell. In one embodiment, the mechanical device is a push-rod, a rod, a shaft, In one embodiment, the rod is from about 5 mm to about 50 mm in length. In one embodiment, the rod is at least 20 mm in length. In one embodiment, the rod is at least 10 mm in length. In yet another embodiment, the rod is no more than 50 mm in length.

In one embodiment the rod is 15, 16, 17, 18, 19, 20, 21, 22, 23, 24, 25, 26, 27, 28, 29, 30, 31, 32, 33, 34, 35, 36, 37, 38, 39, and 40 mm in length.

Figure 5C:
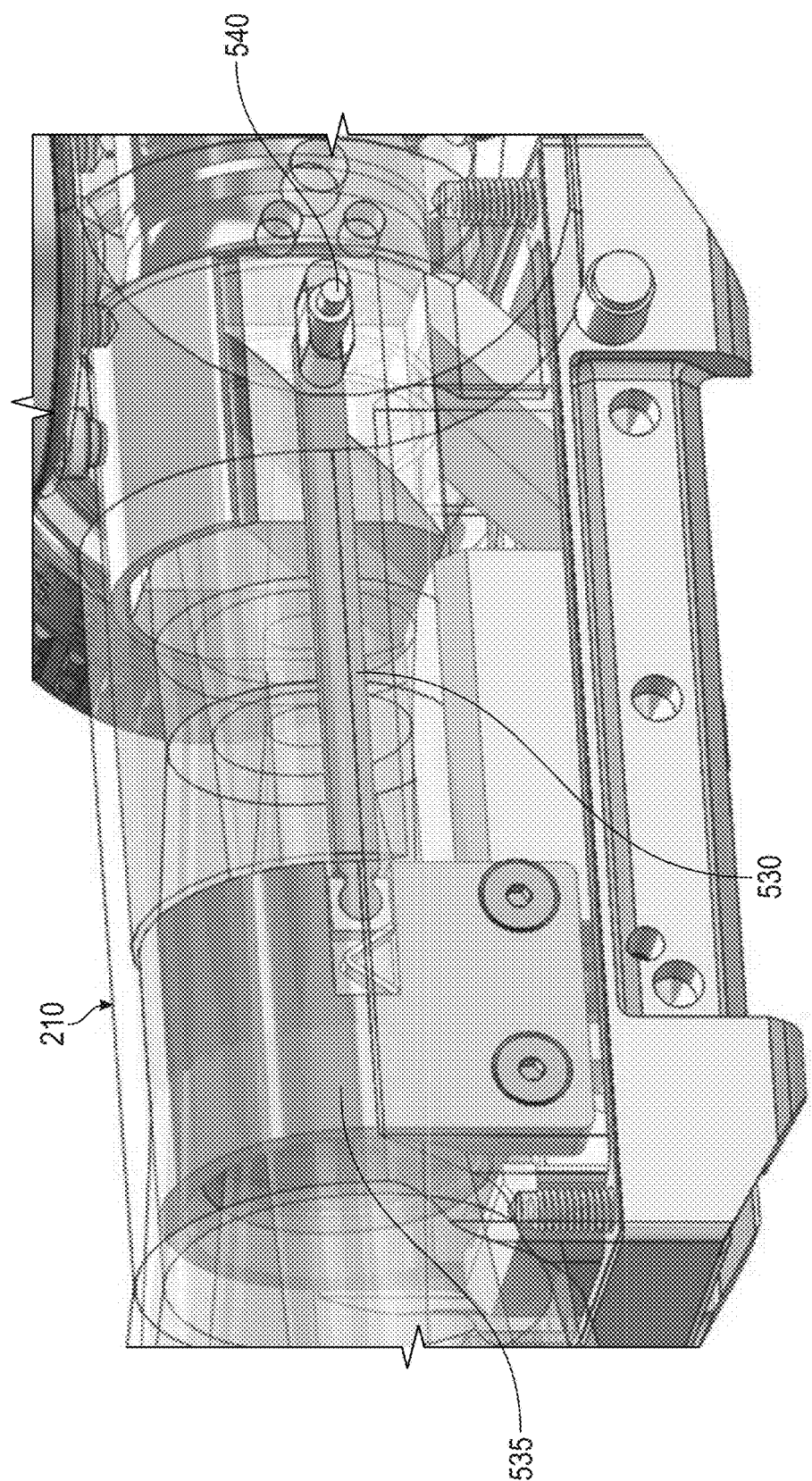
FIG. 5C is a representative schematic of a parallax adjustment system. A connecting rod is shown that can be used for parallax adjustment. The focusing cell (parallax lenses) has been moved to allow space for the beam combiner (prismatic lenses) to be placed forward of the first focal plane according to one embodiment of the disclosure.

FIGS. 5C-5F are representative schematics of a parallax adjustment system in the main tube 210 of a viewing optic according to one embodiment of the disclosure. As shown in FIG. 5C, a device, such as a rod or shaft, 530 connects the focusing cell (parallax lenses) 535, which have been moved closer to the objective end of the viewing optic, to a parallax cam track pin 540 within the parallax adjustment knob assembly. The shifted location of the parallax lenses provides the necessary space for the prismatic lenses forward of the first focal plane. One end of the connecting rod is coupled to the focusing cell and the other end of the connecting rod is coupled to a cam pin.

Figure 5D:
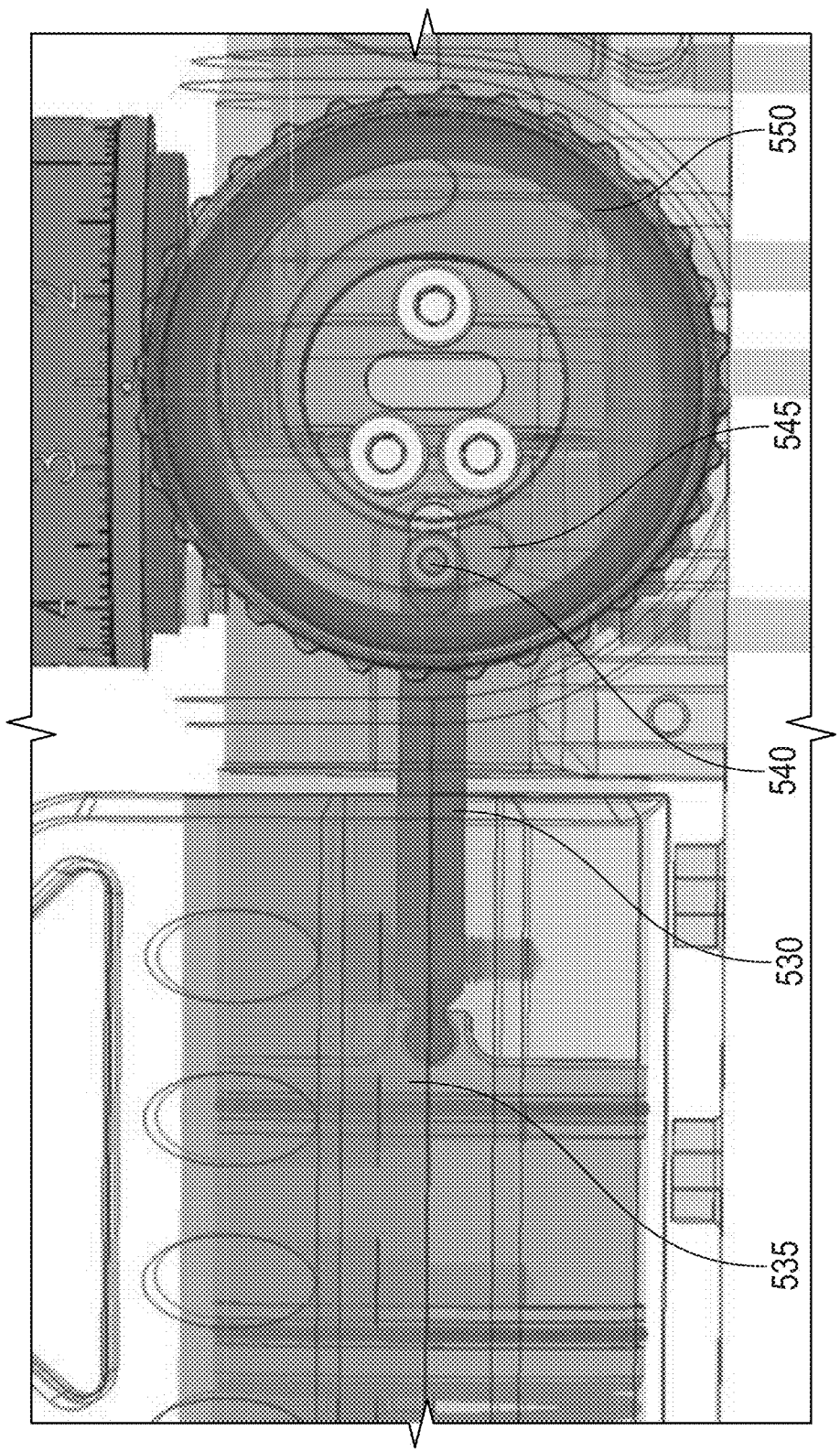
FIG. 5D is a representative schematic of a parallax adjustment system showing one end of the connecting rod having a cam-pin that rests in a cam grove of the parallax adjustment knob assembly according to one embodiment of the disclosure.

FIG. 5D shows the device 530 connecting the focusing cell 535 having the parallax lenses to the parallax cam track pin 540, which rides in the cam track 545 of the parallax adjustment assembly 550. In one embodiment, the parallax adjustment assembly 550 has a rotatable element to move the cam pin and adjust the parallax lenses.

Figure 5E:
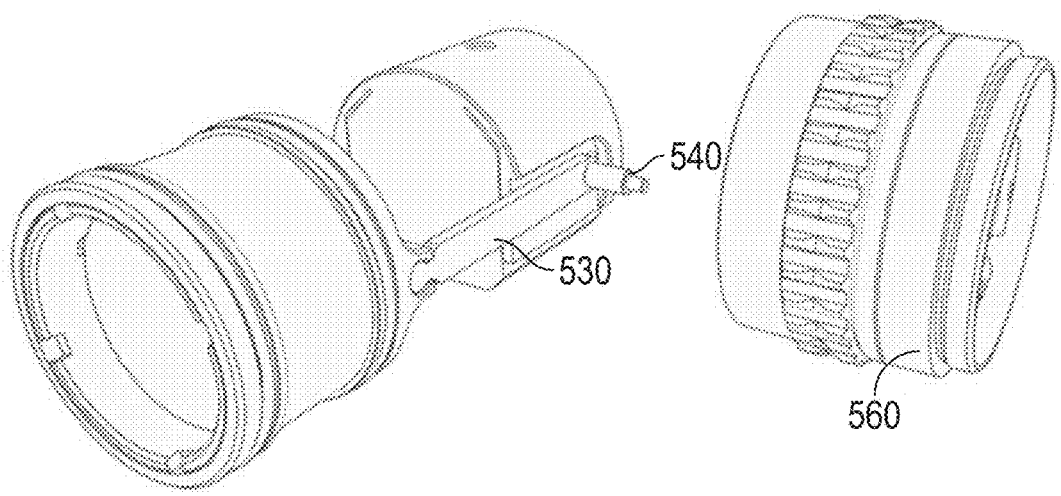
FIG. 5E is representative schematic of a parallax adjustment system having a connecting rod with one end connected to a focusing cell and the other end of the rod connected to a cam pin according to one embodiment of the disclosure.

As shown in FIG. 5E, in order to provide space in the main body of the viewing optic for the beam combiner (prismatic lenses), the focusing shell is shifted closer to the objective assembly. Thus, a mechanism is needed to connect the focusing cell to the parallax knob assembly. A connecting device 530 connects the focusing cell to a cam pin 540 that rides in a cam groove of the parallax knob assembly 560.

Figure 5F:
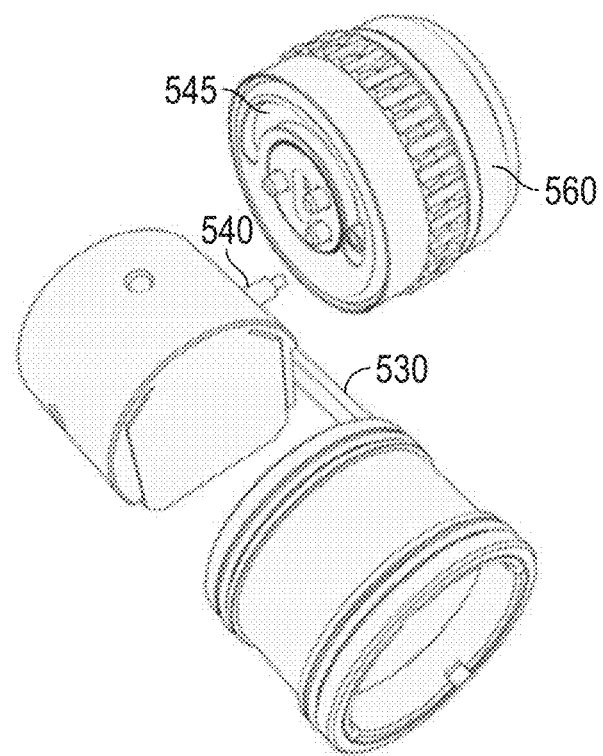
FIG. 5F is a representative schematic of a parallax adjustment system having a connecting rod with one end connected to a focusing cell and the other end of the rod connected to a cam pin that rests in a cam groove on the parallax knob according to one embodiment of the disclosure.

As shown in FIG. 5F the cam pin 540 rides in a cam groove 545 of the parallax knob assembly 560, allowing adjustment of the focusing cell via the parallax knob assembly.

In one embodiment, the shifted focusing cell, which has the parallax lenses, in the main body provides space to integrate a beam combiner ahead of a first focal plane of the objective system.

In one embodiment, the beam combiner in the main body of the riflescope disclosed herein is located in the space where the focusing cell is typically mounted in a traditional riflescope.

In one embodiment, the disclosure relates to a viewing optic comprising: (a) a main tube; (b) an objective system coupled to a first end of the main tube; (c) an ocular system coupled to the second end of the main tube, (d) a focusing cell located between the objective system and a beam combiner, wherein the beam combiner is positioned between the focusing cell and a first focal plane reticle; and (e) a rod connecting the focusing cell to a parallax adjustment element. In one embodiment, the rod connects the focusing cell to a cam pin of the parallax adjustment element. In some embodiments, the parallax adjustment element has a knob.

3. Magnification Tracking System

When a reticle is in the first focal plane, the reticle is in front of the erector system and thus the reticle changes proportionally with the change in lens position creating a magnified image. The erector system changes position through the use of a magnification ring that is located on the external portion of a rifle scope near the ocular housing. Typically, a magnification ring is connected with a screw to an outer erector sleeve, forcing the outer erector sleeve to rotate with the magnification ring when rotated causing cam grooves to change the position of the zoom lenses located in the erector system. When projecting a digital image onto the first focal plane it is necessary to scale that image with the scaling of the reticle to make the digital image usable.

Figure 6:
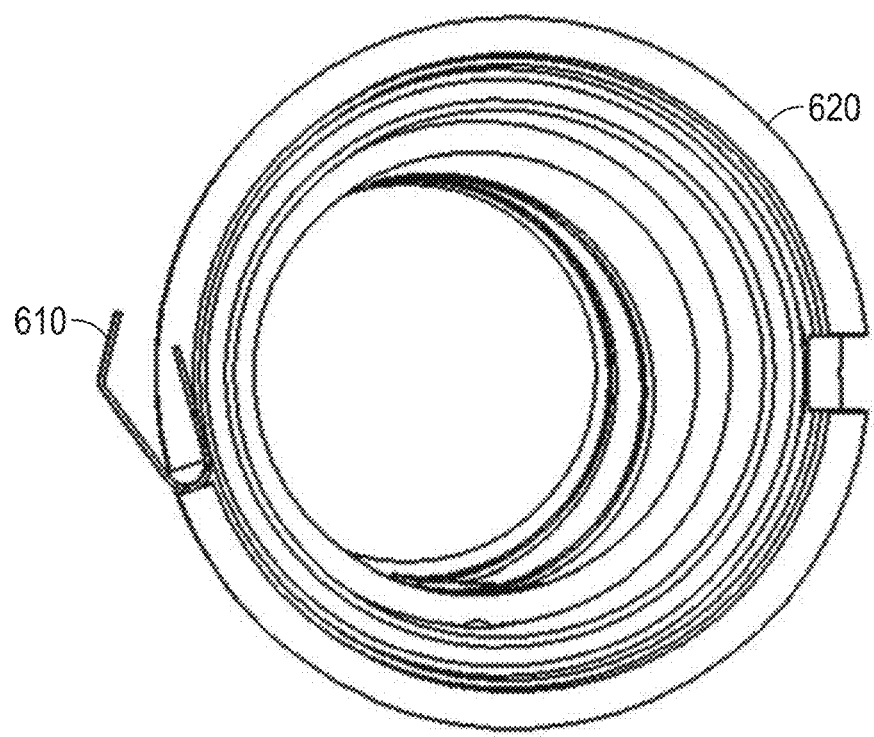
FIG. 6 is a representative schematic showing an outer erector sleeve with a potentiometer wiper according to one embodiment of the disclosure.
Figure 7:
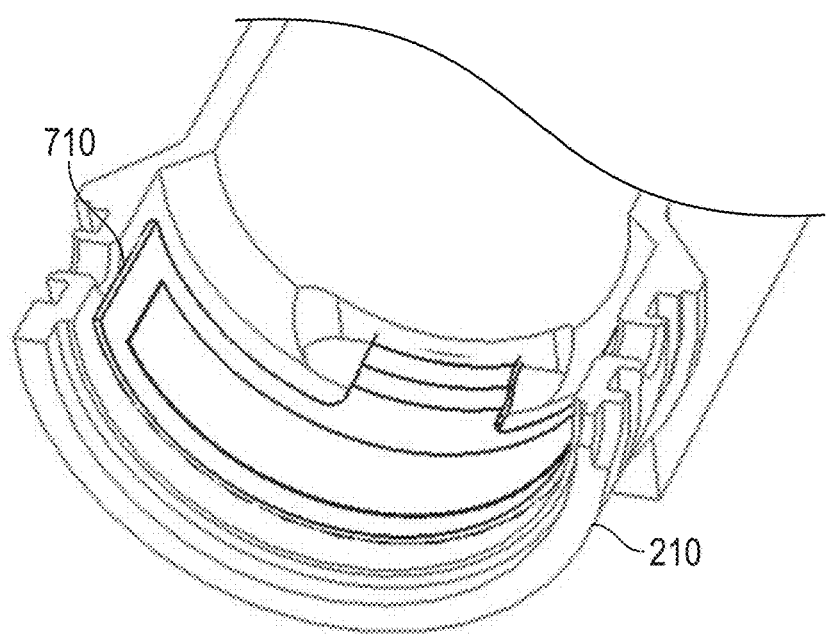
FIG. 7 is a representative schematic showing a membrane potentiometer placement on main body of a riflescope according to one embodiment of the disclosure.

In one embodiment, and as shown in FIG. 6, a potentiometer wiper 610 is located on the outside diameter of an outer erecter sleeve 620. The potentiometer wiper contacts a membrane potentiometer 710 located on the internal diameter of the main body 210 of the riflescope (see FIG. 7).

Figure 8:
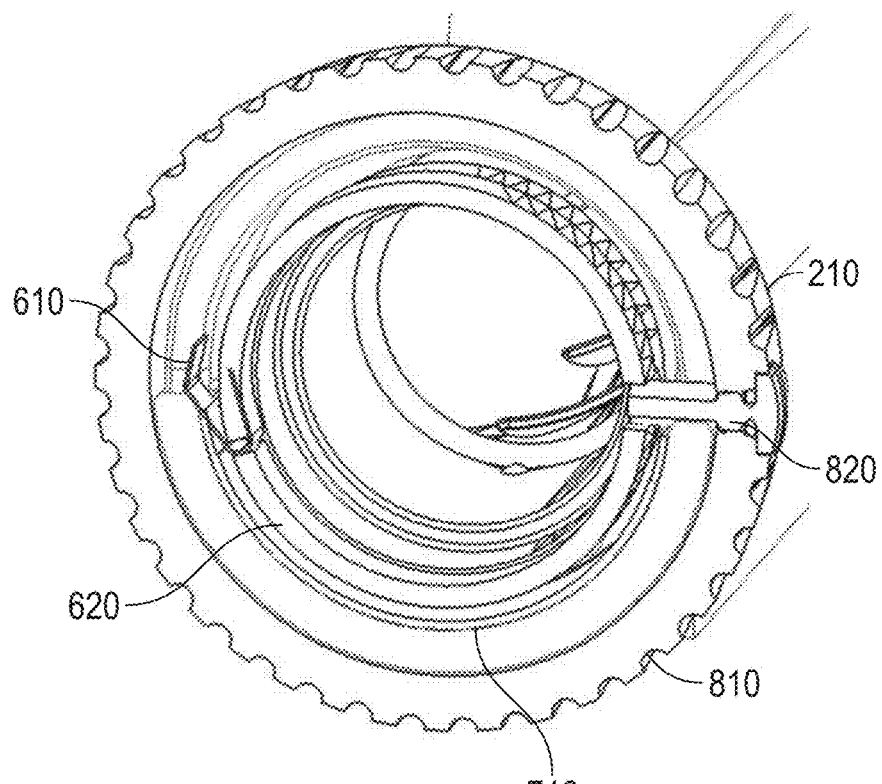
FIG. 8 is a representative schematic showing outer erector sleeve with potentiometer wiper installed and membrane potentiometer installed on main body of a riflescope according to one embodiment of the disclosure.

As shown in FIG. 8, in one embodiment, the potentiometer wiper 610 is a flat spring with two points of contact to insure it maintains contact with the membrane potentiometer 710. The flat spring is located between the outer erector sleeve 620 and inner erector tube. The potentiometer wiper 610 is located on the inside diameter of the riflescope on the opposing inner wall of the magnification ring slot screw 820. The potentiometer wiper 610 is fastened to the side inner side of the scope tube using adhesive.

In one embodiment, the potentiometer wiper has the ability to lay completely flat on the outside diameter of the outer erector sleeve. In one embodiment, the potentiometer wiper is placed internally on the outer erector sleeve.

In one embodiment, the potentiometer wiper is not placed on the magnification ring 810 of FIG. 8.

The magnification tracking system disclosed herein is located internally and no part is exposed to the environment, which offers a few advantages. First, the system is internal resulting in no seals being needed to protect the wiper/erector system from the environment. Secondly, magnification tracking system is completed when the erector system is installed into the riflescope. This eliminates the possibility for debris to enter the system through a screw hole on the exterior of the magnification ring.

4. Additional Components

In one embodiment, viewing optic can be controlled by buttons that are integral to the riflescope or externally attached buttons.

In one embodiment, the main body of the viewing optic can have a camera system.

In one embodiment, the main body of the viewing optic may have one or more computational systems. The integrated display system described below may be in communication with, or otherwise associated with the computational system. In some embodiments, the computational system may be enclosed within the first housing or body of the viewing optic. In some embodiments, the computational system may be coupled to an exterior portion of the viewing optic.

Figure 9:
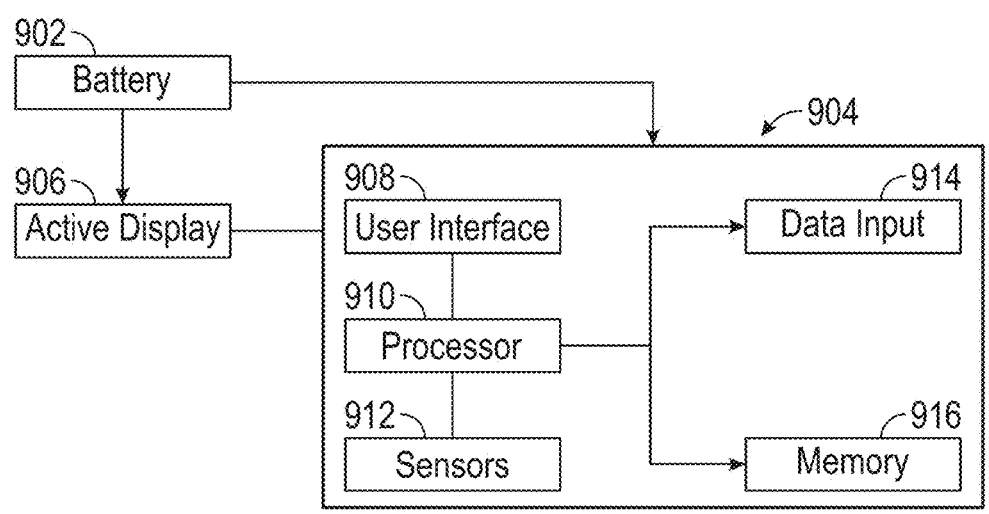
FIG. 9 is a block diagram of various components of the viewing optic according to an embodiment of the disclosure according to one embodiment of the disclosure.

FIG. 9 is a block diagram of various electronic components of the viewing optic according to an embodiment of the disclosure. A battery 902 can provide power to a computational system or control module 904 and an active display 906. In one embodiment, the computational system 904 may include, without limitation, a user interface 908, data input device 914, a processor 910, memory 916, and one or more sensors 912.

In one embodiment, the user interface 908 may include a plurality of input and/or output devices such as buttons, keys, knobs, touchscreens, displays, speakers, microphones, etc. Some components of the user interface such as, for example, buttons, may be used to manually enter data such as, for example, wind data, display intensity data, reticle intensity data, ballistic profile data, ballistic coefficient data, muzzle velocity data, primary zero data, static conditions of the rifle-scope system, GPS coordinate data, compass coordinate data, sight-above-bore data, etc. This data may be received by the processor and saved into the memory. The data may also be used by the processor in an algorithm or to execute an algorithm.

The data input device 914 may include wired or wireless communications devices and/or may include any type of data transfer technology such as, for example, a USB port, a mini USB port, a memory card slot (e.g., a microSD slot), NFC transceiver, Bluetooth® transceiver, Firewire, a ZigBee® transceiver, a Wi-Fi transceiver, an 802.6 device, cellular communication devices, and the like. It is noted that, while termed a data input device, such may be used in two way communications, providing data output as well.

In one embodiment, the processor 910 may be any type of processor known in the art that may receive inputs, execute algorithms and/or processes, and may include, without limitation, one or more general-purpose processors and/or one or more special-purpose processors (such as digital signal processing chips, graphics acceleration chips, and/or the like). The processor may be used to control various processes, algorithms, and/or methods in the operation of the riflescope. The processor may control operation of a display system and/or a reticle. The processor may also receive inputs from the user interface, the data input, the memory, the sensor(s), a position encoder associated with the position of an adjustable component (e.g., the vertical adjustment knob, the windage adjustment knob or the parallax dial), and/or from other sources.

In one embodiment, memory 916 may include any type of digital data storage such as such as random access memory ("RAM") and/or read-only memory ("ROM"), which can be programmable, flash-updateable, and/or the like. In other embodiments, the memory may include memory from an externally connected device including, for example, a disk drive, a drive array, an optical storage device, or a solid-state storage device. In some embodiments, the memory may be configured to store ballistic information that includes data that can be used, for example, to correct for the amount a bullet may drop over a given distance and/or the horizontal deflection of the bullet.

Data may be entered from another device (e.g., the processor may receive data via the data input device that may be entered from another device such as computer, laptop, GPS device, a rangefinder, tablet, or smartphone, etc.) and stored into the memory. Such data may include, for example, calibration data, a ballistic profile lookup table that cross-references rotational data and/or linear data with shoot-to-range values, rifle data, projectile data, user data, etc.

The sensor(s) 912 may be used to sense any of a variety of environmental conditions or characteristics associated with the use of the riflescope. For example, the sensor(s) may sense atmospheric conditions (such as humidity, temperature, pressure, etc.), inclination, rifle cant, and/or the sight direction of the rifle (compass direction). Any number of sensors may be included. Sensor data may be recorded by the processor and saved into the memory and/or used in the processing of instructions for operation of the viewing optic.

The control module 904 may also include software elements, which may be located within working memory 916. The software elements may include an operating system and/or other code, such as one or more application programs.

In one embodiment, a camera can communicate with control module.

B. Second Housing

In one embodiment, the second housing is coupled to the first housing and contains an integrated display system. In one embodiment, the second housing is a base coupled to a portion of the main body of a viewing optic. In one embodiment, the base is separable from the main body of a viewing optic.

In one embodiment, the second housing is not an image stabilization device. In one embodiment, the length of the base having an integrated display system is from 35% to 70% the length of the main body of a riflescope to which the base is coupled. In yet another embodiment, the base having an integrated display system is from 40% to 65% the length of the main body of a riflescope to which the base is coupled. In still another embodiment, the base having an integrated display system is no more than 65% of the length of the main body of the riflescope to which the base is coupled.

In one embodiment, the main body of the riflescope is about 2.5× the length of the base having an integrated display system. In yet another embodiment, the main body is from 1.5× to 2.5× the length of the base having an integrated display system. In yet another embodiment, the main body is at least 1.5× the length of the base having an integrated display system.

As shown in FIG. 2, the base 220 can be bolted to the scope body 210 of the riflescope to form a totally enclosed and integrated system. The base 220 can then be directly attached to the firearm without the need for traditional riflescope rings.

Figure 10:
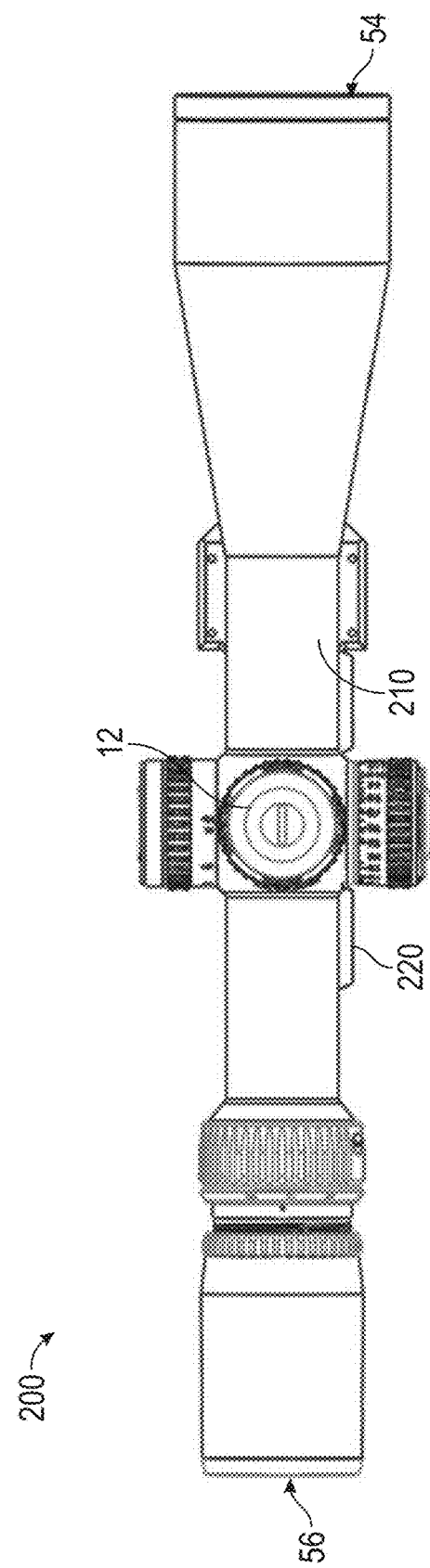
FIG. 10 is top view of a riflescope having a main body and a base according to one embodiment of the disclosure.

FIG. 10 displays a top view of the riflescope 200 with a main body 210 and a base 220. FIG. 10 demonstrates that the base 220 does not cause the riflescope to bulge at any position or be out of proportion with a traditional riflescope. The riflescope disclosed herein having a main body and a base maintains the traditional, sleek design of a riflescope.

Figure 11:
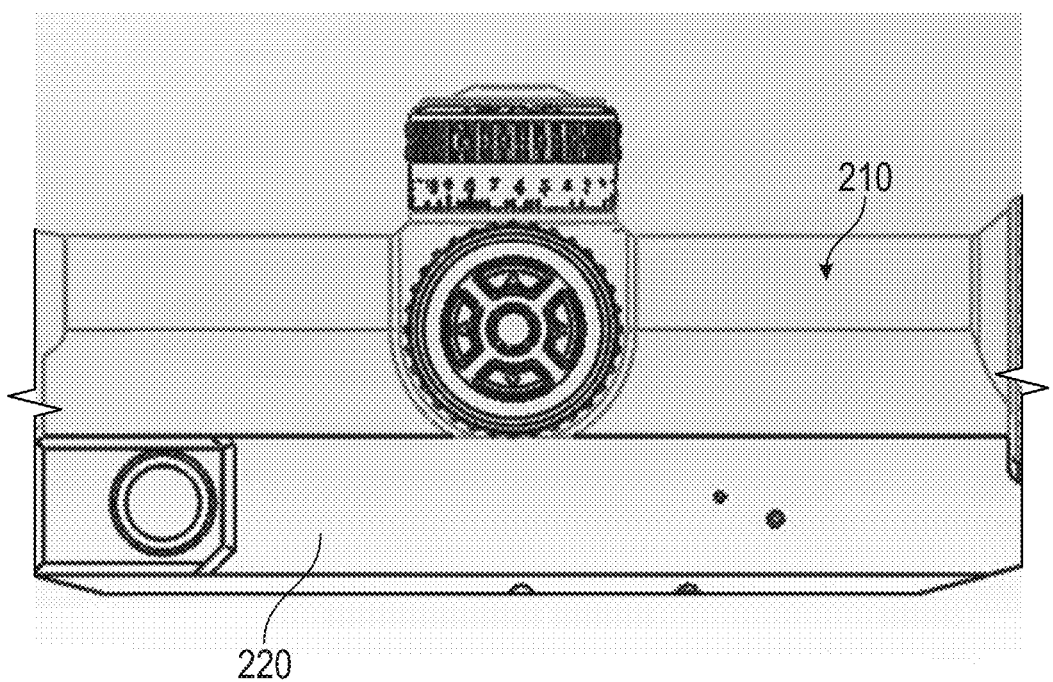
FIG. 11 is a side view of a portion of the riflescope having a main body and a base according to one embodiment of the disclosure.

FIG. 11 displays the base 220 attached to the main body 210 of the riflescope. The base 220 is aligned and flush with the outer edges of the main body 210.

In one embodiment, and as shown in FIG. 2, the base having an integrated display system is coupled to the bottom side of the main body 210 of the riflescope, with one end of the base coupling at approximately the power selection ring or magnification ring 212 of the main body 210 and the other end of the base coupling at about the start of the objective assembly 214 of the main body. In one embodiment, the base 220 is coupled to the main body 210 by threaded fasteners, unthreaded integral and non-integral locating and recoil transmission features, and an elastomeric seal.

In one embodiment, the base can be populated with the components necessary for generating a digital display and then the base can be bolted to the main body of the riflescope to form a totally enclosed and integrated system.

In one embodiment, a viewing optic, which has a main body and a base coupled to the main body, can be coupled to a firearm without the need for traditional riflescope rings. In one embodiment, a viewing optic has a main body and a base coupled to the main body, wherein the bottom side of the base has a mounting rail.

In one embodiment, the base of the viewing optic can include a mounting rail for mounting to a desired firearm, equipment or device, and can have an adjustment mechanism including an elevation adjustment drum for adjusting the elevational position of the optics. A lateral adjustment mechanism is also typically provided for side-to-side adjustment. The adjustment mechanisms can be covered with a protection cap.

In one embodiment, the top side of the base couples to the bottom-side of the main body of a viewing optic and the bottom-side of the base has a mounting rail. In one embodiment, the top side of the base couples to a lateral split in the bottom-side of the main body of a viewing optic.

In one embodiment, the base comprises an integrated display system for generating images with an active display and directing the images along the display optical axis for simultaneous overlaid viewing of the generated images with images of the outward scene, wherein the generated image is injected into the first focal plane of a main body of a viewing optic.

1. Integrated Display System

In one embodiment, the second housing comprises an integrated display system. In another embodiment, a base comprises an integrated display system. In yet another embodiment, the base having an integrated display system is coupled to a main body of a riflescope. In still another embodiment, the base is coupled to a bottom portion of a main body of a riflescope.

In one embodiment, the base has an integrated display system comprising an active display, collector optics, and a reflective material, including but not limited to a mirror. In one embodiment, the integrated display system has the following architecture: an active display, followed by collector optics, followed by a reflective material such as a mirror.

Figure 12:
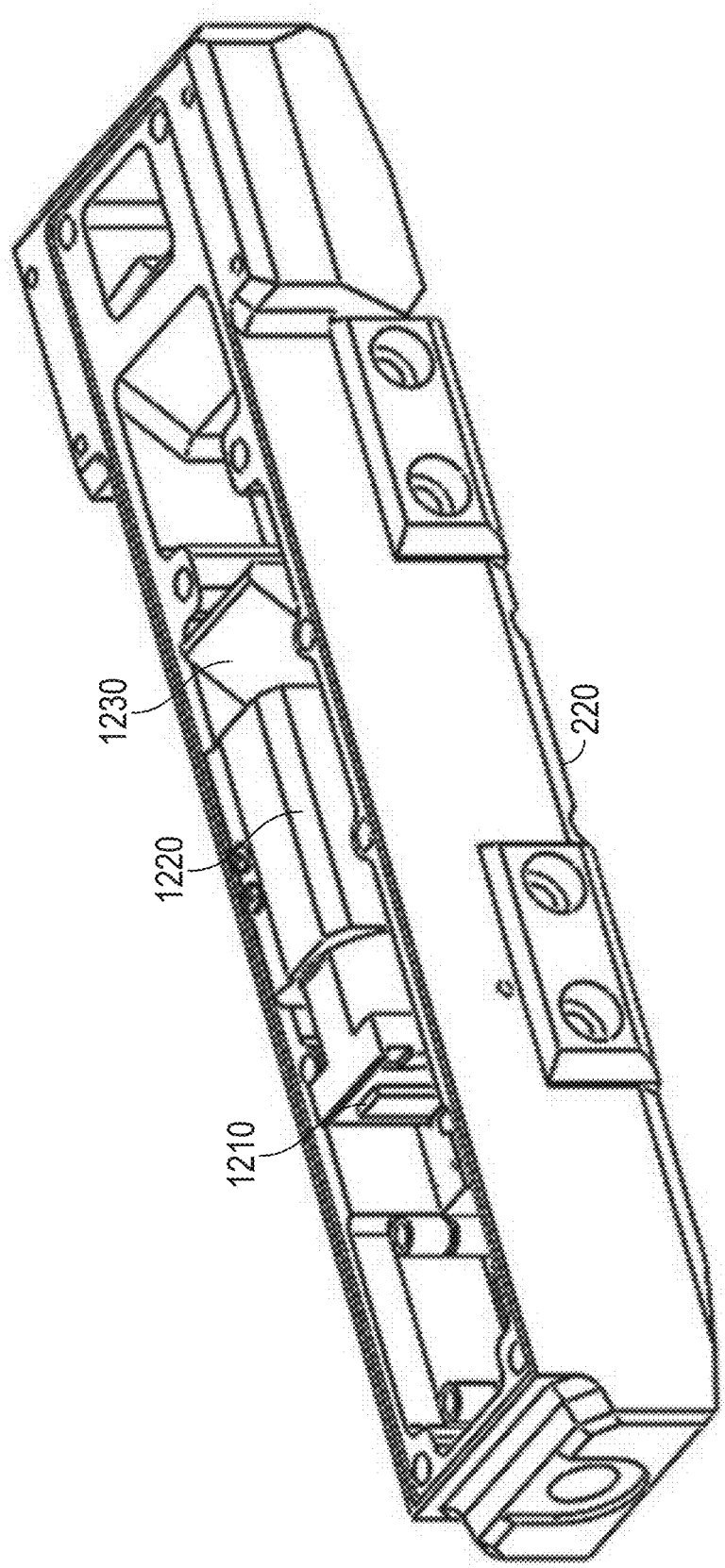
FIG. 12 is a schematic of a cut away side view of the riflescope with a main body having a glass etched reticle and a base with an integrated display system according to one embodiment of the disclosure.

FIG. 12 depicts a top cut-away view of the base 220 that couples to a main body of a viewing optic. The base 220 comprises an integrated display system having a micro display 1210, collector optics 1220, and a mirror 1230. In one embodiment, the mirror 1230 can be positioned at any suitable angle.

Figure 13:
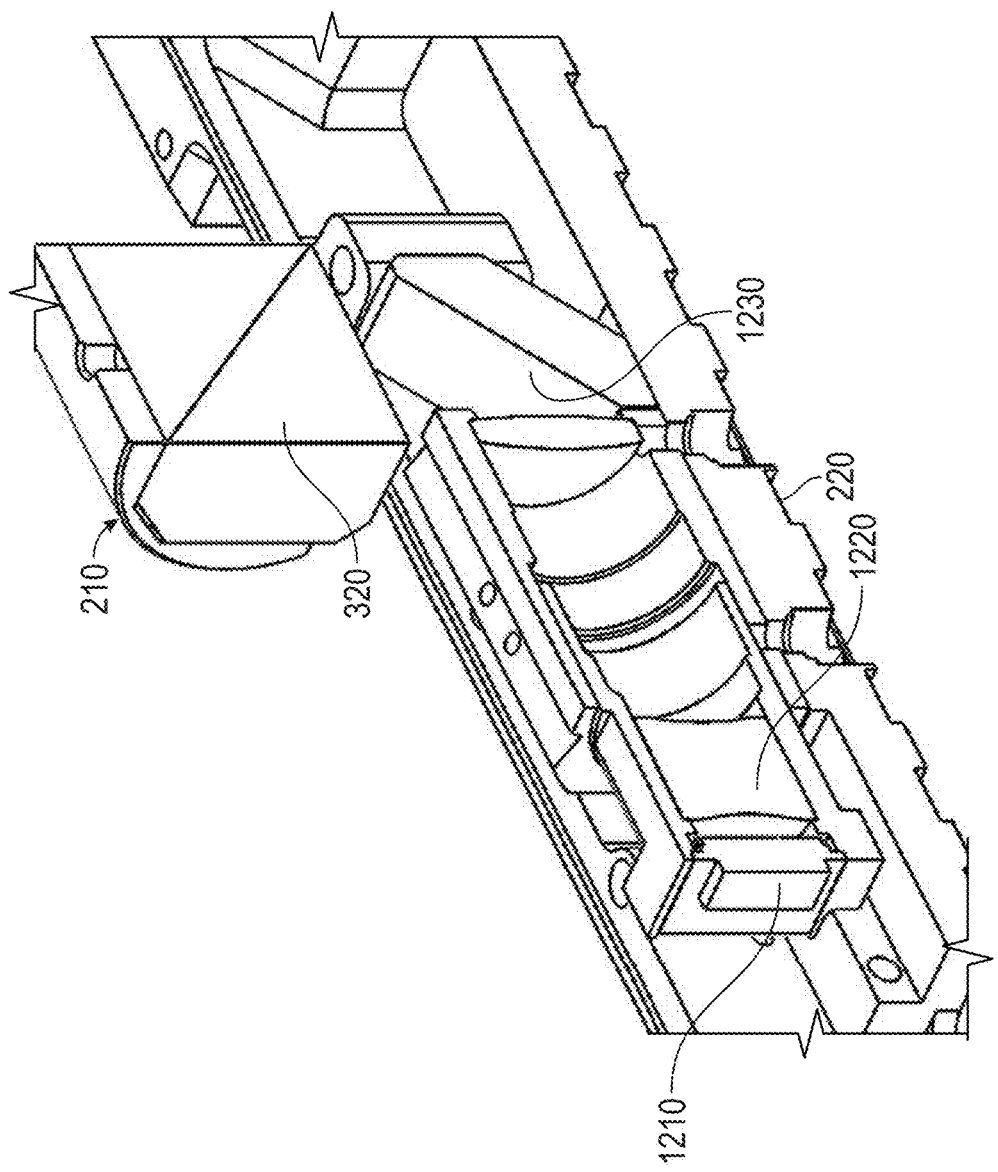
FIG. 13 is a representative schematic of showing a side cutaway view of an integrated display system according to one embodiment of the disclosure.

FIG. 13 depicts a side cut-away view of a base 220 with an integrated display system having a micro display 1210, collector optics 1220, and a mirror 1230. A main body 210 has a beam combiner 320 located above the mirror 1230.

Figure 14:
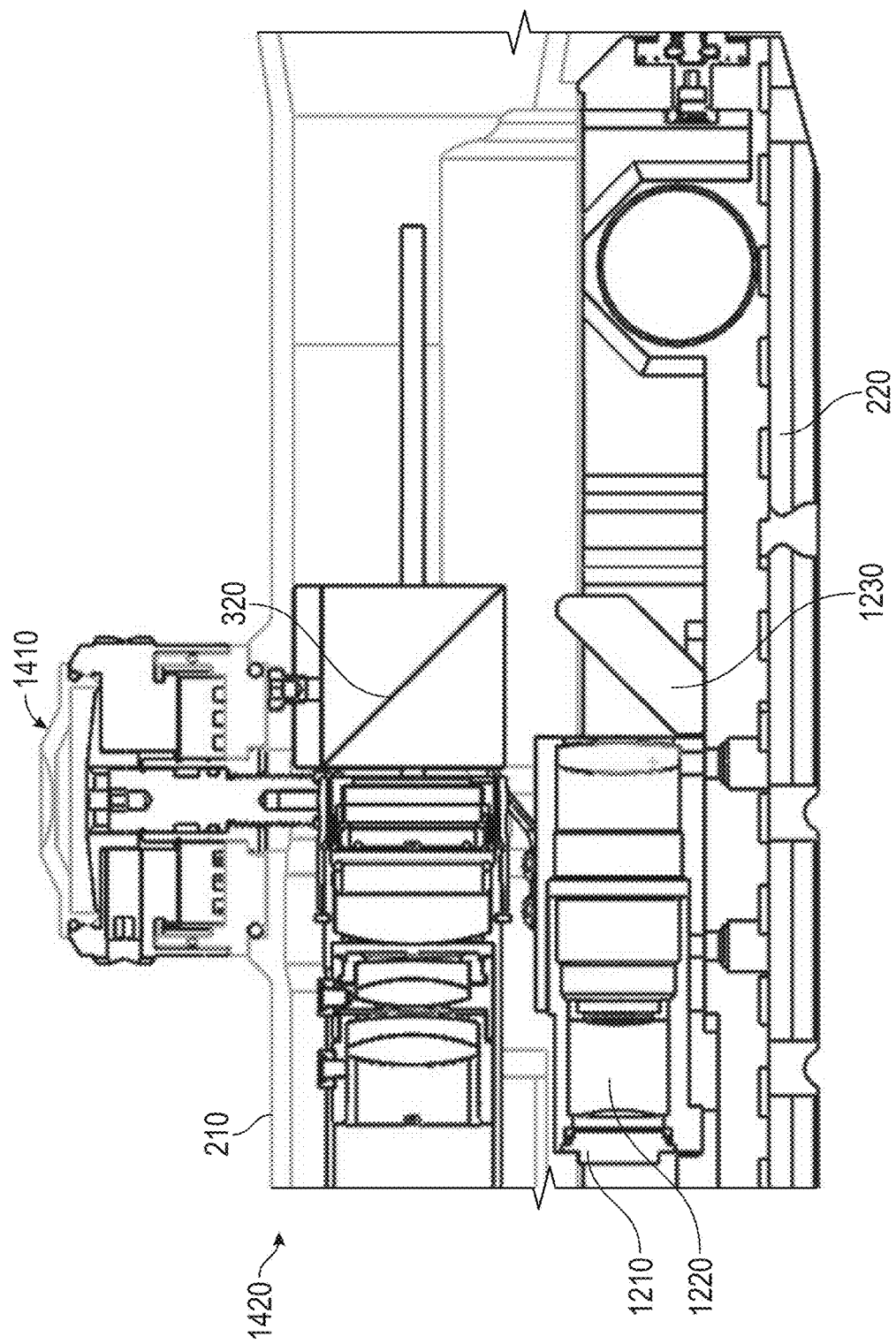
FIG. 14 is a schematic of a cut away side view of a main body of a viewing optic and a base with an integrated display system, with the base coupled to at least a portion of the main body according to one embodiment of the disclosure.

FIG. 14 depicts a side cut-away view of riflescope with a main body 210 and a separable base 220. The base 220 comprises a micro display 1210, collector optics 1220, and a mirror 1230. The mirror 1230 is positioned at about 45 degrees. The scope body 210 has a beam combiner 320 that is located approximately above the angled mirror 1230. The beam combiner 320 is located approximately below the elevation adjustment knob 1410 of the scope body 210. The active display 1210 is located in the base on the ocular assembly side 1420 when the base 220 is coupled to the main body 210 of the viewing optic.

Figure 15:
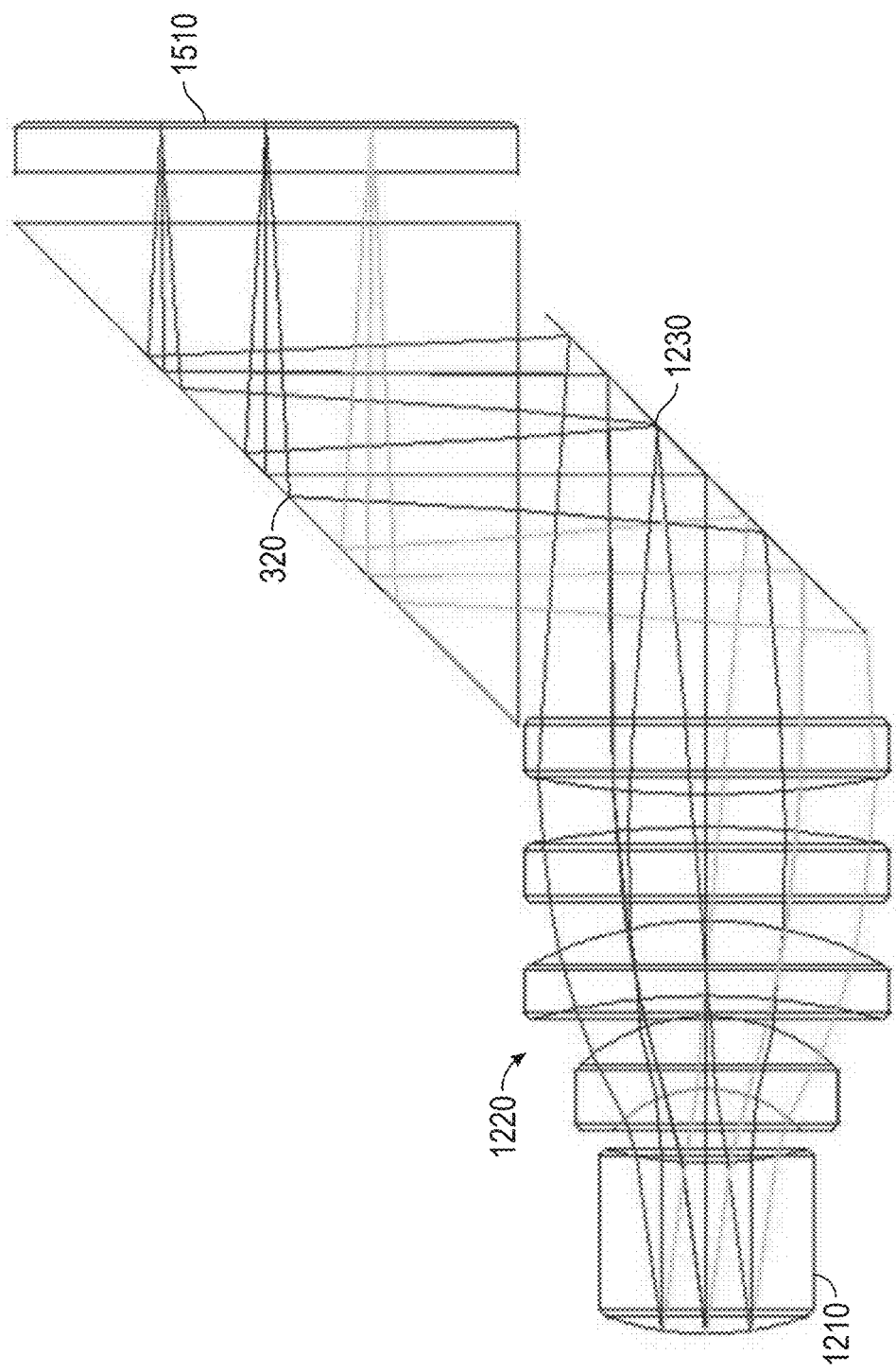
FIG. 15 is a representative depiction of an integrated display system for imaging the digital display onto a first focal plane of an optic system of the main body of the viewing optic according to one embodiment of the disclosure.

As depicted in FIG. 15, the images generated from the micro display 1210 can be redirected from the display optical axis A onto the viewing optical axis A through a mirror 1230 to a beam combiner 320 in the main body 210 for simultaneously superimposing or overlaying into the first focal plane 1510 the digital images onto the images of the scene viewed by the viewer through the optics. Because the beam combiner 320 is positioned before the first focal plane 1510, and the combined image is focused on the first focal plane, the displayed image and the viewed image do not move in relation to one another. This is a major advancement compared to devices that inject the image into the second focal plane.

Figure 16:
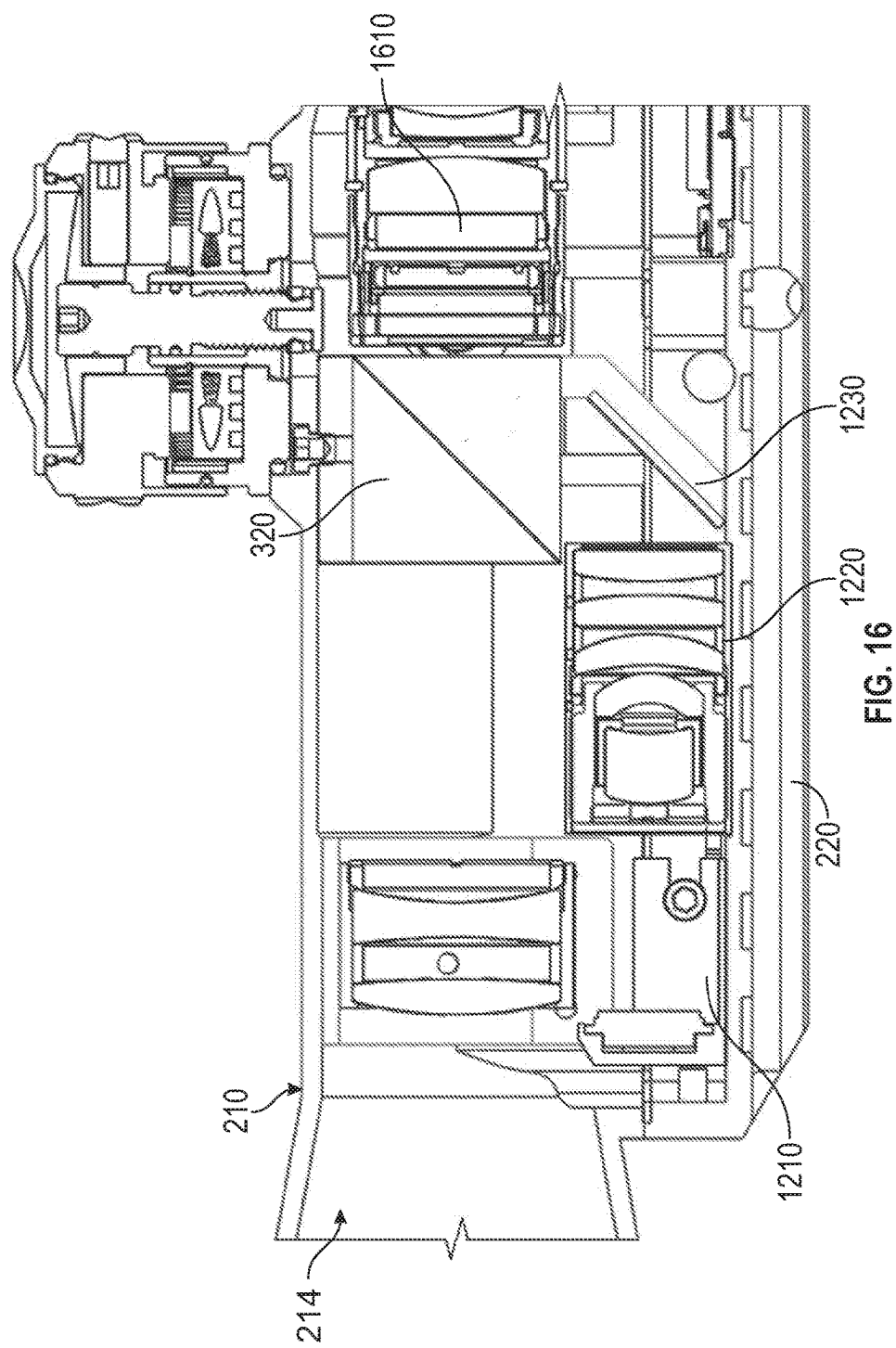
FIG. 16 is a schematic of a main body of a viewing optic and a base with an integrated display system with an active display located in a portion of the base closest to the objective assembly as compared to the ocular assembly of the main body of the viewing optic according to one embodiment of the disclosure.

In one embodiment, as shown in FIG. 16, the active display 1210 is located in a portion of the base closest to the objective assembly 214 as compared to the ocular assembly of the main body of a riflescope, when the base is coupled to the main body of a riflescope. The main body of the riflescope has an analog reticle 1610.

Figure 17:
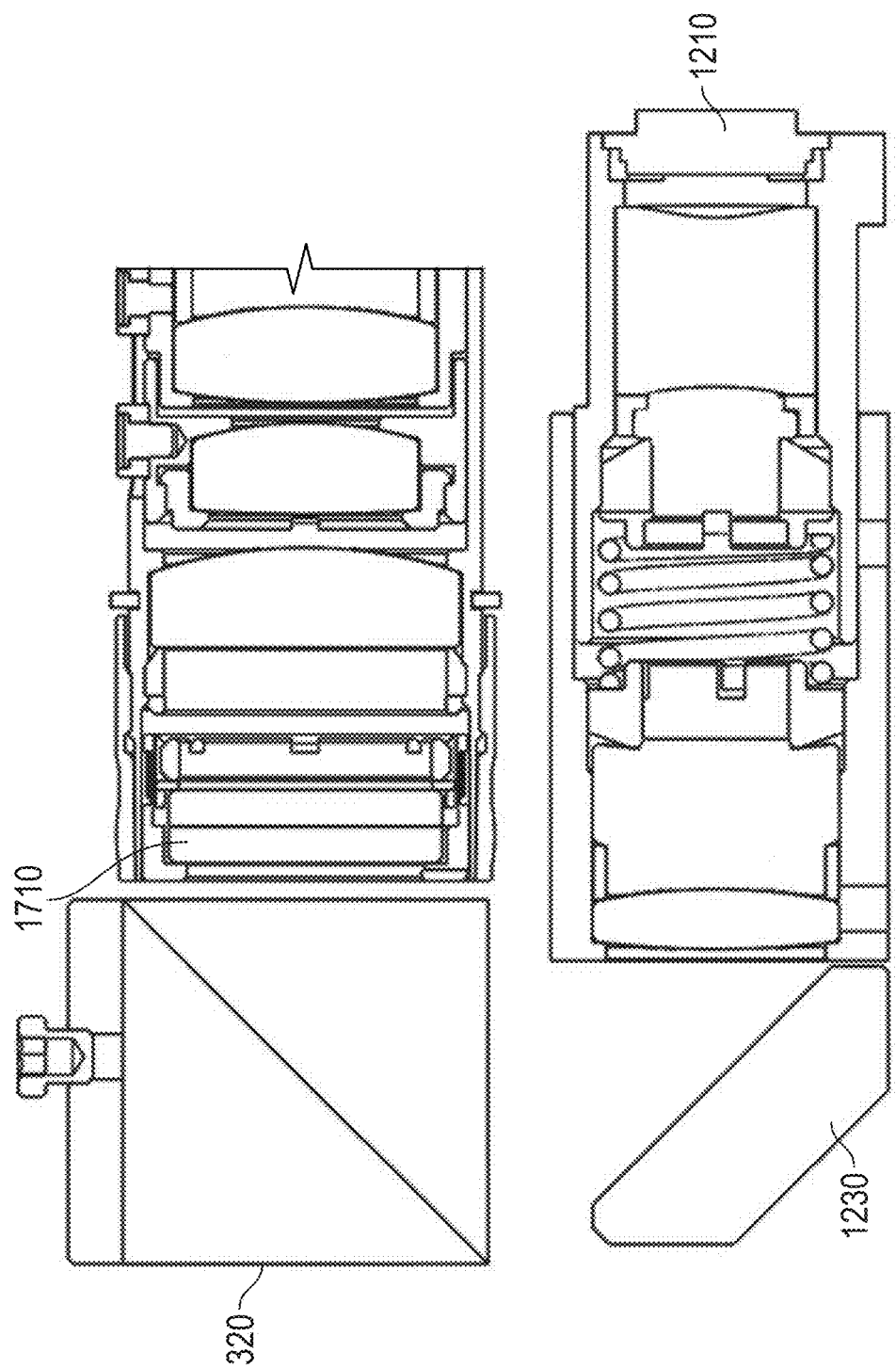
FIG. 17 is a schematic of a main body of a viewing optic and a base with an integrated display system with an active display located in a portion of the base closest to the ocular assembly as compared to the objective assembly of the main body of the viewing optic according to one embodiment of the disclosure.

FIG. 17 depicts the riflescope 200 with a main body 210 with a beam combiner 320 and a base 220 coupled to the main body and having an integrated display system. As shown in FIG. 17, the active display 1210 is located in a portion of the base closest to the ocular assembly as compared to the objective assembly of the main body of a riflescope, when the base is coupled to the main body of a riflescope. By superimposing the image from the integrated display system onto the first focal plane, the user is still able to use a traditional glass etched reticle 1610 for aiming purposes.

In one embodiment, the integrated display system can direct generated images from the active display along a display optical axis A. The generated images can be directed from the display optical axis A to a mirror in the base to a beam combiner in a main body of a riflescope for simultaneously superimposing or overlaying the generated images onto the images of the scene viewed by the viewer through an optics system of the main body, wherein the combined image is injected into or focused onto the first focal plane of the optic system of the main body.

In one embodiment, the image generated from the active display in the base is focused on the first focal plane of the main body of a riflescope, which allows the display generated images to maintain alignment with externally mounted accessories.

In one embodiment, the image generated from the active display in the base is focused on the first focal plane of the main body of a riflescope, thus, the generated image is not tied to the movement of the erector tube. The generated image is independent of movement of the erector tube.

In one embodiment, light from an active micro-display is collected by a group of optical lenses. The light from the display is reflected to a beam combiner in the riflescope main tube assembly and an image of the display is formed that is coincident with the first focal plane of the riflescope. This image of the display is combined with the image coming from the scene (target) and is perceived as being "underneath" the traditional wire or glass etched reticle. In one embodiment, the "traditional" reticle, which is still utilized, occludes both the image of the scene and the image of the display. If the luminance of the display is increased to sufficient brightness levels, the image of the OLED display will saturate the image of the scene and will appear to occlude the scene as well.

In yet another embodiment, the integrated display system in the base can direct generated images along a display optical axis "B," onto viewing optical axis A in the main body of a riflescope. The images can be redirected from the display optical axis B with a mirror or similar reflective material in the base to a beam combiner in the main body onto the viewing optical axis A in the main body, which allows for simultaneously superimposing or overlaying the generated images onto the images of the scene viewed by the viewer through the optics of the main body. The generated images from the active display in the base are directed toward a mirror, which reflects the images to a beam combiner.

In one embodiment, display optical axis "B" and viewing optical axis "A" are substantially parallel, although other embodiments may be differently oriented as desired.

A. Active Display

In one embodiment, the integrated display system has an active display. In one embodiment, the active display is controlled by a microcontroller or computer. In one embodiment, the active display is controlled by a microcontroller with an integrated graphics controller to output video signals to the display. In one embodiment, information can be sent wirelessly or via a physical connection into the viewing optic via a cable port. In still another embodiment, numerous input sources can be input to the microcontroller and displayed on the active display.

In one embodiment, the active display can be a reflective, transmissive or an emissive micro-display including but not limited to a micro display, transmissive active matrix LCD display (AMLCD), Organic light-emitting diode (OLED) display, Light-Emitting Diode (LED) display, fe-ink display, a plasma display, a segment display, an electroluminescent display, a surface-conduction electron-emitter display, a quantum dot display, etc.

In one embodiment, the LED array is a micro-pixelated LED array and the LED elements are micro-pixelated LEDs (also referred to as micro-LEDs or µLEDs in the description) having a small pixel size generally less than 75µm. In some embodiments, the LED elements may each have a pixel size ranging from approximately 8µm to approximately 25µm, and have a pixel pitch (both vertically and horizontally on the micro-LED array) ranging from approximately 10µm to approximately 30µm. In one embodiment, the micro-LED elements have a uniform pixel size of approximately 14µm (e.g., all micro-LED elements are the same size within a small tolerance) and are arranged in the micro-LED array with a uniform pixel pitch of approximately 25µm. In some embodiments, the LED elements may each have a pixel size of 25µm or less and a pixel pitch of approximately 30µm or less.

In some embodiments, the micro-LEDs may be inorganic and based on gallium nitride light emitting diodes (GaN LEDs). The micro-LED arrays (comprising numerous µLEDs arranged in a grid or other array) may provide a high-density, emissive micro-display that is not based on external switching or filtering systems. In some embodiments, the GaN-based, micro-LED array may be grown on, bonded on, or otherwise formed on a transparent sapphire substrate.

In one embodiment, the sapphire substrate is textured, etched, or otherwise patterned to increase the internal quantum efficiency and light extraction efficiency (i.e., to extract more light from the surface of the micro-LEDs) of the micro-LEDs. In other embodiments, silver nanoparticles may be deposited/dispersed on the patterned sapphire substrate to coat the substrate prior to bonding the micro-LEDs to further improve the light efficiency and output power of the GaN-based micro-LEDs and of the micro-LED array.

In one embodiment, the active display can be monochrome or can provide full color, and in some embodiments, can provide multi-color. In other embodiments, other suitable designs or types of displays can be employed. The active display can be driven by electronics. In one embodiment, the electronics can provide display functions, or can receive such functions from another device in communication therewith.

In one embodiment, the active display can be part of a backlight/display assembly, module or arrangement, having a backlight assembly including a backlight illumination or light source, device, apparatus or member, such as an LED backlight for illuminating the active display with light. In some embodiments, the backlight source can be a large area LED and can include a first or an integrated lens for collecting and directing generated light to a second, illumination or condenser lens, for collecting, concentrating and directing the light onto active display, along display optical axis B, with good spatial and angular uniformity. The backlight assembly and the active display are able to provide images with sufficient high brightness luminance to be simultaneously viewed with a very high brightness real world view through optics, while being at low power.

The backlight color can be selected to be any monochrome color, or can be white to support a full color microdisplay. Other backlight design elements can be included, such as other light sources, waveguides, diffusers, micro-optics, polarizers, birefringent components, optical coatings and reflectors for optimizing performance of the backlight, and which are compatible with the overall size requirements of the active display, and the luminance, power and contrast needs.

FIGS. 16 and 17 depict representative examples of an integrated display system in a base that couples to a main body, showing a display, an optics system, and a mirror. The integrated system functions with an optics system housed in a main body of a viewing optic, which is depicted above the integrated display system.

Representative examples of micro displays that can be used include but are not limited to: Microoled, including MDP01 (series) DPYM, MDP02, and MDP05; Emagin such as the SVGA, micro-displays with pixel pitches are 9.9×9.9 micron and 7.8×7.8 micron, and Lightning Oled Microdisplay, such as those produced by Kopin Corporation. Micro LED displays can also be used including but not limited to those produced by VueReal and Lumiode.

In one embodiment, the electronics working with the active display can include the ability to generate display symbols, format output for the display, and include battery information, power conditioning circuitry, video interface, serial interface and control features. Other features can be included for additional or different functionality of the display overlay unit. The electronics can provide display functions, or can receive such functions from another device in communication therewith.

In one embodiment, the active display can generate images including but not limited to text, alpha-numerics, graphics, symbols, and/or video imagery, icons, etc., including active target reticles, range measurements and wind information, GPS and compass information, firearm inclination information, target finding, recognition and identification (ID) information, and/or external sensor information (sensor video and/or graphics), or images for situational awareness, for viewing through the eyepiece along with the images of the view seen through optics. The direct viewing optics can include or maintain an etched reticle and bore sight, and retain high resolution.

In one embodiment, the utilization of an active display allows for a programmable electronic aiming point to be displayed at any location in the field of view. This location could be determined by the user (as in the case of a rifle that fires both supersonic and subsonic ammo and thus has two different trajectories and "zeros"), or could be calculated based upon information received from a ballistic calculator. This would provide a "drop compensated" aiming point for long range shooting that could be updated on a shot to shot interval.

In one embodiment, the active display can be oriented to achieve maximum vertical compensation. In one embodiment, the active display is positioned to be taller than it is wide.

Figure 18:
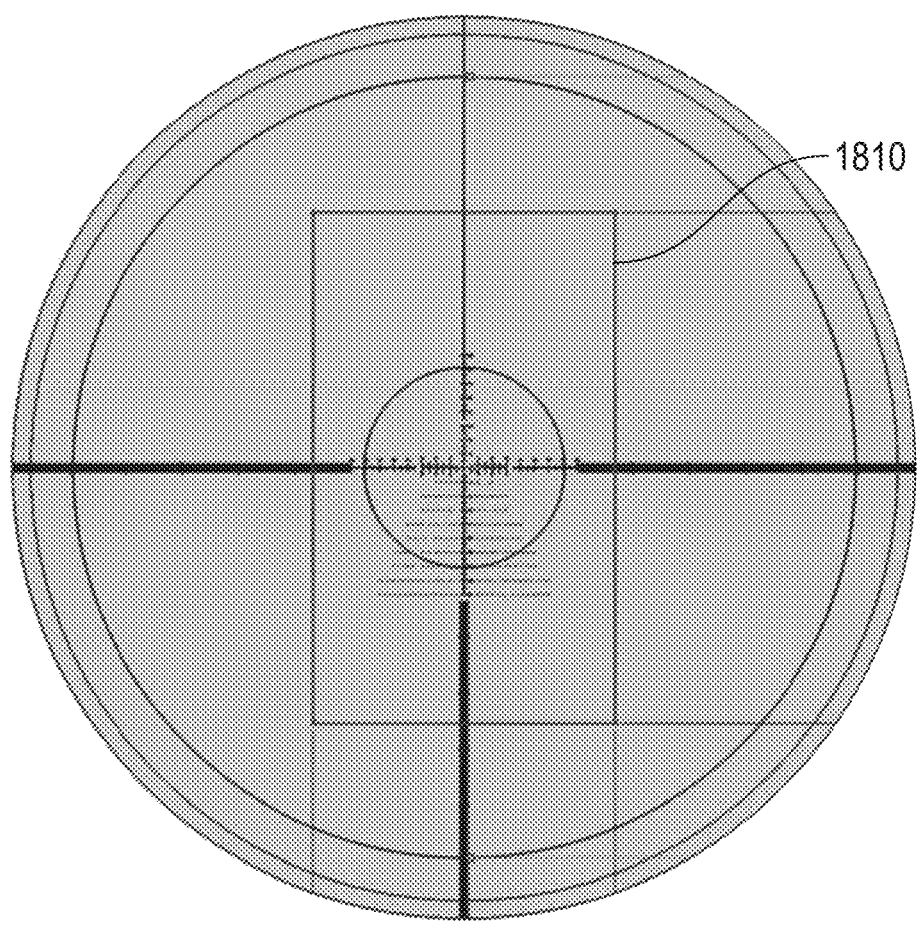
FIG. 18 is a representative schematic showing aspect ratio of a micro-display according to one embodiment of the disclosure.

In one embodiment, the active display is oriented as shown in FIG. 18, which allows for the maximized range of vertical adjustment 1810 of an active reticle within a riflescope. Maximized vertical adjustment is beneficial since it allows for the ballistic compensation of scenarios at longer range.

In one embodiment, the integrated display system further comprises a processor in electronic communication with the active display.

In another embodiment, the integrated display system may include memory, at least one sensor, and/or an electronic communication device in electronic communication with the processor.

Method of Use for Range Finding

In one embodiment, the active display can display range measurements obtained from a laser rangefinder. In one embodiment, a LRF can be coupled to a viewing optic. In one embodiment, the LRF is directly coupled to the outer scope body of the riflescope. In another embodiment, a portion of a LRF is directly coupled to the outer portion of the scope body of the riflescope.

In one embodiment, the LRF is indirectly coupled to the outer scope body of the riflescope. In another embodiment, a portion of a LRF is indirectly coupled to the outer portion of the scope body of the riflescope.

In yet another embodiment, a LRF is not coupled to the riflescope but communicates with the riflescope via either hard-wiring or wirelessly.

In general operation, a LRF provides a pulse of laser light that is projected into the scene via the projection optics. This laser light illuminates the object, and a portion of the laser light is reflected back toward the LRF. Part of the reflected laser light returning to the device is captured by the receiving optical system, and is directed to a detector. The device includes a timer starting when the laser light pulse is transmitted and stopping when the returning laser light is detected. A calculator portion of the device uses the elapsed time from transmission of the laser light pulse until detection of the returning reflected laser light to calculate the distance to the object.

In one embodiment, distance calculations are transmitted to the active display, and the generated images (distance measurements or calculations) are redirected from the display optical axis "B" onto the viewing optical axis A with a mirror and a beam combiner for simultaneously superimposing or overlaying the images (distance measurements or calculations) onto the images of the scene viewed by the viewer through the viewing optics.

Windage Range Bar

In another embodiment, the active display can generate a windage range. In one embodiment, a user can supply a range of wind values, and software can generate windage data, for example a windage range variance bar. In one embodiment, the windage data is transmitted to the active display, and the generated images, e.g., windage range variance bar, is redirected from the display optical axis "B" onto the viewing optical axis "A" with a mirror and a beam combiner for simultaneously superimposing or overlaying the images (windage range variance bar) onto the images of the scene viewed by the viewer through the viewing optics.

In one embodiment, the windage data includes the minimum wind hold point to the maximum wind hold point.

In one embodiment, the windage data is transmitted to the active display, and the active display can generate a digital reticle into the field of view at the appropriate wind hold.

Display Colors for Mental Cues

In one embodiment, the active display can generate a color display to convey an extra level of information to the user in a quick-to-comprehend format. In one embodiment, the active display can generate a series of color coded symbols to indicate a readiness to fire.

In one embodiment, the active display can generate a series of color coded symbols to color code objects in the target scene. In one embodiment, the active display can color code friendly forces from enemy forces. In another embodiment, the active display can color code targets of interest.

In one embodiment, the active display can generate a series of color coded symbols to indicate status of windage adjustment. In one embodiment, a red dot can indicate that windage adjustment has not been completed while a green symbol could indicate that windage adjustment has been completed.

In another embodiment, the active display can generate an aiming point with color. In one embodiment, the aiming point would be a red color if proper adjustments, including but not limited to windage, range, and elevation, have not been performed. In another embodiment, the aiming point would be a yellow color if some but not all shooting adjustments have been completed. In still another embodiment, the aiming point would be green if all the requisite shooting adjustments have been completed, and the aiming point is fully compensated.

In yet another embodiment, flashing and steady states of symbols may be utilized to convey similar status information regarding the adjustment of the aiming point.

In still another embodiment, the active display can generate text that is shown in colors to indicate status. In one embodiment, red text can indicate that in input parameter has not been entered or calculated, and green for text indicating a parameter which has been input or calculated.

Markers for Impact Zone in Range Finding

In one embodiment, an active display can generate circles, squares, or other shapes to allow the user to quickly encompass or encircle the impact zone of a projectile.

Hold-over Estimation and Compensation

In another embodiment, the active display can generate an aiming point compensated for a moving target based on user input for the direction and rate of movement. For example, the user may input a rate of movement of 5 miles per hour to the left. This would be added to the windage value if the wind and movement are in the same direction, and subtracted from the windage value if the wind and movement are in opposite direction. Then, when the aiming point and/or windage value bar are plotted on the display, the aiming point will include the proper amount of hold-over to allow the user to place the aiming point dot on the desired impact zone and take the shot, rather than to have to place the aiming point ahead of the moving target to compensate for movement.

Team Operation via Camera and Remote Display Manipulation

In one embodiment, the active display in conjunction with a network interface allow for an additional level of enhanced operation and usage. In one embodiment, the reticle images of a plurality of shooters over a network can be viewed. Each shooter's reticle camera image is shown on one or more consoles, and network processes and interfaces enable a group-level of coordination, training, and cooperation not before available in individual riflescopes.

Training and Coaching. In a training or coaching scenario, the coach can see how each shooter has aligned his or her reticle on his or her respective target. By being able to actually see the reticle alignment, the coach or trainer can then provide instructions on adjustments and repositioning, such as by verbal instructions (e.g. by radio or in person).

In another embodiment, the coach's console can be provided with a pointing means, such as a mouse or joystick, for which control data is transferred from the console to the rifle's integrated display system via the network. This coach's mouse or joystick then controls an additional dot or pointer in the display of the scope of each shooter, which allows the coach to visually show the shooter which target to use, which range marker bar to use, and where to position the reticle relative to the target. In one embodiment, each shooter can be provided with his or her own coach's dot so that the coach may provide individualized instruction to each shooter.

Fire Coordination. In another embodiment, the active display can be used in the coordination and implementation of a multi-shooter fire team. In one embodiment, the commander of the team operates a coach's console and uses the coach's dots to assist in assigning targets to each shooter, communicating changes in reticle placement, etc.

Snapshots for Remote Review and Approval. In another embodiment, the active display and network processes can allow the shooter, provided with a control means, to take a "snapshot" of his or her reticle view. This snapshot of the user's reticle view can include an image of a target of question. When the image is received by the commander or coach, the commander or coach review the image and approve or disapprove taking the shot. For example, in a coaching scenario, the user may take a snapshot of an animal he or she believes is a legal animal (age, species, gender, etc.) to take. If the coach agrees, the coach can so indicate by positioning or moving the coach's dot in the shooter's reticle.

Biometric Classification of Target. In another embodiment, the snapshot of the reticle image is received by a biometric recognition and/or classification process, such as a facial recognition system. The biometric recognition and/or classification process may be onboard the gun, such as being integrated into the display control logic, or may be remote to the gun interconnected via the network. The results of the recognition and/or classification process may be provided in the reticle by transmitting the results via the network to the control logic, and updating the display appropriately.

Side-by-Side Image Display. In another embodiment, an image is downloaded to the integrated display system via the network, and is displayed coincidentally in the reticle with the viewed images of target. A downloaded image can be used to make a side-by-side comparison by the user of the currently viewed target with a previously-taken image or photo of a target similar to that which the shooter is instructed or desiring to take. For example, during doe season, a new shooter may be provided an image of a deer doe for reference in the reticle, which can be compared in real time to the actual animal being viewed through the scope. In a military or law enforcement application, an image of a sought enemy or fugitive can be displayed in the reticle for real-time comparison by a sniper to face of a person being viewed through the scope.

Representative Examples of Active Displays a. 530-570 nm

In one embodiment, the disclosure relates to an integrated display system that uses a 530-570 nm micro display.

Figure 19:
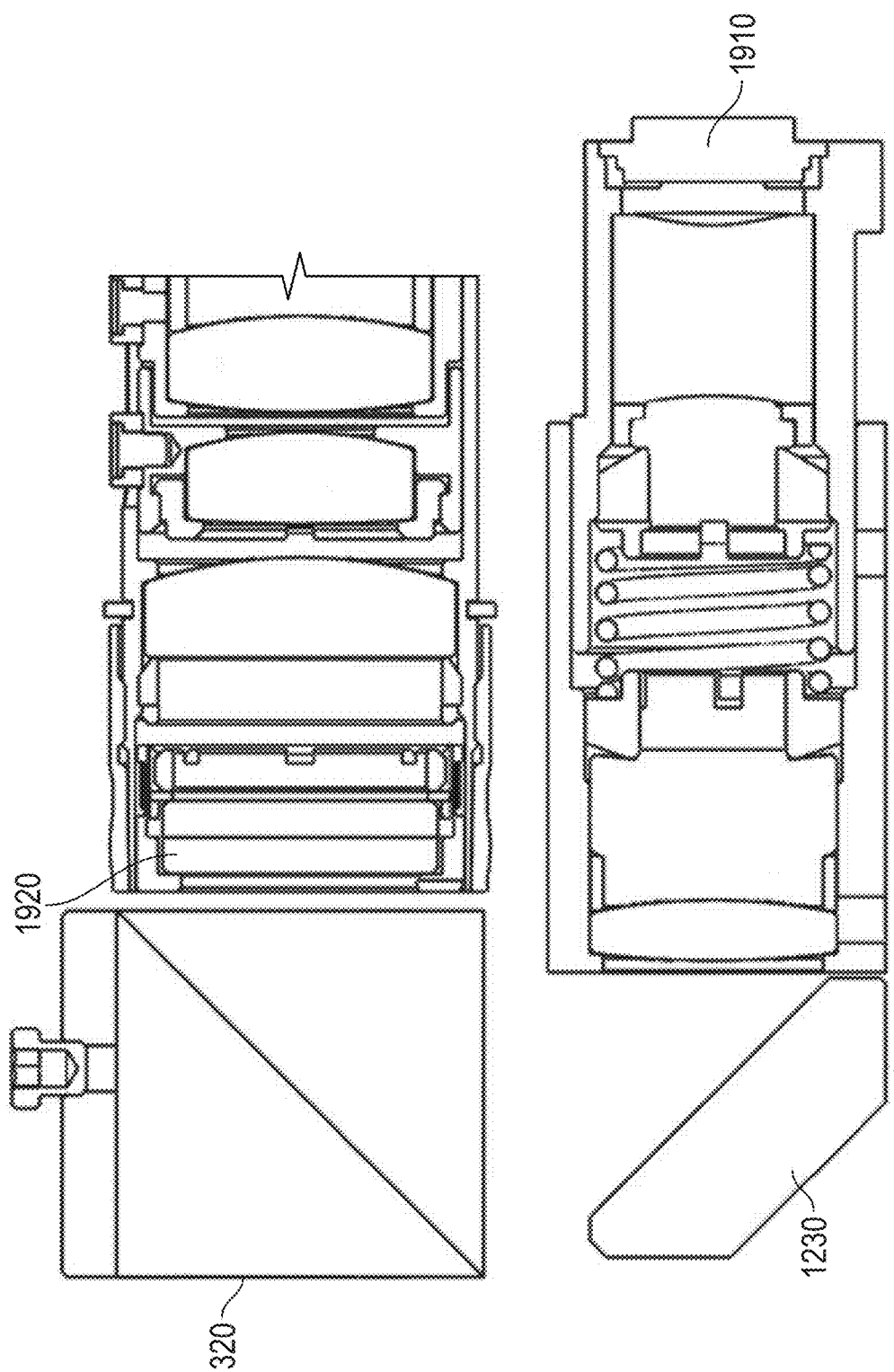
FIG. 19 depicts an integrated display system with a 530 nm-570 nm digital display according to one embodiment of the disclosure.

FIG. 19 depicts an integrated display system with a 530 nm-570 nm digital display 1910.

Figure 20:
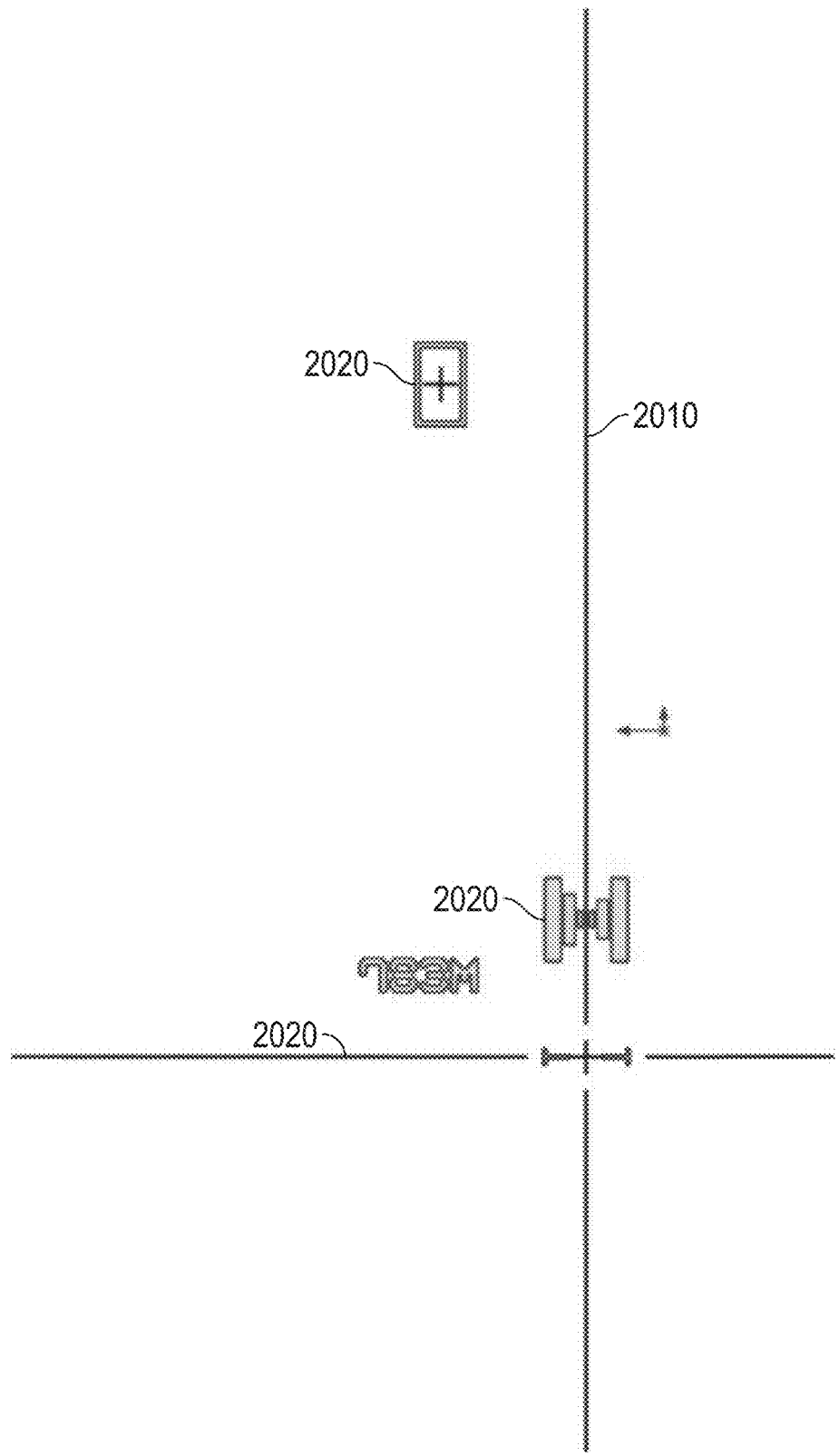
FIG. 20 is a schematic of exemplary images that can be displayed with a 530 nm-570 nm digital display according to one embodiment of the disclosure.

FIG. 20 is a schematic of exemplary images 2020 that can be displayed with a 530 nm-570 nm digital display 1910. As shown in FIG. 20, a glass etched reticle 2010 can be used with the apparatuses and systems disclosed herein. These images are examples only, and should not be construed to limit the amount or type of information that can be displayed with an active display.

In another embodiment, the integration of the 530 nm-570 nm digital display 1910 allows for relatively higher efficacy than any other color display, due to the sensitivity of the human eye. This allows for a smaller amount of power consumption, relative to powering a red or blue display to the same photometric brightness.

In yet another embodiment, the integration of the 530 nm-570 nm digital display 1910 gives the end user greater ability to discern digital overlays from the background created by the ambient light in a day sight.

b. AMOLED

In one embodiment, the disclosure relates to an integrated display system that includes an AMOLED micro display.

Figure 21:
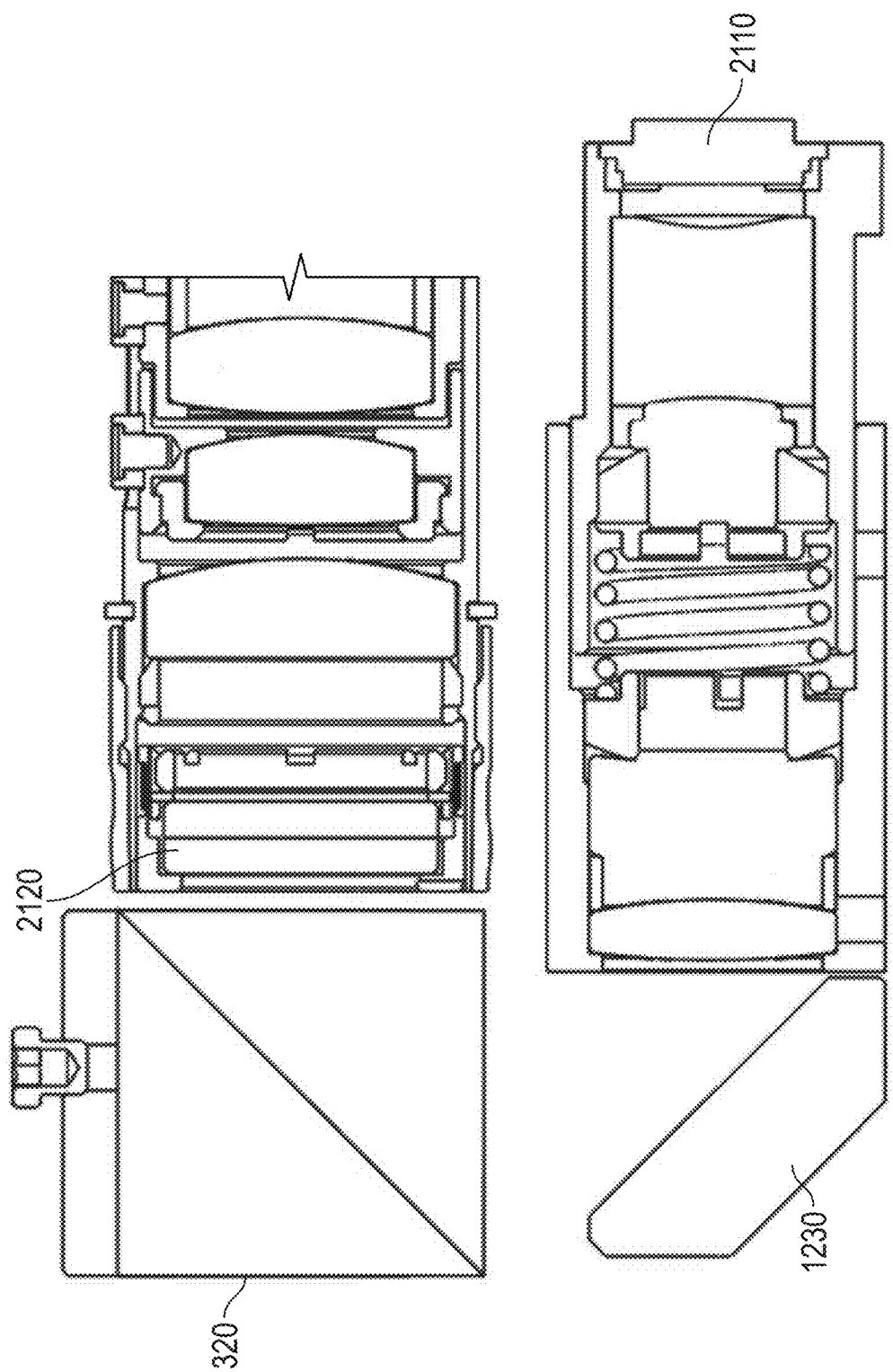
FIG. 21 depicts an integrated display system with an AMOLED digital display according to one embodiment of the disclosure.

FIG. 21 depicts an integrated display system with a AMOLED digital display 2110.

Figure 22:
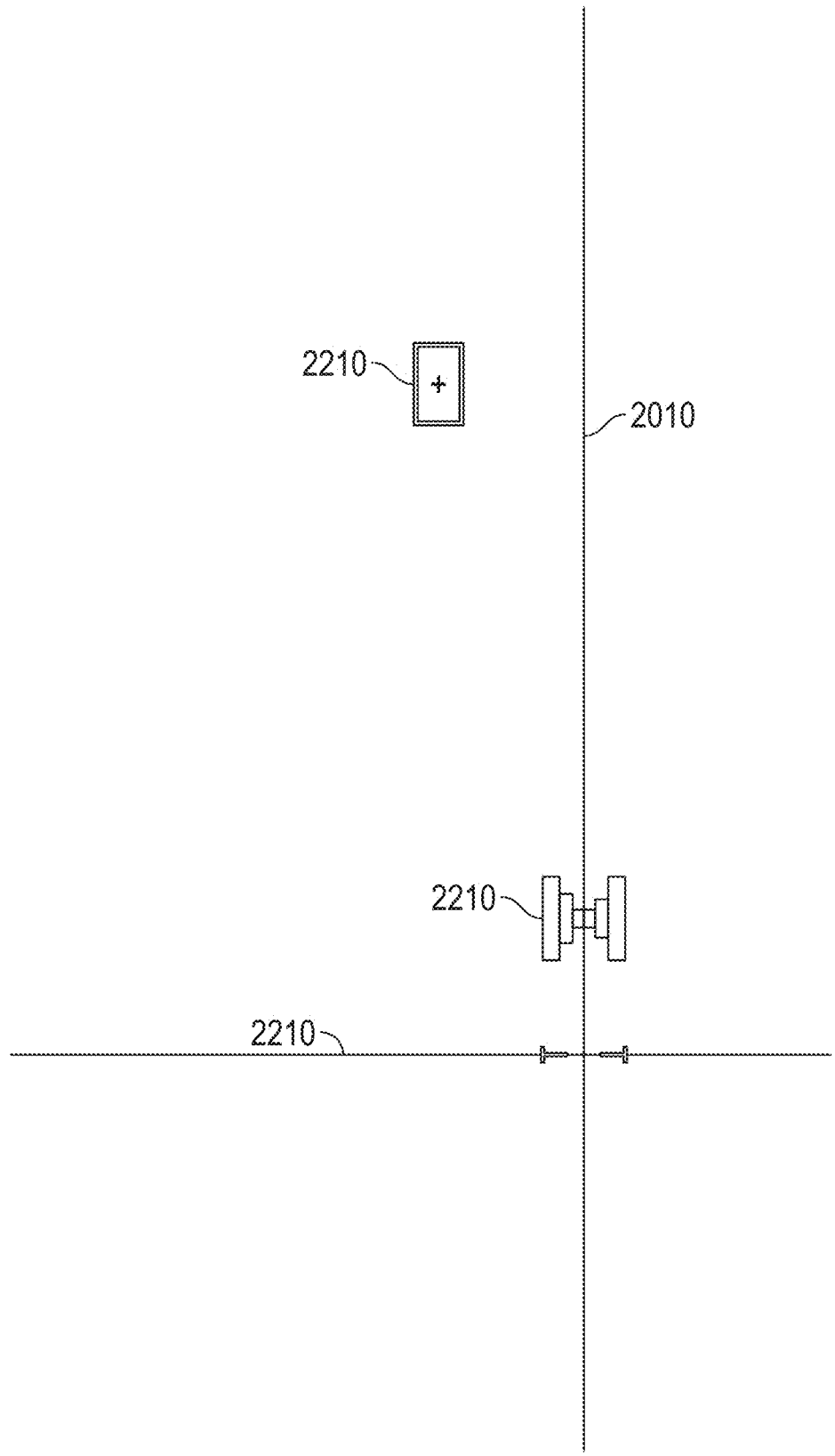
FIG. 22 is a schematic of exemplary images that can be displayed with an AMOLED digital display according to one embodiment of the disclosure.

FIG. 22 is a schematic of exemplary images 2210 that can be displayed with an AMOLED digital display. As shown in FIG. 22, a glass etched reticle 2010 can be used with the apparatuses and systems disclosed herein. These images are examples only, and should not be construed to limit the amount or type of information that can be displayed with an active display.

In one embodiment, the AMOLED 2110 generated image is integrated/imaged/focused in the first focal plane. In one embodiment, the use of an AMOLED display 2110 allows for increased contrast and greater complexity within data displayed into a riflescope.

In one embodiment, the integration of the AMOLED display 2110 allows for the selection of individual pixels to be illuminated, giving the ability for complex data configurations to be displayed with ease in the riflescope.

In another embodiment, the integration of the AMOLED display 2110 allows for a small, lightweight package size inside the riflescope, due to the decreased need for back lighting in the system.

In another embodiment, the integrated display system does not require a backlight display assembly.

In yet another embodiment, the integration of the AMO-LED display 2110 allows for decreased power consumption, as the ability to optimize power usage to individual pixels is now available.

In one embodiment, the integration of the AMOLED display 2110 gives a contrast ratio, which allows for a clean "heads up" style display within the scope. The contrast ratio allows each floating feature to be individually targeted and represented without a low glow around the pixels.

B. Collector Lens System

In one embodiment, integrated display system has an optical system based upon the use of optical lenses as a part of one or more lens cells, which include the lens itself and a lens cell body to which the lens is mounted. In one embodiment, the lens cell includes a precision formed body that is generally cylindrical or disc shaped. This body has a central aperture for mounting the lens in alignment with an optical axis of a larger optical system. The cell body can also be said to have its own alignment axis, which will ultimately be aligned with the optical axis for the larger system when the lens cell is mounted therein. In addition, the lens cell serves as a "holder" for the lens, serves as a mechanism by which the lens can be mounted to and in the larger optical system, and (finally) serves as a means by which the lens can be manipulated by and for the purposes of that system.

In one embodiment, the integrated display system comprises a collector lens system, also referred to as a lens system. In one embodiment, the collector lens system comprises an inner lens cell and an outer lens cell.

Figure 23:
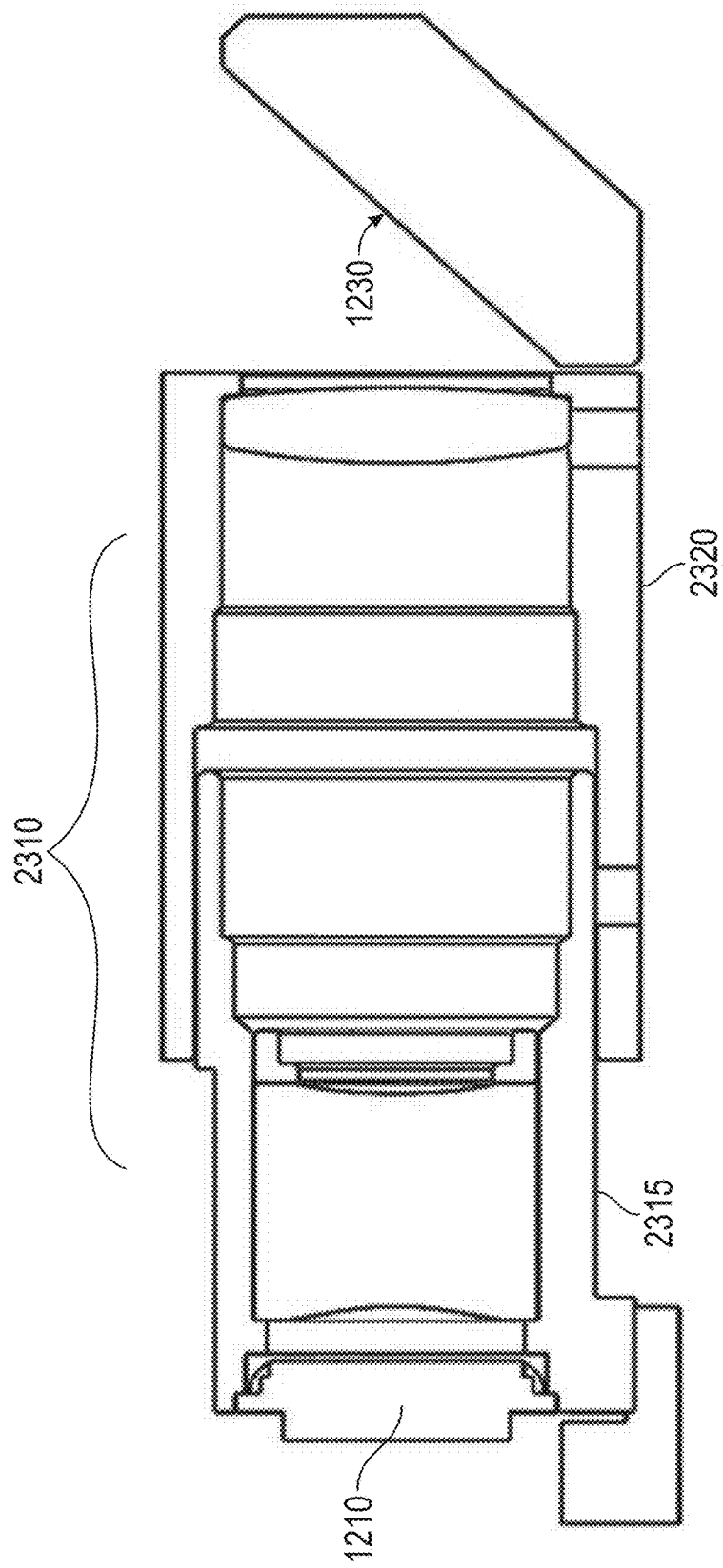
FIG. 23 is a representative schematic of a side cutaway view showing an active display and an optics system having an inner and an outer lens cell according to one embodiment of the disclosure.

FIG. 23 is a representative example of a collector lens system 2310, which has an inner lens cell 2315 and an outer lens cell 2320. In one embodiment, an outer lens cell 2320 contains at least one lens and an inner lens cell 2315 contains at least one lens. In one embodiment, the inner lens cell 2315 rotates on the inside surface of the outer lens cell 2320. As shown in FIG. 23, an active display 1210 is coupled to a flat machined surface at the back of the inner lens cell 2315. In one embodiment, the active display 1210 can be directly coupled to the inner lens cell 2315. In yet another embodiment, the active display 1210 can be indirectly coupled to the inner lens cell 2315.

One advantage of the collector optics system disclosed herein is that the inner lens cell being combined with the micro display mount provides a solid rotational mechanical axis to position the vertical axis of the micro display.

Figure 24:
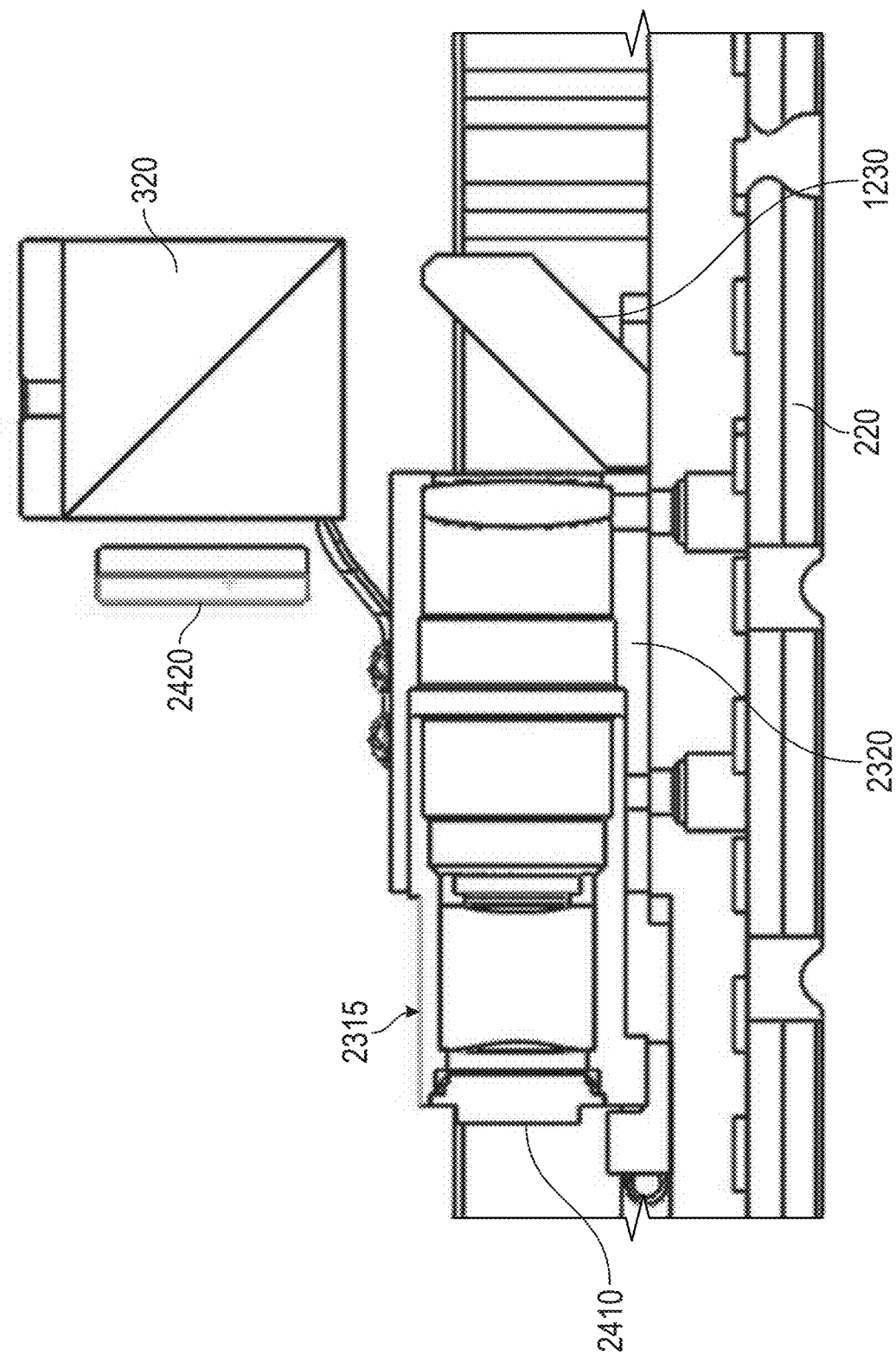
FIG. 24 is a side cutaway view of an integrated display system with a collector optics system installed into a viewing optic according to one embodiment of the disclosure.

FIG. 24 is a representative depiction of a base 220 that couples to a main body of a viewing optic, wherein the base has a collector optics system 2310 as part of an integrated display system. In FIG. 24, the main body is depicted by the beam combiner 320 and the viewing optic reticle 2420.

The outer lens cell 2320 is fixed in place in relation to the viewing optic system in the main body while the inner lens cell 2315 is allowed to rotationally float inside of the outer lens cell 2320. By placing pressure against a surface 2410 of the inner lens cell 2315 that is located below the axis of rotation of the lens cell, the vertical axis of an active display 1210 can be aligned with the vertical axis of the reticle 1610 of the viewing optic system.

Figure 25:
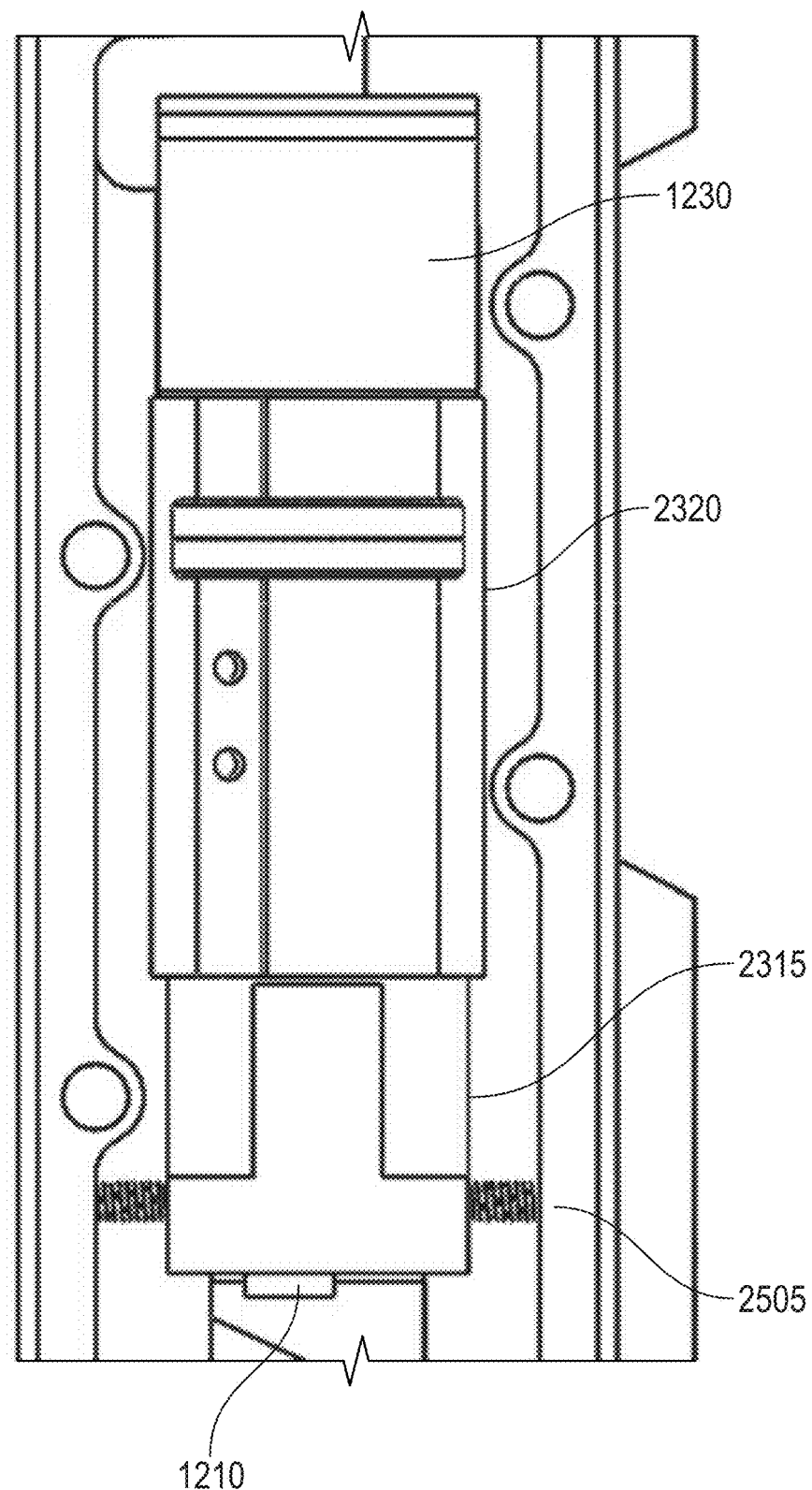
FIG. 25 is a representative schematic of a top view of an integrated display system with an active display, a collector optics system having an inner cell, and an outer cell, a mirror and a screw for adjusting tilt of a active display according to one embodiment of the disclosure.

FIG. 25 is a representative depiction of one embodiment for aligning the tilt of the vertical axis of the active display with the vertical axis of the reticle. As shown in FIG. 25, opposing set screws 2505 can be tightened against a surface of the inner lens cell 2315 that is located below the axis of rotation of the lens cell. The set screws 2505 can be used to align the vertical axis of the micro display 1210 with the vertical axis of a reticle in the optical system in a main body of a viewing optic. The rotation of the inner lens cell 2315 can be retained by tightening set screws 2505 securely against the lower surface of the inner lens cell 2315, thereby, rotationally locking the vertical axis of the micro display 1210 in place.

Figure 26:
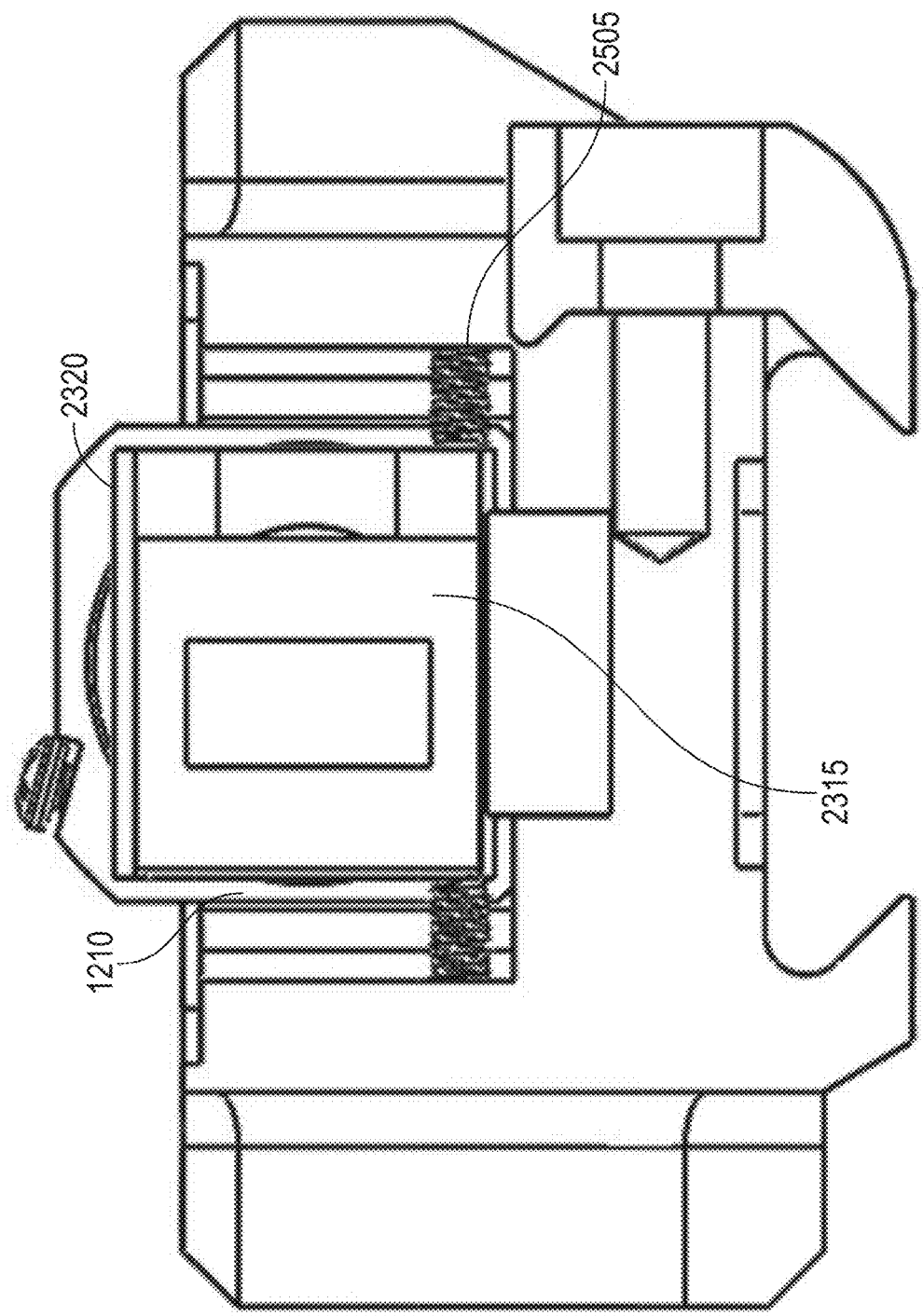
FIG. 26 is a representative schematic of a rear cutaway view of an integrated display system with an active display, a collector optics system having an inner cell, and an outer cell, a mirror and a screw for adjusting tilt of a active display according to one embodiment of the disclosure.

FIG. 26 is a representative depiction of a rear cut-away view of the collector lens system 2300 with a micro display 1210 or active display tilt adjustment mechanism. When a micro display is injected into the optical system of a viewing optic through the use of beam combiners or wave guides, an additional method of compensation is needed in order to eliminate tilt error between the reticle's vertical axis and the injected image of the micro display's vertical axis. Set screws 2505 can be tightened against a surface of the inner lens cell 2315 that is located below the axis of rotation of the lens cell, thereby aligning the vertical axis of the micro display 1210 with the vertical axis of a reticle in the optical system in a main body of a viewing optic.

Figure 27:
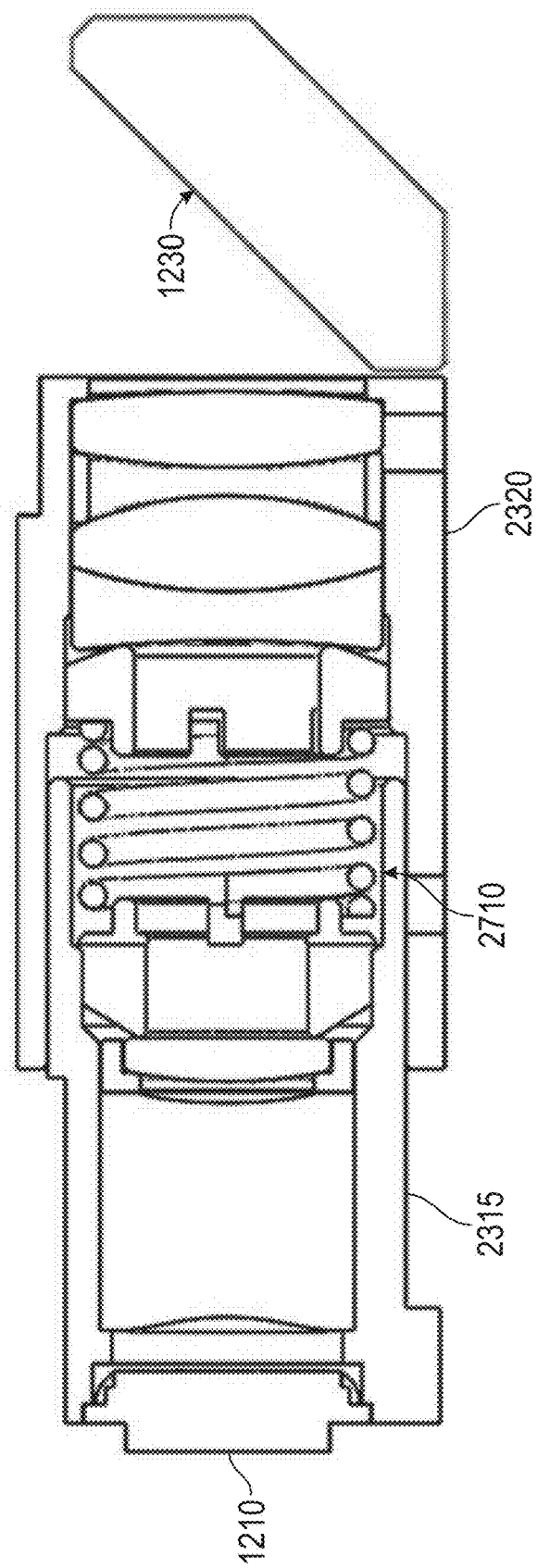
FIG. 27 is a representative depiction of a side cutaway view showing a micro display, inner and outer lens cells, and a spring located between the inner and outer cells according to one embodiment of the disclosure.

FIG. 27 is a representative depiction of a method and apparatus for eliminating parallax between a micro display and the reticle in an optical system in the main body of a viewing optic. An outer lens cell 2320 contains at least one lens on the right hand side of FIG. 27 and an inner lens cell 2315 contains at least one lens on the left hand side of FIG. 27. The inner lens cell 2315 slides along the optical axis on the inside surface of the outer lens cell 2320. A micro display 1210 is coupled to the inner lens cell 2315. A spring 2710 is installed between the outer lens cell 2320 and the inner lens cell 2315 to cause the cells to separate when not under a compression force.

Figure 28:
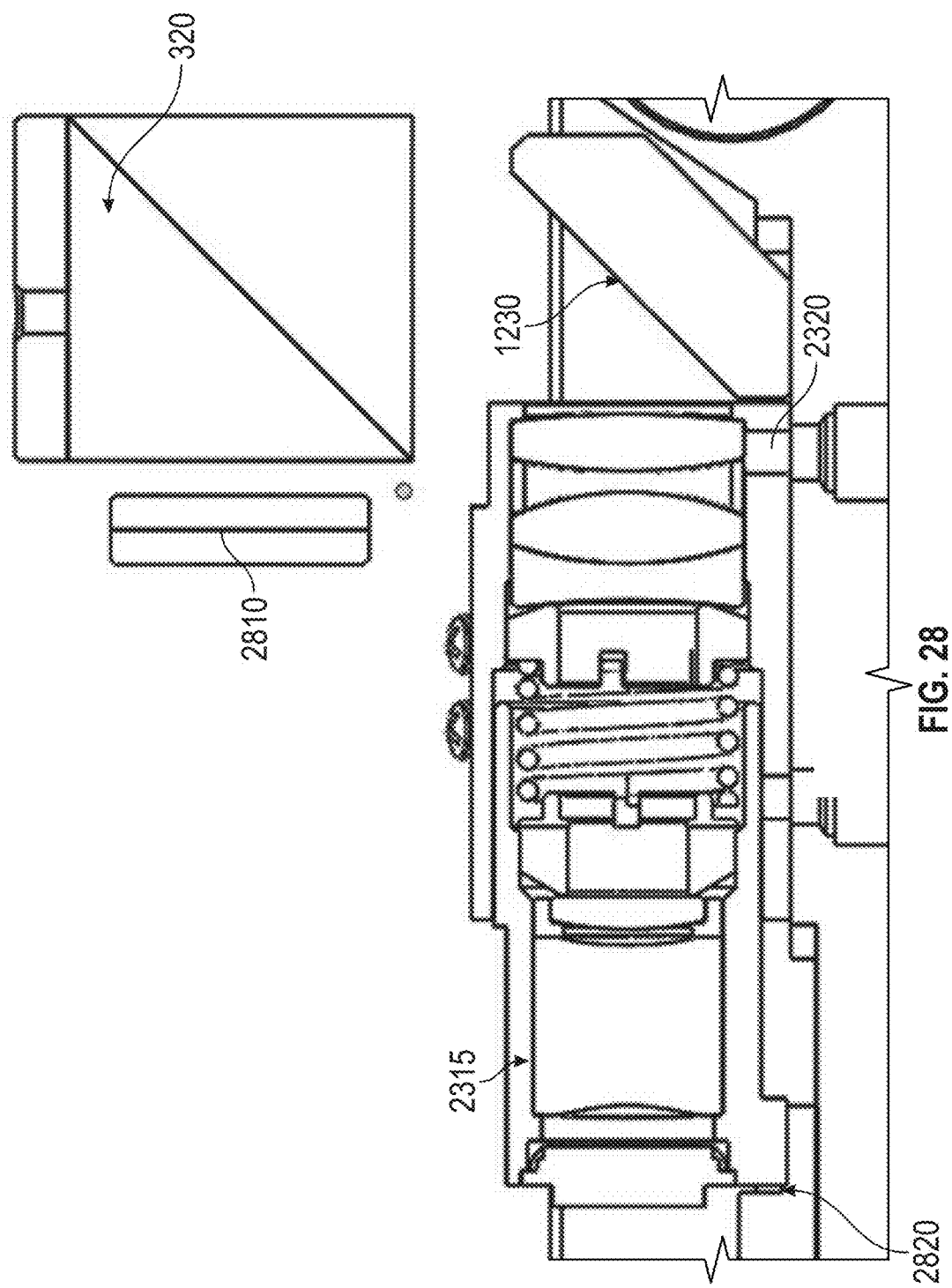
FIG. 28 is a representative depiction of an integrated display system showing a surface that can be used to adjust position of inner lens cell and eliminate parallax error according to one embodiment of the disclosure.

FIG. 28 is a representative depiction of a base, which has the collector optics system 2300, coupled to a main body of a viewing optic. In FIG. 28, the main body is depicted by the beam combiner 320 and the viewing optical reticle 2810.

The outer lens cell 2320 is fixed in place in relation to the viewing optic and the inner lens cell 2315 is allowed to float inside of the outer lens cell 2320. By forcing the inner lens cell 2315 forward by use of a screw or a wedge 2810 that places force on the back of the inner lens cell/active display mount, the axial position of the image is changed so that the focal plane of the micro display image lies on the same plane as the viewing optic reticle in the main body of the viewing optic. Thus, parallax between the micro display and the reticle is eliminated.

The position of the inner lens cell is kept in place through the action of the spring pressing outwards against the screw or wedge. Parallax between the active display and the reticle can be eliminated without changing the amount of light that is collected from the active display and without degrading the image quality of the system.

By implementing the use of the spring between the inner and outer lens cell and the force on the back of the inner lens cell/micro display, the maximum amount of light can be collected from the micro display and provides a rapid, simple, and accurate method of adjustment.

In one embodiment, the lens system can comprise two or more lenses. In yet another embodiment, the lens system can comprise 3, 4, 5, 6, 7, 8, 9, 10 or greater than 10 lenses. Lens can be obtained from a variety of commercial manufacturers including but not limited to LaCroix Optics (www.lacroix-optics.com) and Diverse Optics (www.diverseoptics.com).

In one embodiment, the lens system is made of a five (5) lens system. In one embodiment, the five lens system is comprised of 5 singlets. In another embodiment, the five lens system is comprised of two doublets and a singlet. In yet another embodiment, the five lens system is comprised of 3 singlets and 1 doublet. In one embodiment, at least one plastic aspheric is used as a first element.

In one embodiment, the lens system is a five lens system with the following order: an aspheric singlet closest to the active display, followed by a singlet lens, followed by a doublet lens, followed by the final singlet lens.

In one embodiment, the lens system is a five lens system having the following configuration: lens 1 closes to the active display is 11 mm in diameter and 9.3 mm thick; lens 2 is 9 mm in diameter and 1.9 mm thick, the doublet has one lens (lens 3) that is 13.5 mm in diameter and 2.1 mm thick, and another lens (lens 4) that is 13.5 mm in diameter and 4.1 mm thick, and lens 5 that is 13.5 mm in diameter and 3.3 mm thick.

In one embodiment, the air space between one lens to the next lens ranges from about 1 mm to about 20 mm. In one embodiment, the air space between one lens to a subsequent lens ranges from about 5 mm to about 20 mm. In one embodiment, the air space between one lens to a subsequent lens ranges from about 10 mm to about 20 mm.

In one embodiment, the distance between the active display and the first lens is minimized in order to collect the maximum amount of light from the display. In one embodiment, the distance between the active display and the first lens is less than 2 mm. In another embodiment, the distance between the active display and the first lens is selected from the group consisting of: less than 1.8 mm, less than 1.5 mm, less than 1.3 mm, less than 1.1 mm, less than 0.9 mm, less than 0.7 mm, less than 0.5 mm, and less than 0.3 mm.

In one embodiment, a five lens system is housed in an inner cell and an outer cell. In one embodiment, the inner cell is constructed by installing an asphere into the inner lens cell from the opposite end of where the display seat is; followed by a spacer; followed by lens 2, which can be a 9 mm singlet; followed by a lock ring, which holds both lenses in place.

In one embodiment, the outer lens cell is constructed by inserting lens 5, which can be the 13.5 mm singlet into the outer lens cell from the display end of the cell; followed by a spacer; followed by the doublet, which can be lens 3 and 4, followed by a lock ring.

In one embodiment, the spacing between lens 2 in the inner cell and lens 3 in the outer cell is changed when the inner lens cell moves axially along the inner diameter of the outer lens cell. This causes the focal plane of the image of the display to shift and is used to null out parallax between the projected display image and the passive reticle in the main body of the viewing optic.

In one embodiment, the focusing of the display image onto the first focal plane of the optic system in the main body is accomplished by changing the air spacing between lens 2 and lens 3, of a 5-lens system, which is accomplished by varying the position of the inner lens cell with respect to the outer lens cell.

In one embodiment, lens assemblies may also be assembled together within a lens barrel, which is an integral mechanical structure holding a series of lenses. It is used to position the lenses axially and radially with respect to each other, and to provide a means of interfacing the lens assembly with the system of which it is a part. Lens elements are radially positioned by the inside diameter or ID of the barrel wall. The outside diameter or OD of the lens elements are ground to fit ID of the barrel wall. The axial position of the lens elements is accomplished by cutting lens seats during assembly. The lens elements can then be constrained on the seats by epoxy, retaining rings, etc.

C. Reflective Material

In one embodiment, the integrated display system comprises a reflective material 1230. In one embodiment, the reflective material 1230 is a mirror. In one embodiment, the integrated display system comprises one or more mirrors. In one embodiment, the integrated display system comprises two, three, four or more mirrors.

In one embodiment, the mirror is positioned at an angle from 30° to 60°, or from 30° to 55°, 30° to 50°, or from 30° to 45°, or from 30° to 40°, or from 30° to 35° relative to the emitted light of the display.

In one embodiment, the mirror is positioned at an angle from 30° to 60°, or from 35° to 60°, 40° to 60°, or from 45° to 60°, or from 50° to 60°, or from 55° to 60° relative to the emitted light of the display.

In one embodiment, the mirror is positioned at an angle of at least 40°. In one embodiment, the mirror is positioned at an angle of 45° relative to the emitted light of the display.

Figure 29:
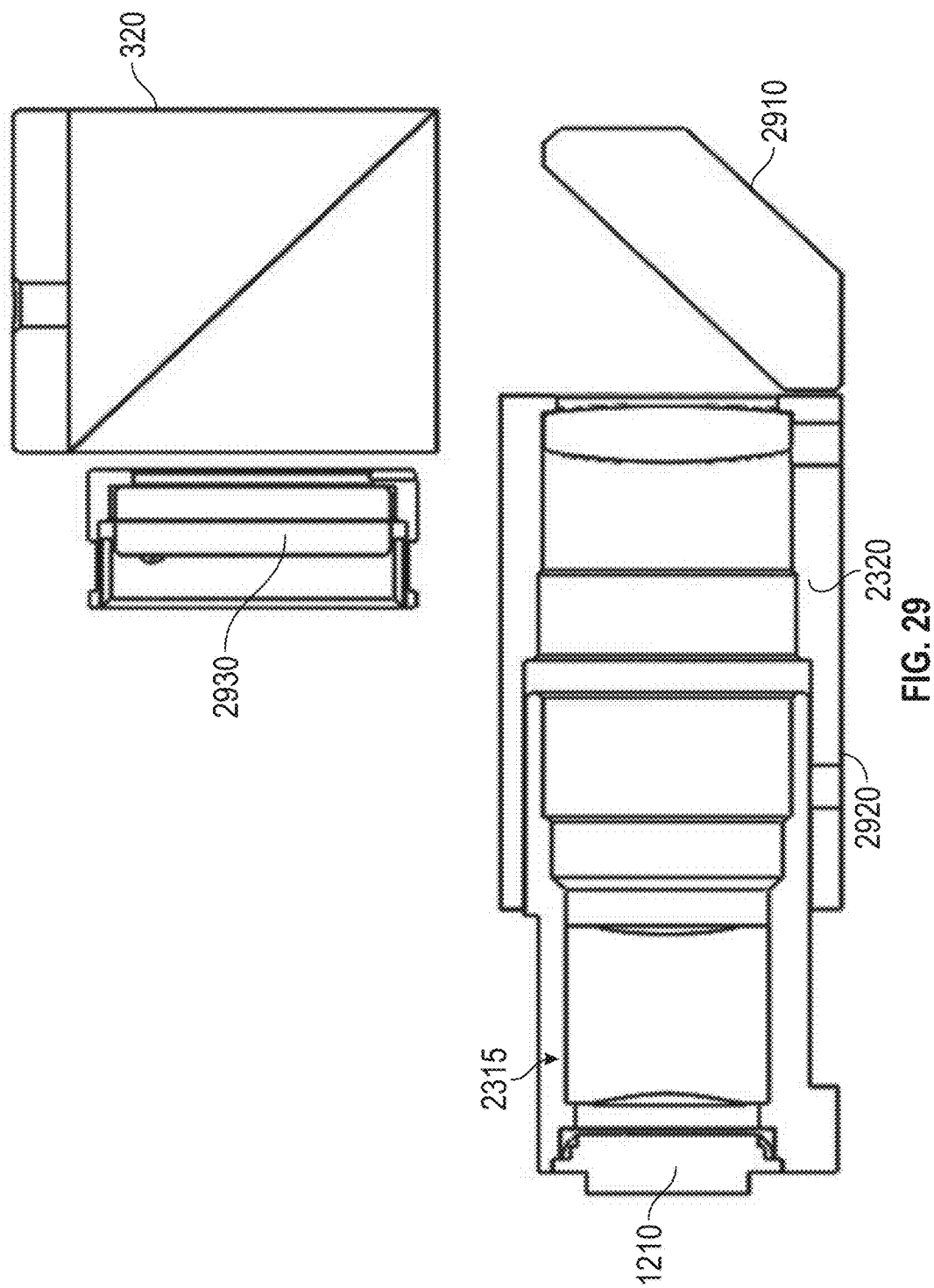
FIG. 29 is a representative depiction of a side cutaway view of an integrated display system with a microdisplay, optics system, and a mirror with tilt adjustment capabilities installed into a viewing optic according to one embodiment of the disclosure.

In one embodiment, and as shown in FIG. 29, the tilt of a mirror 2910 along the vertical axis is able to be adjusted by use of a screw or similar mechanism. By turning a screw in against the base or rear of the mirror 2910, the angle at which the image of the micro display is reflected into the beam combiner can be changed. This correspondingly changes the tilt of the focal plane at the viewing optic's reticle 2930 of the optical system in the main body of a viewing optic. Using this adjustment, parallax error can be eliminated between the micro display and the reticle along the vertical axis.

In one embodiment, the mirror is fastened to the base with one or more screws. In one embodiment, the mirror is fastened to the base using a chemical compound such as an epoxy, a resin, or a glue or combinations thereof.

In one embodiment, the position of the mirror can be adjusted in relation to the beam combiner to eliminate any errors, including but not limited to parallax error.

In one embodiment, the position of the mirror can be adjusted in relation to the active display to eliminate any errors, including but not limited to parallax error.

2. Power System

In one embodiment, the base that couples to the main body of the viewing optic has a power system. In another embodiment, the base of a viewing optic has a cavity. A battery cavity can be integrated into the base that couples to the main body of a viewing optic.

Figure 30:
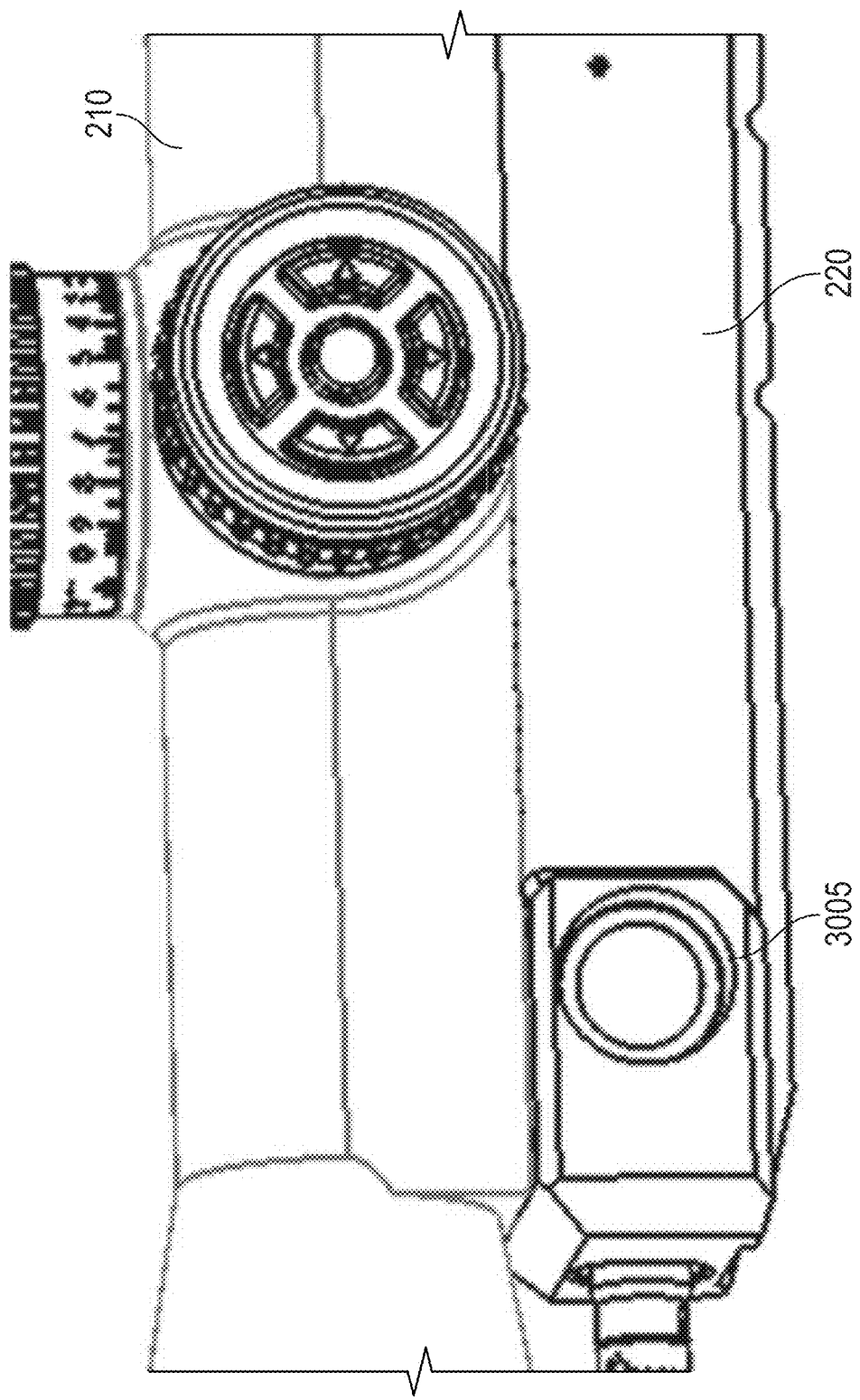
FIG. 30 is a representative schematic of a left side view of a battery compartment in a base that can couple to a main body of a riflescope according to one embodiment of the disclosure.
Figure 31:
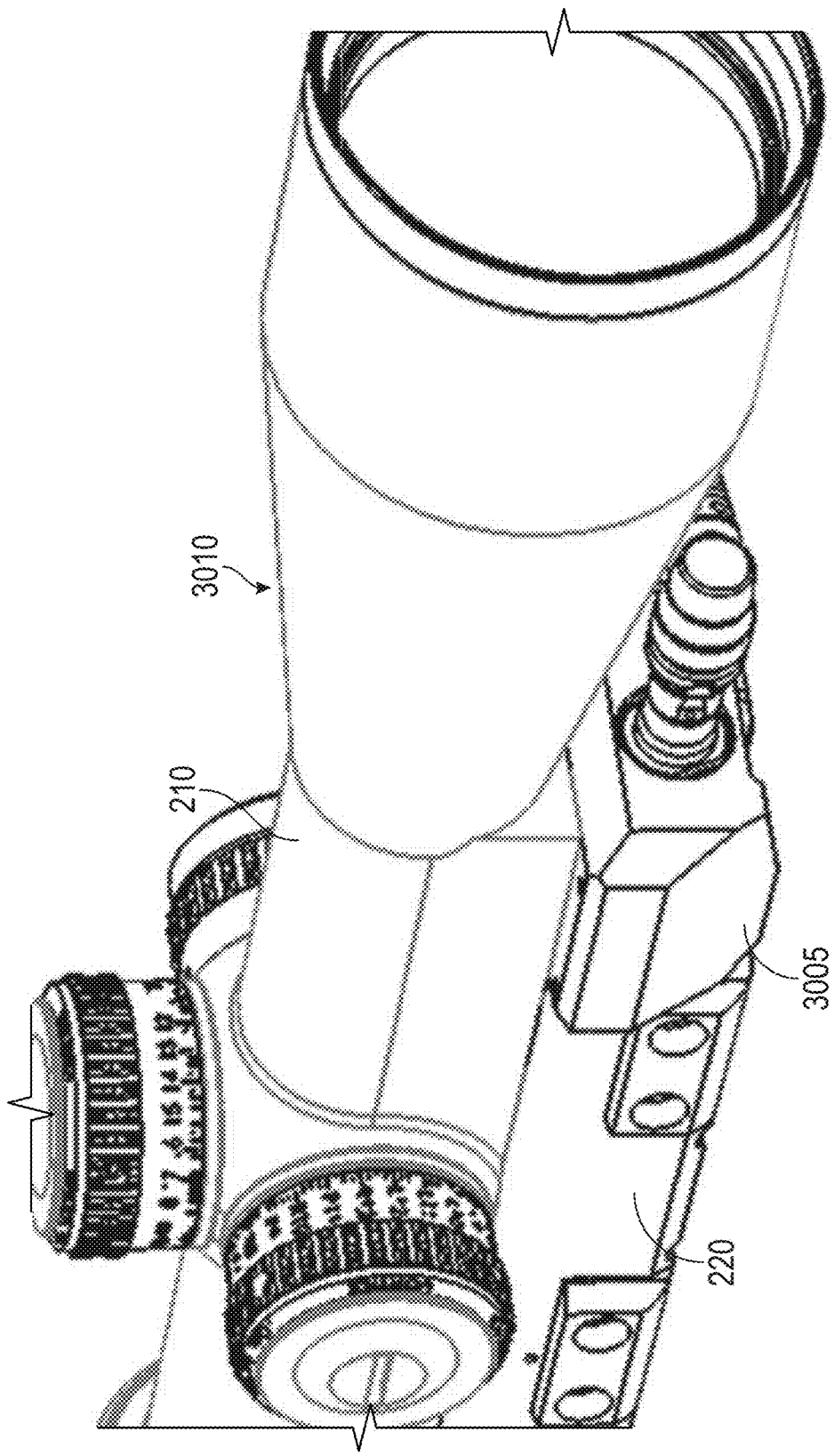
FIG. 31 is a representative schematic of a right side view of an integrated battery compartment in a base that can couple to a main body of a riflescope according to one embodiment of the disclosure.

FIG. 30 is a representative schematic of a base 220 with a battery compartment 3005, wherein the base 220 is coupled to the main body 210 of a riflescope 3000. As shown in FIGS. 30 and 31, the battery cavity 3005 extends from each side of the base to encase a battery, including but not limited to a CR123 battery. The CR123 battery has increased power capacity and discharge as compared to smaller batteries or coin style batteries.

In one embodiment, the battery cavity 3005 is integral to the base 220 so that only the battery cap is needed to protect the battery from the environment. No additional sealing is required.

In one embodiment, the battery cavity 3005 in the base 220 is located closer to the objective assembly 3010 of the main body 210 of a viewing optic as compared to the ocular assembly.

Figure 32:
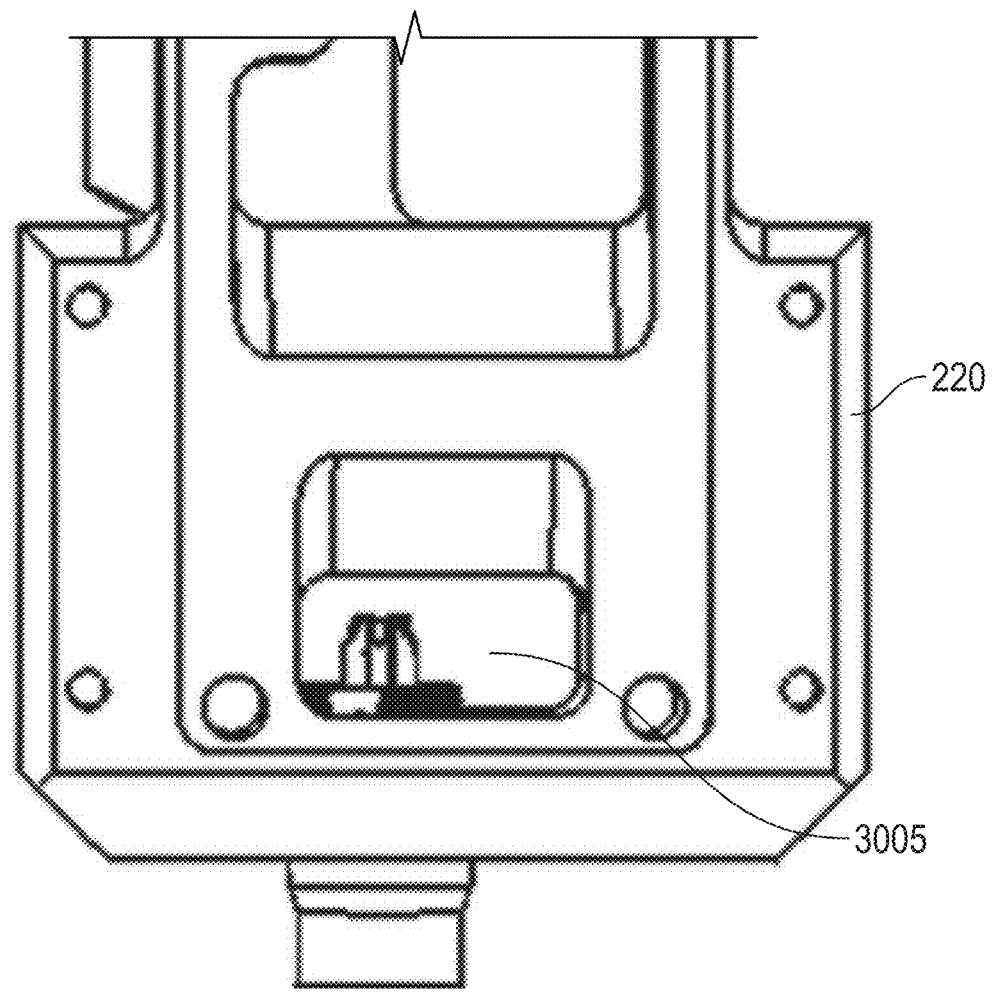
FIG. 32 is a representative schematic of a top view of an integrated battery compartment in base that can couple to a main body of a riflescope according to one embodiment of the disclosure.

FIG. 32 is a representative depiction of the battery compartment 3005 integrated into the base 220. In one embodiment, the cavity 3005 is designed to have the positive side of the battery inserted first with a mechanical stop at the bottom of the battery cavity to prevent improper installation and operation of the battery.

In one embodiment, the integrated battery cavity 3005 can use the same gasket as the base 220 uses to the main body 210 of the riflescope. This provides a more reliable seal and eliminates a mechanical device as a separate battery cavity is not required. Secondly, there is no mechanical device securing the battery cavity since it is integrated into the base. This reduces the need for any mechanical interface for securing the battery compartment. Because there is no need for mechanical locking of the battery cavity, the integrated battery compartment reduces the points of failure for a traditional battery compartment.

The integrated battery compartment eliminates any obstacles that are in the way of the user. The integrated battery compartment is located under the viewing optic out of the way of any of the adjustments and knobs found on traditional viewing optics. The integrated battery cavity is a significant advancement as it allows the necessary space to accommodate a larger battery.

In one embodiment, the viewing optic can be set-up in a manner to minimize battery drain and to maximize battery life. For example, the viewing optic with a laser rangefinder is activated when an operator presses a button or switch. A range finder designator is displayed on the screen. An external range finder's output laser will coincide with the designator through an initial calibration step when zeroing the viewing optic. When the external rangefinder is activated by the operator, information is sent to the viewing optic wirelessly or via the communication port signaling the device that information has been received and needs to be displayed.

If the viewing optic is turned on and no data is received from an external device, the viewing optic will power down after a user set time. After displaying received information from an external device, the power down timer is started and will power down the device if no further button presses are registered.

If more information is received from an external device, the screen will be cleared of the prior information and the updated information will be displayed and the power down timer will be started. This cycle can continue as many times as the operator chooses.

During the time when information is displayed on the screen, a cant indicator is displayed on the screen. This is refreshed from an accelerometer communicating with the microcontroller on a time interval. When the microcontroller is in sleep mode, the integral buttons on the viewing optic will control the brightness of LEDS illuminating a glass etched reticle. When the viewing optic is operating, control of these LEDS becomes suspended and the brightness of the screen will be altered during the corresponding buttons presses.

3. Picatinny Mount

In one embodiment, the disclosure relates to a viewing optic having a main body and a base with a battery compartment and a picatinny mount that can couple to the battery compartment. In one embodiment, a removable picatinny mount is attached to a protruded battery compartment that is incorporated into a base coupled to a main body of a riflescope.

Figure 33:
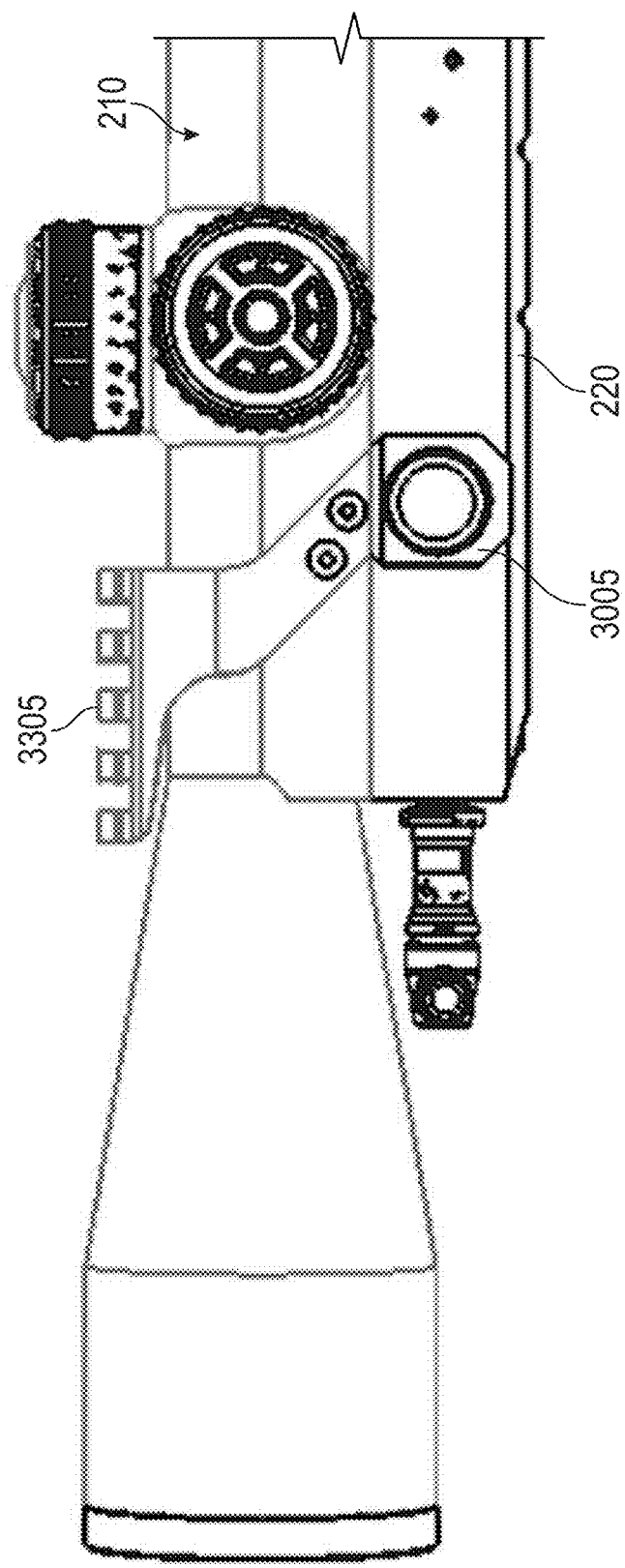
FIG. 33 is a representative schematic of a side view of a base with a battery compartment that can be used to couple to a picatinny mount according to one embodiment of the disclosure.
Figure 34:
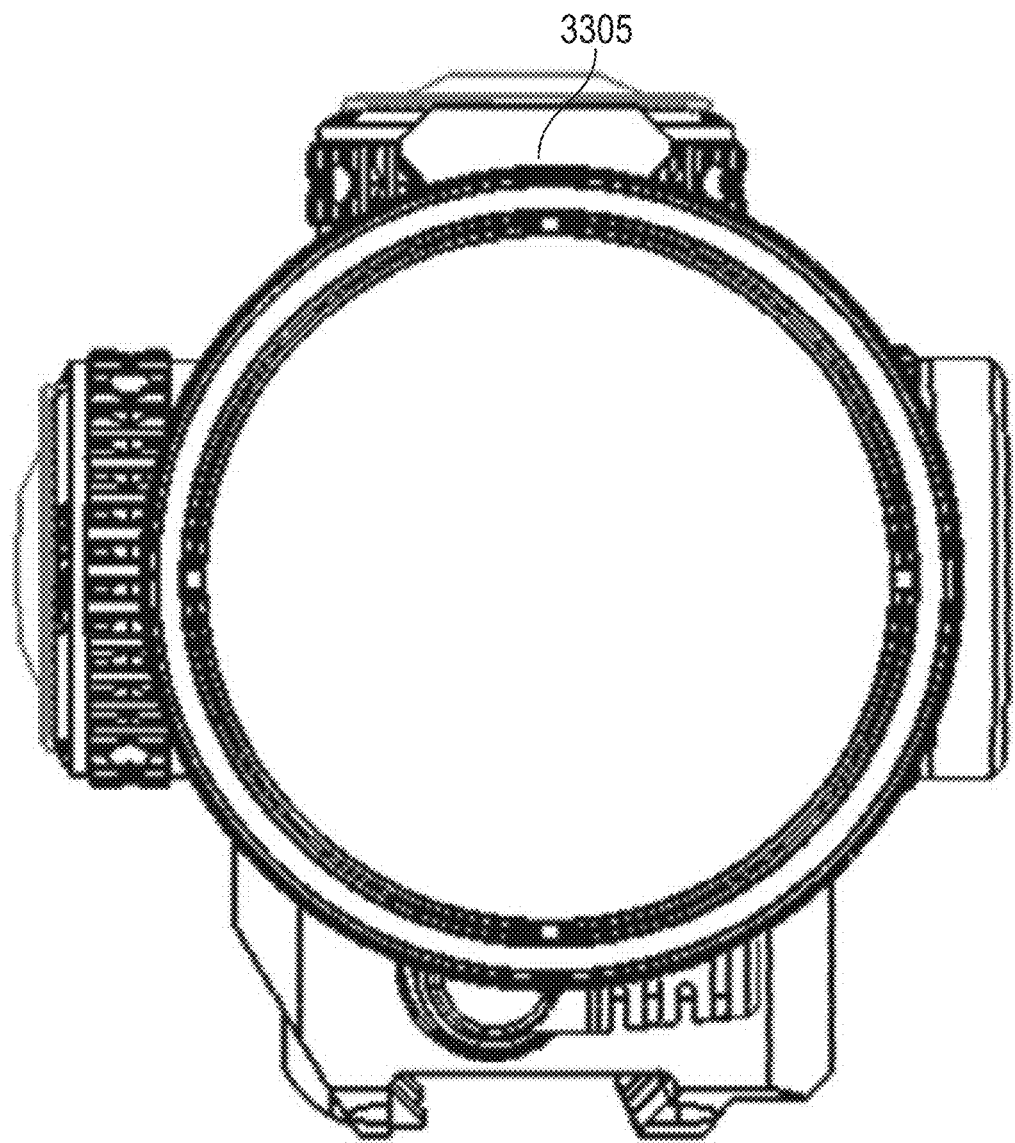
FIG. 34 is a representative schematic of a front view of cantilevered picatinny mount coupled to a battery compartment of a base according to one embodiment of the disclosure.
Figure 35:
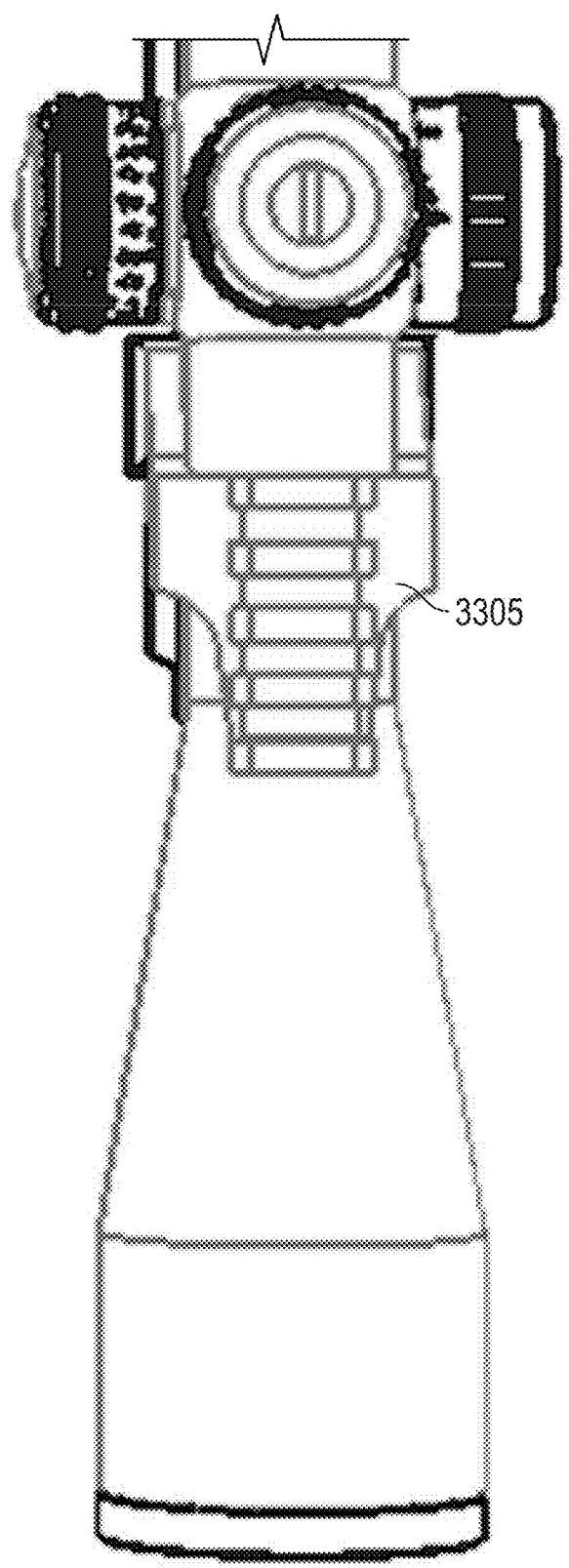
FIG. 35 is a representative schematic of a top view of cantilevered picatinny mount coupled to a battery compartment of a base according to one embodiment of the disclosure.

FIGS. 33-35 are representative schematics of a riflescope with a main body 210 and a base 220 coupled to the main body 210, with the base having a battery compartment 3005 that can attach to a picatinny mount 3305. In one embodiment, the picatinny mount 3305 is aligned with the battery compartment 3005 and secured with fasteners.

By attaching the mount 3305 to the battery compartment 3005 of the base 220, it utilizes the material needed to make the cavity 3005 for the battery. This eliminates the need for any additional material from the base, thereby making the viewing optic lighter and less invasive.

In one embodiment, the mount is located towards the objective of the turrets and parallax knob so as to not intrude on the user's ability to adjust the riflescope. Further, the top ring is removable allowing for easy attachment of an accessory device, such as a laser rangefinder. By utilizing the picatinny mount disclosed herein, no additional structural support from the top portion of the ring is needed since the integrated base secures the riflescope.

In one embodiment, the mount incorporates a cantilevered picatinny rail that extends forward towards the objective of the riflescope. This allows a weapons mounted laser range finder to sit directly over the bell of the riflescope. This style of mount allows for decreased shift of impact and increased accuracy of the ranging device. It decreases the potential for shift of impact since there are fewer variables that may affect the ranging device from acquiring the desired target.

4. Data Ports

In one embodiment, the disclosure relates to a viewing optic with a main body and a base with an active micro display for generating an image and combining the generated image into the image of the scene in the First Focal Plane of the main body of the viewing optic, wherein he base has axially orientated data ports for interfacing with ancillary devices including but not limited to remote control switches and laser range-finders.

Figure 36:
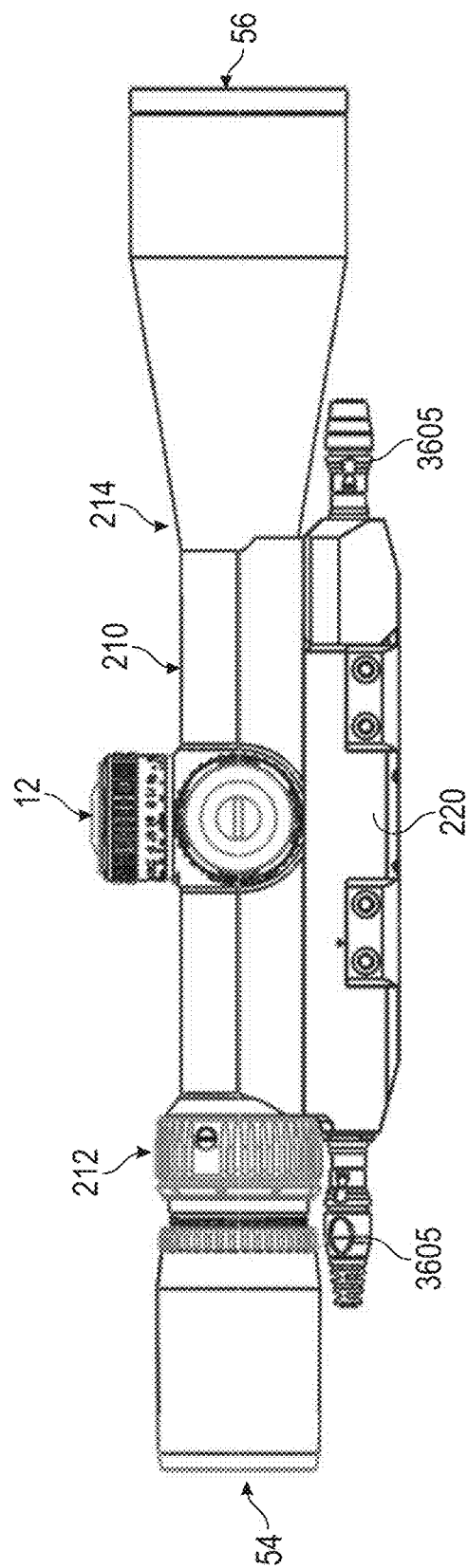
FIG. 36 is a representative schematic of a side profile view of the riflescope with a main body and a base having axially orientated data/communication connections according to one embodiment of the disclosure.

FIG. 36 is a representative schematic of a riflescope 3600 with a main body 210 and a base 220 with axially oriented data ports 3605. In one embodiment, the viewing optic can have one axially oriented data port. In another embodiment, the viewing optic can have two or more axially oriented data ports.

By utilizing an axially oriented data port 3605, the top down profile of the overall viewing optic is minimized, thereby increasing the robustness of the mounted system and its connections.

5. External Video Sources

In one embodiment, the active display in the base can be used as the optical train or optical system of a clip on device, including but not limited to a thermal imaging system and a night vision system.

Thermal imaging systems allow for various waves of the electromagnetic spectrum to be imaged and relayed to the user, which typically cannot be captured by the human eye. Traditional thermal weapon sights are composed of two systems paired together: an infrared optical system, which views the scene and a visible wavelength optical system consisting of a micro display and lenses to recreate the image in front of the riflescope. There are also instances of catalytic photon enhancement, creating what us known as "night vision" systems. However, clip-on devices are typically attached to the rifle rail in front of the main body of the riflescope. This setup blocks all of the ambient light typically imaged by the scope, and allows for use of the digital image only. In order to switch back to the traditional image, the user must remove the system from the rail. This can cause an impact shift due to the alignment setup that you go through each time the sight is changed. These clip-on units also tend to be large, due to the need for an eyepiece/imaging system behind the digital display in the units. In traditional systems, any live video feed would be a completely digital image, including the visible spectrum output.

Figure 37:
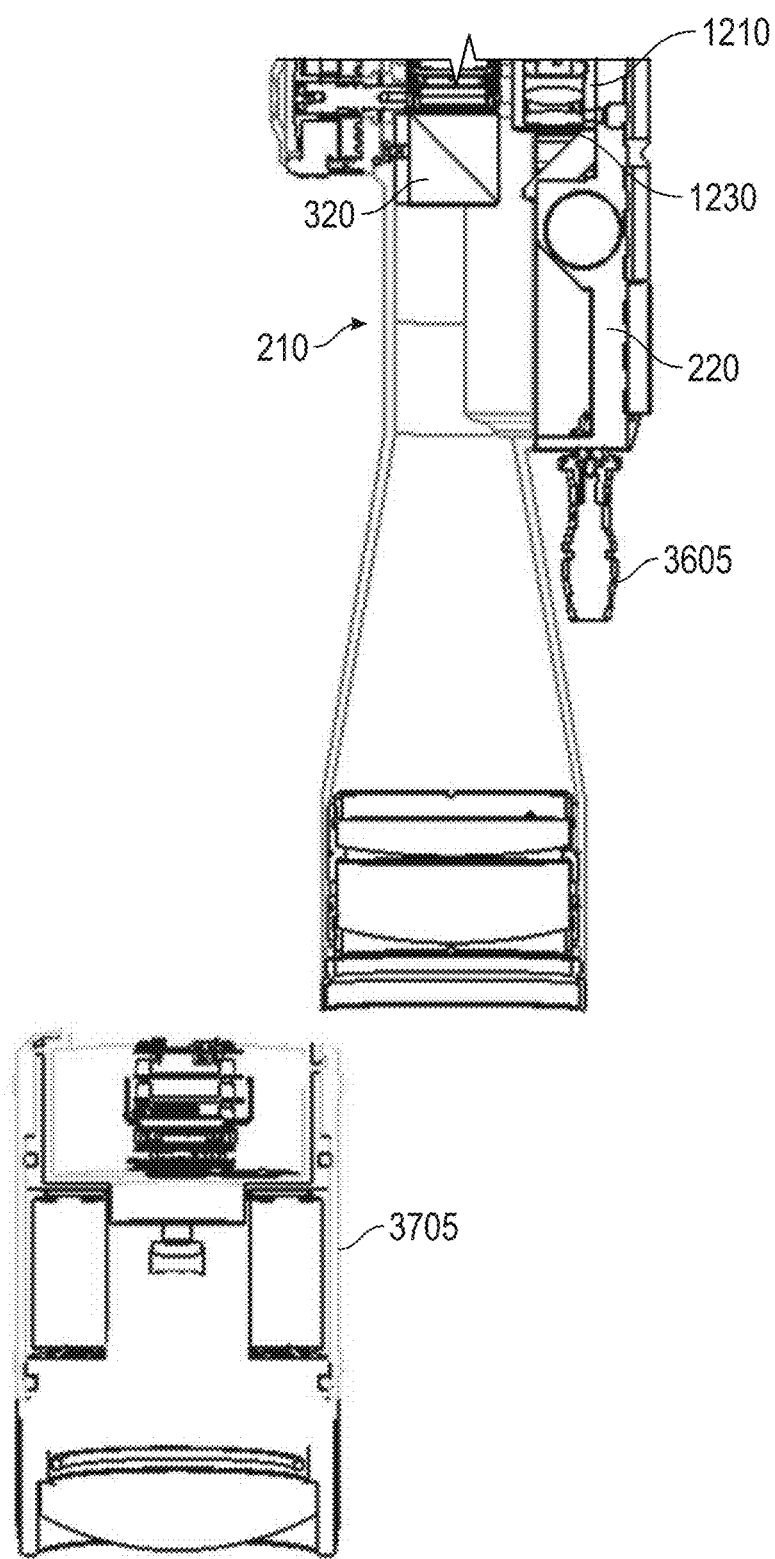
FIG. 37 a representative schematic of a riflescope with a main body and a base having one or more connection interface for communicating with a thermal imaging unit according to one embodiment of the disclosure.
Figure 38:
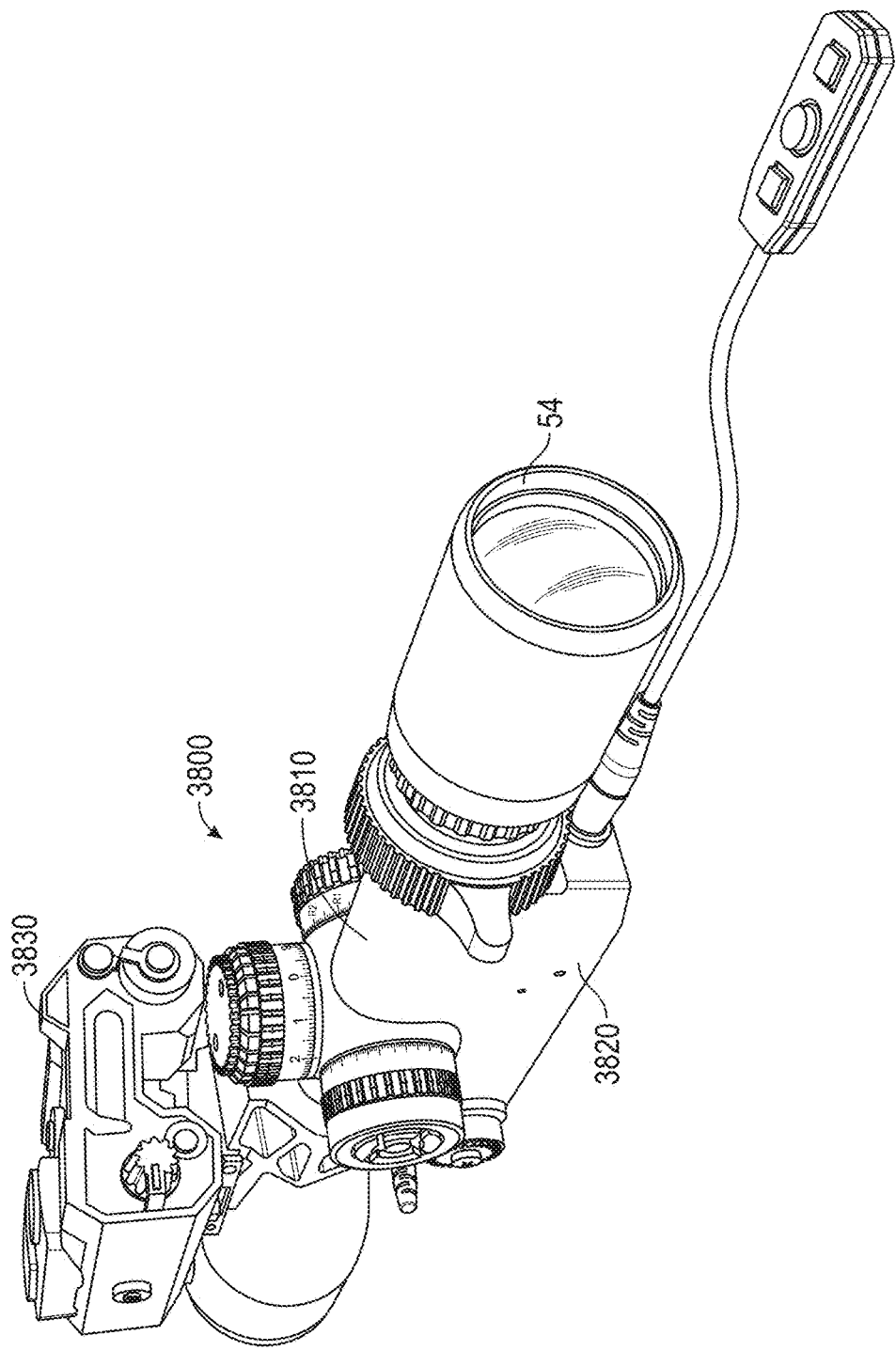
FIG. 38 is a back, left-side view of one embodiment of a riflescope with a laser rangefinder according to one embodiment of the disclosure.
Figure 39:
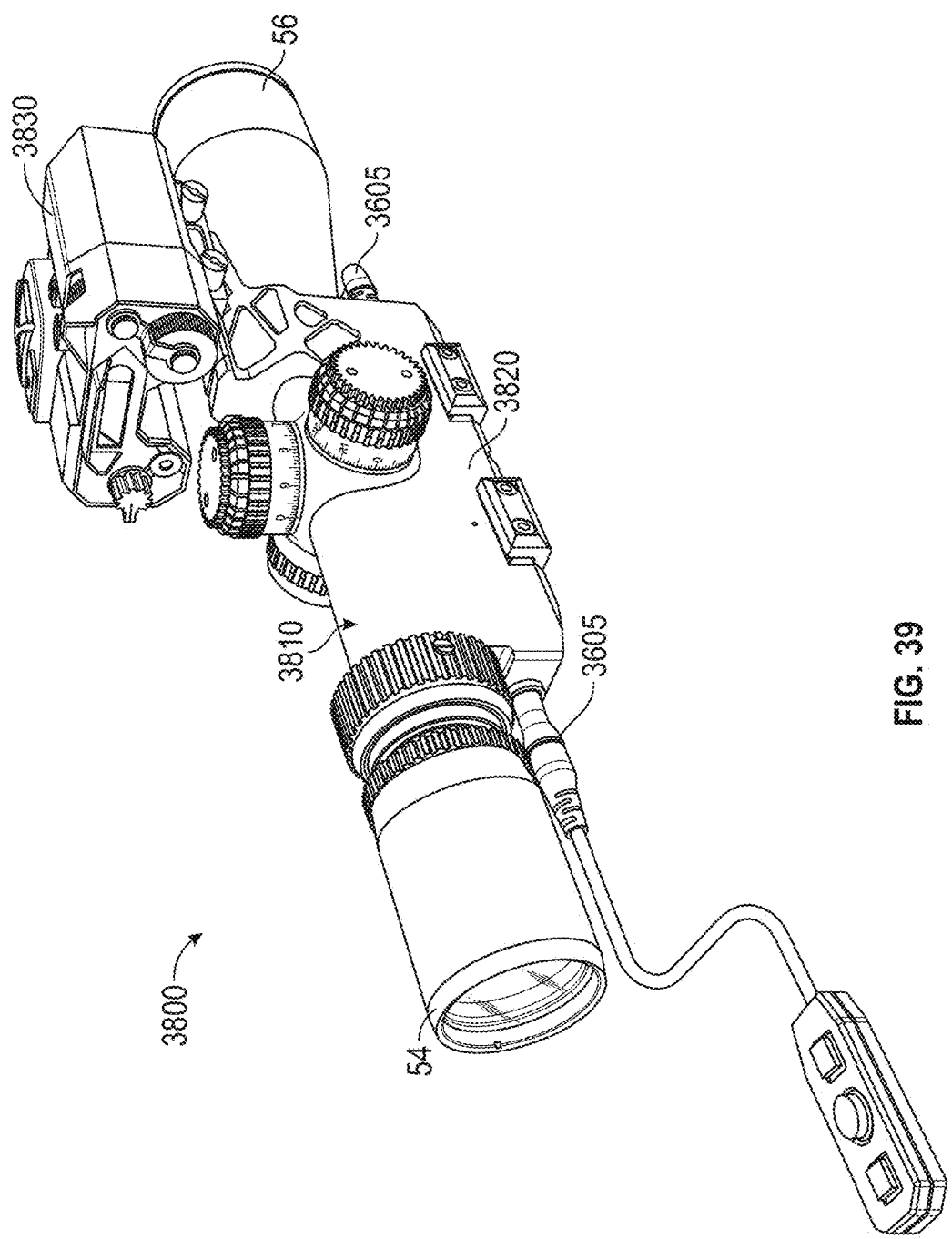
FIG. 39 is a back, right-side view of one embodiment of a riflescope with a laser rangefinder according to one embodiment of the disclosure.
Figure 40:
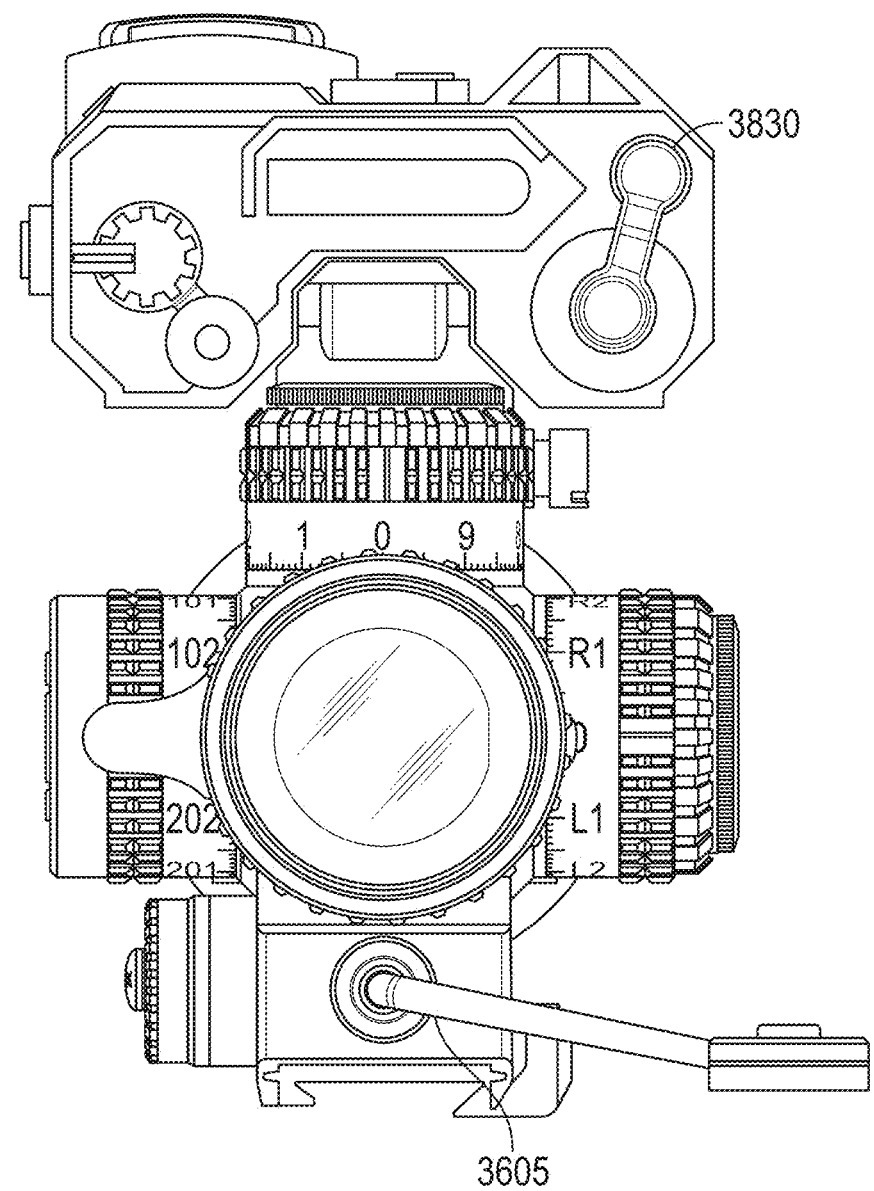
FIG. 40 is a back, right-side view of one embodiment of a riflescope with a laser rangefinder according to one embodiment of the disclosure.
Figure 41:
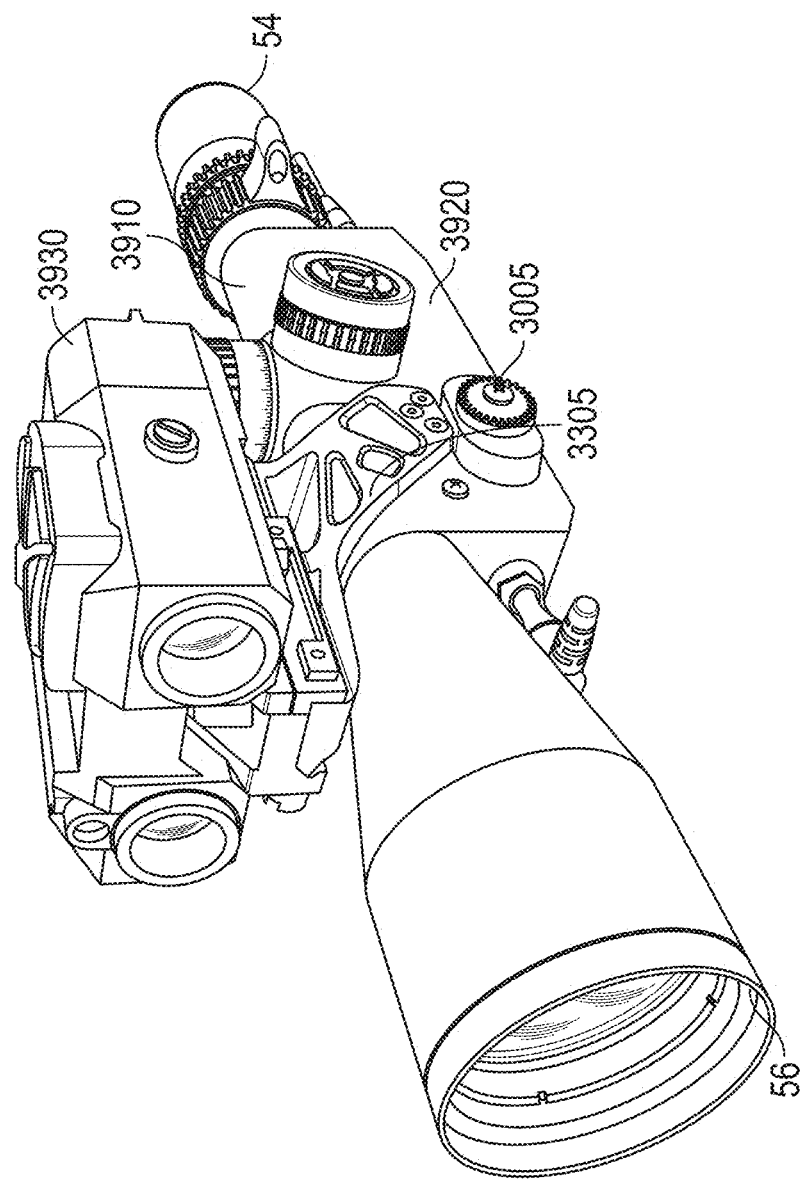
FIG. 41 is a front, left-side view of one embodiment of a riflescope with a laser rangefinder according to one embodiment of the disclosure.
Figure 42:
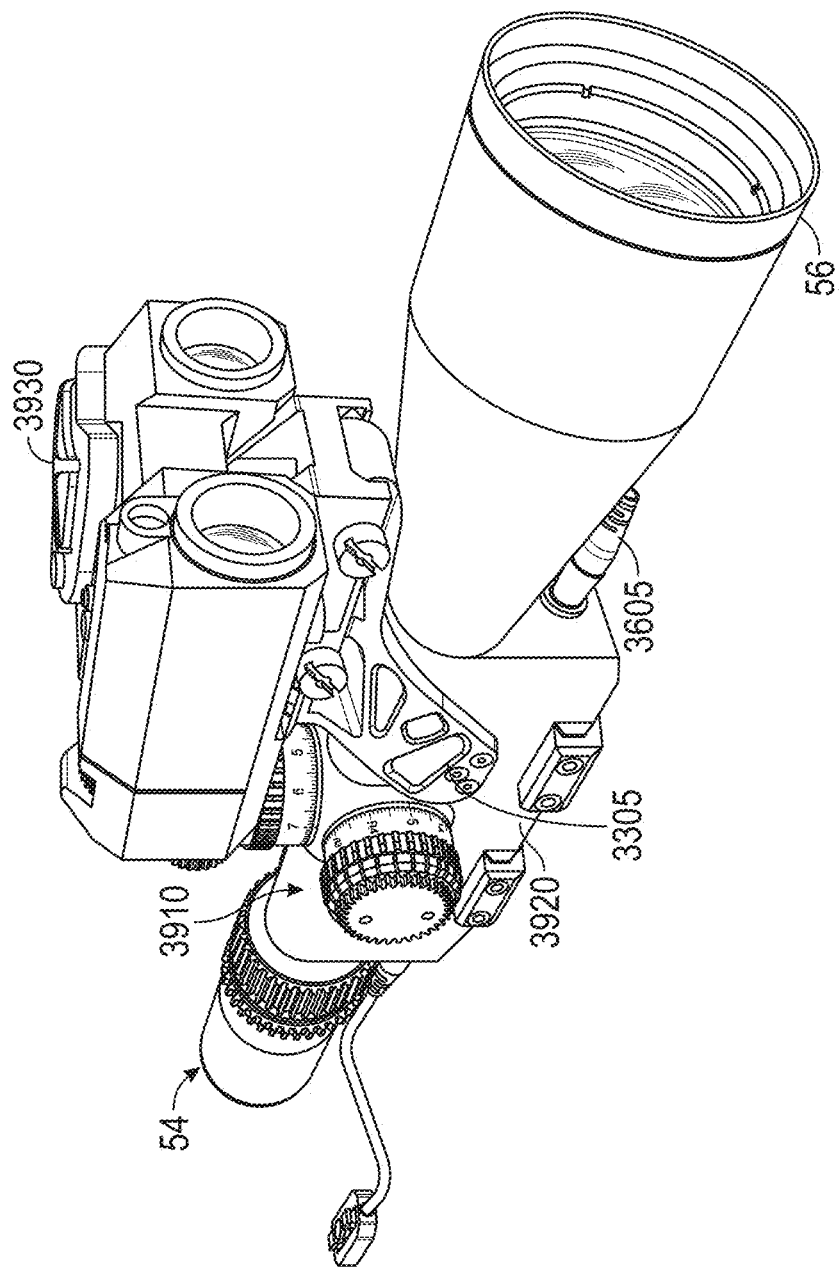
FIG. 42 is a front, right-side view of one embodiment of a riflescope with a laser rangefinder according to one embodiment of the disclosure.
Figure 43:
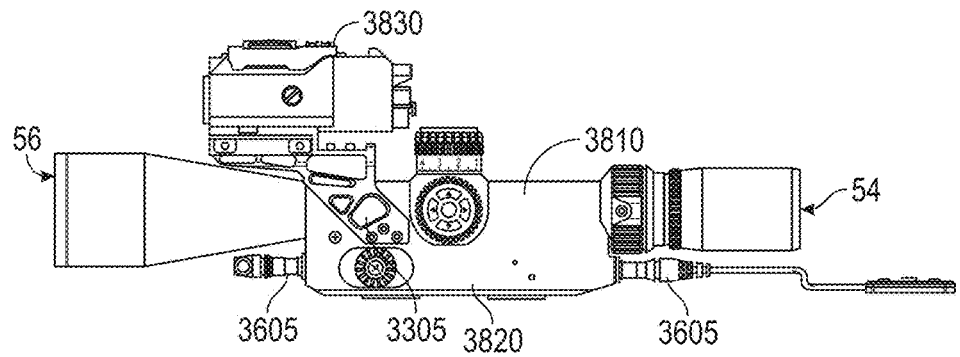
FIG. 43 is a left-side view of one embodiment of a riflescope with a laser rangefinder according to one embodiment of the disclosure.
Figure 44:
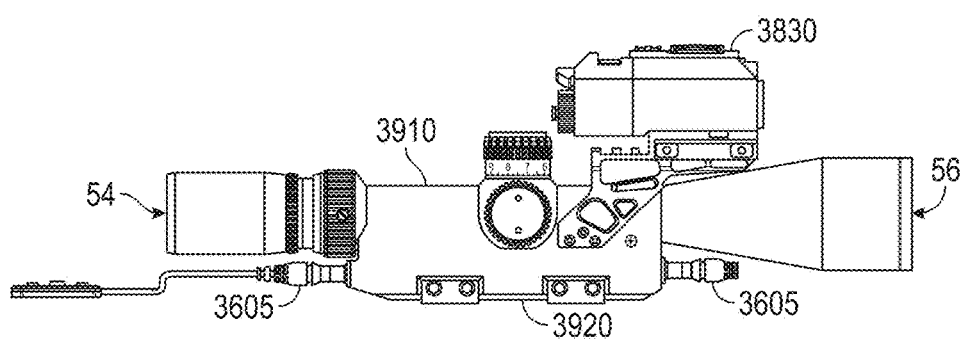
FIG. 44 is a right-side view of one embodiment a riflescope with a laser rangefinder according to one embodiment of the disclosure.

FIG. 37 is a representative schematic of a riflescope 3700 with a main body 210 and a base 220 with an active display 1210 and collector optics 1220 that can be used as the optical system of a thermal imaging unit 3705. The active display 1210 generates an image that is focused on a first focal plane of the main body of the scope, using a beam combiner to integrate the image into the traditional day optic. The integration of the digital display allows for the user to overlay the digital image onto the ambient day optic. With the digital display disclosed herein, the clip-on unit does not have to be removed from the front of the viewing optic to view the ambient day optic. Rather, the digital display can be turned on and off as needed.

The integration of the digital display allows for zero image shift when switching between day visible and digital optic. Since the system is fully integrated, there is no need to zero each time the digital optic is turned on. The system is synchronous, due to the alignment of the combiner optical system.

In one embodiment, the integration of the digital display makes up the optical train that would typically be the rear half of a clip-on unit. Because there is already a micro display in the base of the viewing optic, the thermal sight would only need the infrared optics; the image created by the thermal sensor can be transmitted to the active display, which is already incorporated into the base of the viewing optic. By integrating a thermal or NV sight in this manner, the thermal/NV device will be much shorter and lighter than current weapon sights on the market. This allows for the design of smaller lighter systems, since half of the optical train is now integrated directly into the base that couples to the main body of a viewing optic. There is no need for a rear optical system or display to be integrated into the clip-on unit that contains the sensing device.

Additionally, if the thermal weapon sight were to be mounted off to the side of the riflescope so that the thermal optics did not occlude the riflescope objective, then it would be possible to overlay a thermal image overtop of the visible image that the user would be viewing. This would have the benefit of being able to highlight humans, animals, or anything with a heat signature that stands out in an otherwise neutral daylight scene.

In one embodiment, the integration of the digital display disclosed herein creates the advantage of having live video feed into the focal plan of a viewing optic, without interruption of the day visible sight.

In one embodiment, the integration of the digital display allows for seamless integration of imaging overlays, such as live thermal imaging view, and hyperspectral overlay systems. The visible image is now analog, rather than another digital display.

In one embodiment, the integration of the digital display disclosed herein creates the advantage of continued image feed, even if power were to suddenly drain on the digital system. A true analog image would still be available, which would not be the case in traditional digital output systems.

In one embodiment, the integration of the digital display allows for multiple types of imaging systems to be mounted separate from the front of the viewing optic. A thermal imaging system can be aligned to the bottom or side of the viewing optic and still feed that image directly onto a focal plane within the main body of the viewing optic.

6. EMI Permeable Window

In one embodiment, the main body, the base or both the main body and the base of a viewing optic can have a window that is sealed with a material transparent to the electromagnetic waves used for the wireless communication. Transparent materials include but are not limited to plastics, resins or epoxies.

In one embodiment, the window allows EM waves to propagate from the communicating device with reduced interaction from the metallic body of the viewing optic. This increases the rate at which data can be transmitted. It also allows the wireless communication device to operate at a lower power level due to reduced signal losses.

III. Additional Sensors/Devices

In another embodiment, the disclosure relates to a viewing optic with a main body and a base with an integrated display system and one or more sensors. In one embodiment, the sensors include but are not limited to a Global Positioning System, accelerometers, a magnetometer, MEMS rate sensors, tilt sensors, laser rangefinder.

A. Pointing Angle, Target Location, and Communication

In one embodiment, the viewing optic can have inertial MEMS Rate Sensors to determine the pointing angle of the weapon in inertial space. Example products are the LCG-50 by Systron Donner and the SiRRS01 by Silicon Sensing. In another embodiment, accelerometers can be incorporated into the embedded electronics to determine absolute tilt angle of the viewing optic and track weapon accelerations due to general movement or a firing event.

To support targeting, in various embodiments, the viewing optic can have a GPS and/or digital compass. In one embodiment, the GPS and/or digital compass can be integrated into the viewing optic, for example, as board level modules. In another embodiment, the GPS and/or digital compass can be associated with a separate device that communicates with the viewing optic.

Several manufacturers offer custom of the shelf modules for GPS and digital compass functionality that are small form factor and have low power consumption characteristics. These devices are designed to be integrated into embedded components. For example, Ocean Server Technology makes a OS4000-T compass with 0.5 deg. accuracy and has a power consumption under 30 ma and is less than ¾" square. An example of a GPS device is the DeLorme GPS2058-10 Module that is 16 mm×16 mm and is available in a surface mount package offering 2 meter accuracy.

In one embodiment, the viewing optic can have a data interface that provides one or both of wired and wireless capabilities designed to interface to systems such as the BAE Personal Network Node and the emerging SRW radio. These interfaces provide various communications capabilities, such as range, sensor, and other tactical data (e.g. anti-fratricide detector, environmental sensors, etc.). This unique functionality is used in various embodiments to obtain and communicate environmental, target, and situational awareness information to the community of interest. Generally speaking, the various embodiments are designed to enable the war fighter to quickly acquire, reacquire, process, and otherwise integrate data from a variety of passive and active sources into a ballistic firing solution thereby increasing the shooter's effectiveness.

In another embodiment, the sensors provide information to the active display in order to generate real time position data of different targets onto the first focal plane of the main body of the viewing optic. In another embodiment, the sensors are part of an external device that communicates with the integrated display system.

By using these sensors in the viewing optic, or on an external device that is rigidly connected to the viewing optic, or on a weapon that the viewing optic is mounted to, the exact position of the viewing optic can be obtained, as well as the exact direction that the viewing optic is pointed, and external targets can be calculated in relation to the viewing optic position and aimed direction.

As the user moves the viewing optic around or as targets move in relation to the viewing optic, the position of the targets would be updated continuously and in real time by the sensors communicating with the integrated display system, so that by viewing through the viewing optic the user would be able to see where the targets are in relation to where they are looking.

This approach has strong utility in military applications where you may have personnel in different locations that are trying to communicate a specific target location to one another. For example, with Close Air Support (CAS), a pilot may be flying an aircraft and a unit on the ground may be relying on the aircraft to drop a bomb on a target. Often times, it is difficult for the unit on the ground to relay to the aircraft the exact location of the target. The process of relaying the target information between the ground unit and the aircraft is often referred to as "talking on to the target," and involves communicating what the unit or aircraft is seeing in their field of view, such as what landmarks might be visible near the target and so on.

This process often takes quite a bit of time and can cause confusion because things often look different from the air than they do on the ground. It is critical that each unit be sure that they are all looking at the same target, because if the aircraft mistakes the target they may drop a bomb on friendly units, or non-combatants.

By allowing location and position sensors to communicate with the active reticle display of the integrated display system, these issues are solved. The user of the viewing optic can designate a target in their scope, the scope knows the GPS location of the scope, the exact direction it is pointing and distance to the target and can calculate the exact GPS coordinate of the target. This information can be fed into a universal system, such as Link 16, that all friendly units are connected to. Now the aircraft can simply look at a display in their aircraft and the new target is displayed on their map as soon as another unit designates it.

This makes finding targets much quicker and the confirmation that both units are looking at the same target much easier. Accuracy is extremely important in determining target locations, thus, the active display generated images need to be displayed in the first focal plane of the main body of the viewing optic. If the generated image from the active display were put into the second focal plane of the viewing optic, then the target locations would only be accurate when the viewing optic reticle was at its "zeroed" location. If the user of the viewing optic had dialed anything on their turrets, for example to engage a long range target, then all of the target information in the display would be shifted the amount dialed in the turrets and not be accurate.

By using this with the active display images injected into the first focal plane, the displayed data is agnostic of any adjustments made to the reticle position and is automatically compensated for. This means that target data in the field of view is always accurate.

B. Environmental Sensors

In one embodiment, the viewing optic can have one or more pressure, humidity, and/or temperature sensors designed to collect and use environmental data for ballistic correction purposes. The sensors are available in miniature configurations suitable for integration into the viewing optic. An example of a miniature, low power, water proof, barometric pressure sensor is the MS5540 from Intersema. This component measures 6.2×6.4 mm.

In one embodiment, the sensors can be coupled to the main tube of the viewing optic or to the base of the viewing optic.

Uphill and Downhill

In one embodiment, the viewing optic can have a z-axis accelerometer that can be used to measure tilt angle of the scope with respect to vertical. This tilt angle can be integrated into a ballistic solution at the time of target selection. Once the target is selected, the system may be able to automatically integrate actual uphill or down tilt into the ballistic solution and display the solution into the first focal plane of the viewing optic so that the digital reticle or corrected aiming point is displayed correctly. This can provide for a very fast and effective means of aiming in long range uphill or downhill engagements.

IV. Viewing Optic with Display System and Laser Range Finder

In one embodiment, the disclosure relates to a viewing optic having a main body and a base with an integrated display system, and a laser rangefinder. In one embodiment, the laser rangefinder is coupled to the viewing optic. In another embodiment, the laser rangefinder is independent from the viewing optic and communicates with the viewing optic, either wirelessly or through a cable.

In one embodiment, a laser rangefinder can be used to determine distance to target. In various embodiments, the laser transmits in the near IR for covertness. A typical wavelength used for laser rangefinder devices operating in the near infrared (NIR) is 905 nm.

In one embodiment, the specific laser power and spectral characteristics are selected to meet range and eye safety requirements of the viewing optic. The rangefinder is of sufficient power to produce accurate measurements out to, illustratively, 1500 meters, 2500 meters or whatever effective range is associated with the firearm or weapon intended to be used with the viewing optic. For rangefinder operation, in some embodiments a single button control is dedicated for making or executing a rangefinder measurement.

In one embodiment, the range to target may be communicated to the active display that generates an image of the range to target and superimposes the range to target onto the first focal plane of a viewing optic when viewing the target scene.

In one embodiment, the viewing optic has a computing device with ballistics calculator capabilities. In one embodiment, the main body of the viewing optic has a computing device with ballistics calculator capabilities.

In one embodiment, a laser rangefinder can be used to measure a target distance, calculate projectile ballistics and communicate the corrected aim point to an active display in an integrated display system, which then superimposes the image of the corrected aim point onto the first focal plane of a viewing optic with a reticle attached to a moveable erector lens system.

Importantly, because the active display generated image is combined with the image from the target in front of the first focal plane and then focused onto the first focal plane, the target image and display image never move in relation to one another. Therefore, any aiming reference created by the digital display will always be accurate, regardless of how the moveable erector system is adjusted.

When an external laser range finder feeds range information to the riflescope, an aiming reference or laser designator will need to be created by the digital display in order for the user to know where in the field of view the LRF is aiming in order to accurately hit the correct target with the laser. The digital display image and the target image of the objective lens system in the main body of the riflescope do not move in relation to one another. Therefore, the digital laser designator will accurately show the user the correct location of the LRF laser point of aim, no matter how the turrets have been adjusted to move the moveable erector lens system.

On the other hand, if the digital display image was integrated into the optic system anywhere behind the first focal plane then when the turrets are adjusted, and the erector lens system is moved/tilted, then the image of the digital display would move in relation to the target image and the digital LRF designator would move in relation to the actual laser point of aim. This could lead to an incorrect range measurement if the user dials any elevation or windage adjustment into the turrets and forgets to dial back to the original position the turrets were set to when the user aligned the digital reticle with the actual laser point of aim.

In addition, when a traditional riflescope is zeroed to the rifle, the user will typically select a "zero" range, often times 100 yards, that is used align the riflescope reticle with the point of impact of the rifle projectile. This is usually accomplished by adjusting the turrets of the riflescope, and thus the angle of tilt of the erector lens system, in order to align the reticle with the point of impact of the projectile. After the initial "zero" of the riflescope has been set, the turrets allow the user to further make adjustments to the riflescope reticle position in order to compensate for targets at different ranges or for changing wind drift variables that affect where the point of impact of the projectile may change from the initial "zero" position.

If the digital display were to be integrated into the riflescope system behind the first focal plane then the ballistically calculated correction factor to the point of aim would have the potential to be incorrect if the user had made any adjustments to the turrets from the initial "zero." For example, if a ballistic calculator determined that the correction required 10 milliradians of elevation adjustment to hit the target, the digital display would place an aim point 10 milliradians below the center of the crosshair. However, if the user had dialed 5 milliradians into the elevation turret from the initial "zero" position, the digital aim point would actually be aiming 15 milliradians below the initial "zero."

By injecting the digital display into the first focal plane of the optic system of the main body of a riflescope, it allows the digital display to be totally unaffected by any change in the turret adjustment or position of the erector system. This means that in the example above, the digital aim point would actually appear only 5 milliradians below the center of the reticle, for a total of, the correct, 10 milliradian ballistic drop (user had previously dialed 5 milliradians into the elevation turret from the initial "zero" position). In short, injecting the digital display image into the first focal plane of the optic system of the main body renders the digital display image completely agnostic to any change in the turret position and thus the erector lens system movement/tilt, which provides the needed accuracy.

In one embodiment, the laser range finder capability provides dynamically defined ballistic solutions based upon data acquired. The range to target may be used by the on-board computer when processing tracer trajectory to determine the best point along the measured trajectory path to use for determining the ballistic correction for the next shot.

In one embodiment, the laser rangefinder is integrated into the scope and has a dedicated outgoing laser transmission port. In one embodiment, the optical path of this dedicated laser axis is positioned in the corner of the housing so it is unobstructed by the main objective lens. The detection path for the incoming reflected laser signal is through the main objective of the scope where the light is directed to a photo detector by a near IR beamsplitter. This arrangement takes advantage of the relatively large aperture of the main objective lens to increase the signal to noise of the measurement.

FIGS. 38 through 44 provides photographs of a viewing optic 3800 having a main body 3810 with an optical system and a base 3820 coupled to the main body 3810 having an integrated display system, with a laser range finder 3830 coupled to the top of the main body 3810. The viewing optic 3800 can have two auxiliary ports 3805 for communication with an external source. The viewing optic 3800 can have a picatinny mount 3305 that couples to the outside of a battery cap for a battery cavity 3005 in the base 3820.

Figure 45:
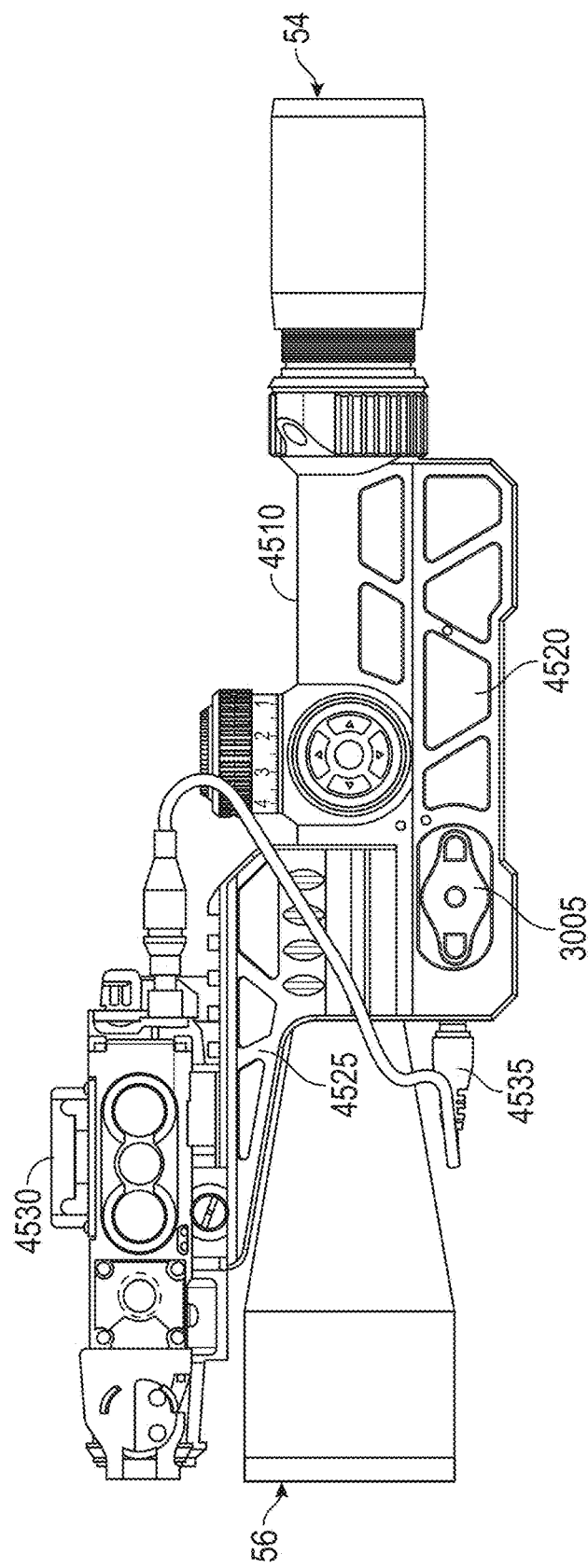
FIG. 45 is a right-side view of one embodiment of a riflescope according to one embodiment of the disclosure.
Figure 46:
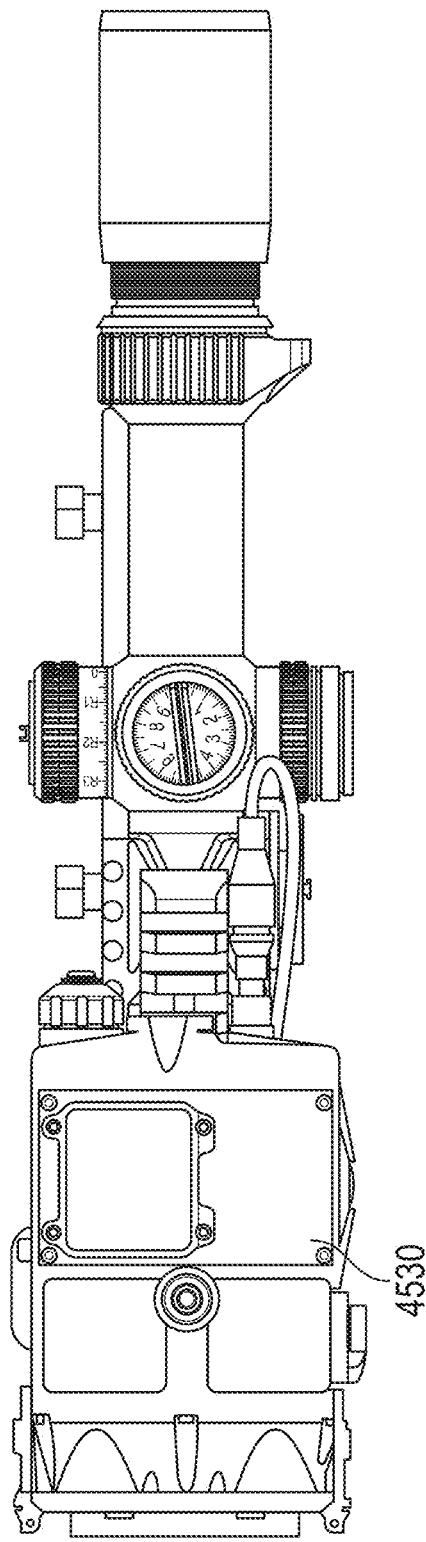
FIG. 46 is a top-side view of one embodiment of a riflescope according to one embodiment of the disclosure.

FIGS. 45 through 46 provides photographs of a viewing optic 4500 having a main body 4510 with an optical system and a base 4520 coupled to the main body 4510 having an integrated display system, with a laser range finder 4530 coupled to the top of the main body 4510. The viewing optic 4500 can have a single auxiliary port 4535 for communication with the laser range finder 4530.

Figure 47:
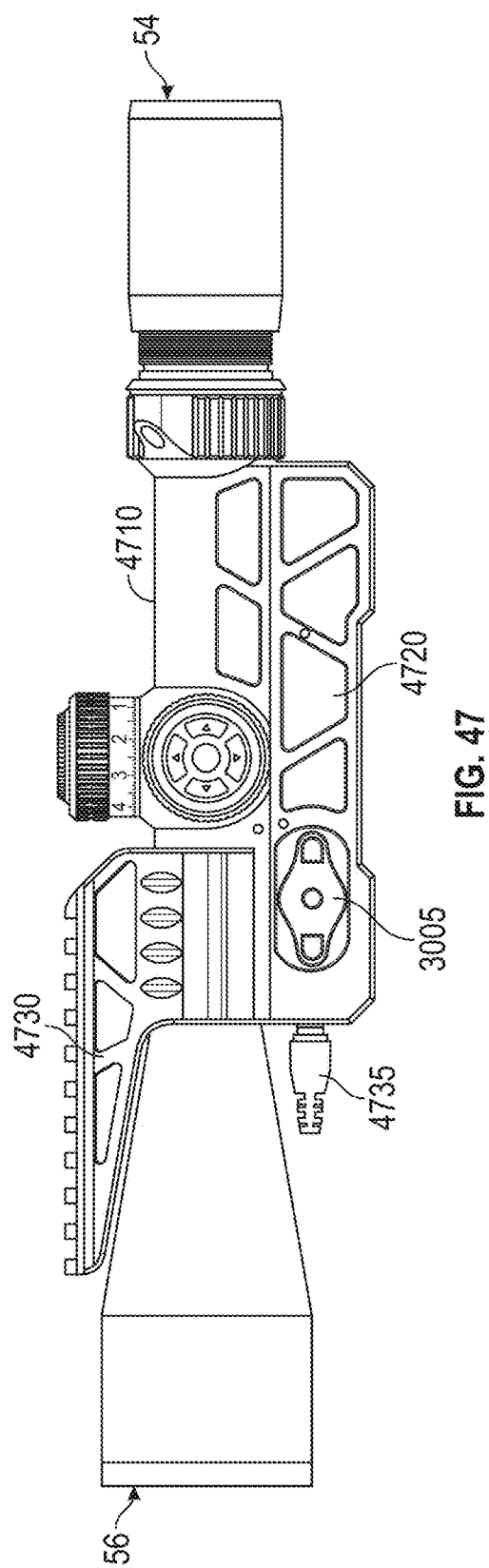
FIG. 47 is a right-side view of one embodiment of a riflescope with a laser rangefinder according to one embodiment of the disclosure.
Figure 48:
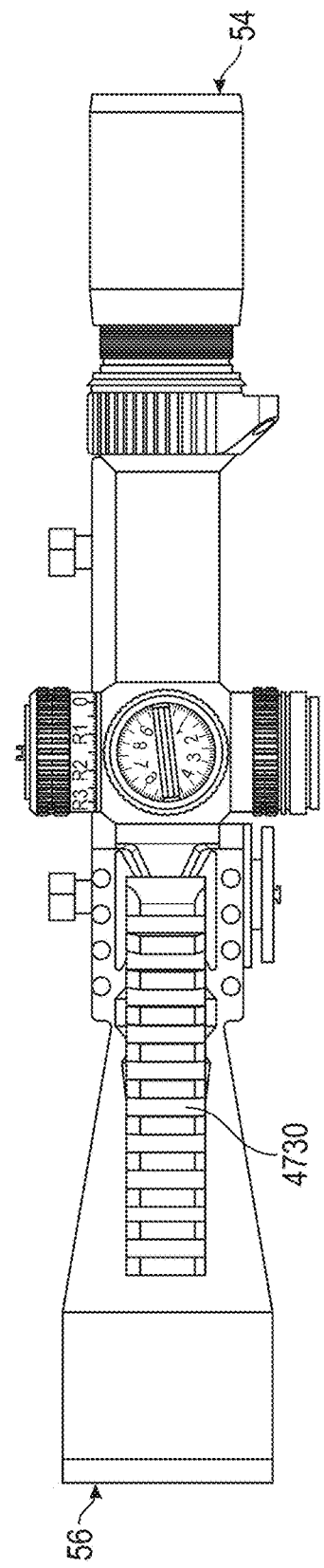
FIG. 48 is a top-side view of one embodiment of a riflescope with a laser rangefinder according to one embodiment of the disclosure.

FIGS. 47 and 48 provide photographs of a viewing optic 4700 having a main body 4710 with an optical system and a base 4720 coupled to the main body 4710 having an integrated display system. In certain embodiments, the viewing optic 4700 can have a picatinny mount 4730. In certain embodiments, the viewing optic can have an auxiliary port 4735.

V. Additional Embodiments

1. Digital Zeroing

In one embodiment, the disclosure relates to method for using a digital reticle for alignment and zeroing purposes. In one embodiment, the viewing optic has a physical reticle and a digital reticle, with the physical reticle being connected to the erector system. The user "zeros" the physical reticle by using turrets to move the reticle and erector system so that the center of the reticle coincides with the bullet point of impact.

After the physical reticle is zeroed, the digital reticle must also be zeroed. Since the digital reticle is formed by an active or digital display that is fixed in position, the only way to zero or align the digital reticle is by using a digital means. The digital reticle position can be moved by the user so that the center of the digital reticle coincides with the center of the physical reticle.

In another embodiment, digital zeroing can also be used with a laser designator. When used in conjunction with an external laser range finder, the viewing optic laser designator must be aligned with the direction that the laser range finder is pointing. Most external laser rangefinders have a visible laser and an infrared laser. The infrared laser is the laser that actually measures the range. The visible laser can be turned on an off and coincides with the aim of the infrared laser. The visible laser allows the user to see where the laser is aiming. Once the visible laser is turned on, the user can then digitally adjust the laser designator to coincide with the point of aim of the visible laser. Then the visible laser can be turned off and the user can use the laser designator in the viewing optic display to ensure accurate aiming of the laser rangefinder.

2. Holographic Waveguide

In one embodiment, the disclosure relates to a viewing optic having a main body with a first optical system and a base with active display and a holographic waveguide. In one embodiment, the integration of the holographic waveguide reduces the package size and weight of a traditional beam combining system. The integration of the holographic waveguide can increase the overall transmitted brightness ratio, such that a greater percentage of each optic system light gets to the end user.

Figure 49:
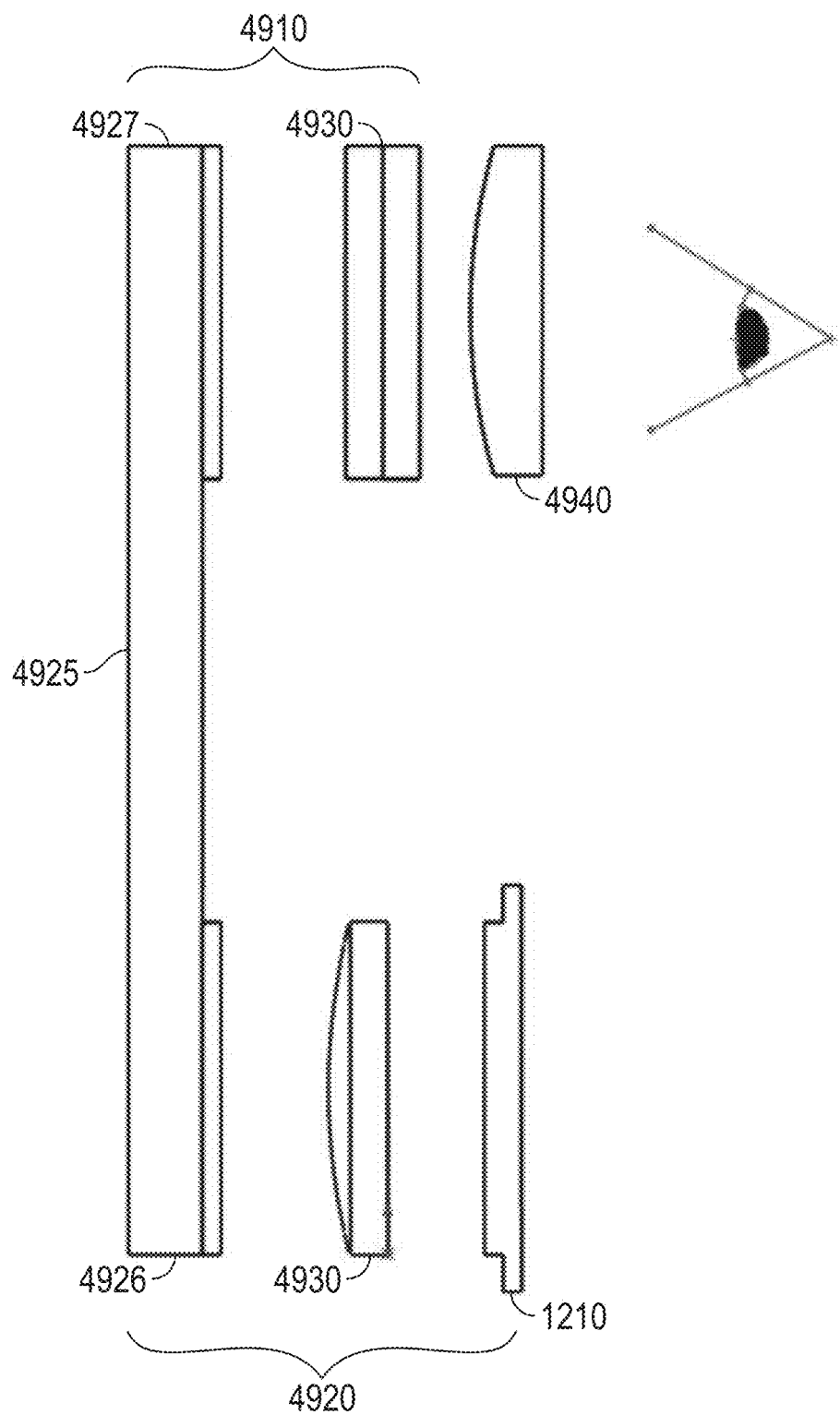
FIG. 49 is a representative schematic of a holographic waveguide setup with the digital display coupled into the waveguide and sent out of the second hologram which focuses the light onto a predetermined focal plane according to one embodiment of the disclosure.

FIG. 49 is a representative depiction of a viewing optic 4900 with an optical system in a main body 4910 and a base 49 having an active display 1210 and a holographic waveguide system 4925. The holographic waveguide system 4925 spans the main body 4910 as well as the base 4920. A digital or active display 1210 generates an image to the collimation optic 4930, which sends the image to the incoming hologram waveguide 4926. The image exits the waveguide via the output hologram 4927 and the image is injected into the first focal plane 4930 of the optical system 4940.

In one embodiment, the integration of the holographic waveguide reduces the need in specialized coatings made for beam combiners. In addition, the integration of the holographic waveguide disrupts the need for a mirror system, alleviating the need for complex mechanical alignment systems.

The integration of the holographic waveguide allows you to create a copy of the complex optical system needed to image a display, eliminating the need for a complex system to be put into every system.

The integration of the holographic waveguide allows for the use of LCOS, LCD and OLED systems to display information within an optical system. The nature of the system allows for various types of illumination systems in conjunction with the different types of displays used within the system.

The use of a holographic waveguide allows for the implementation of non-static illuminated reticles. The reticles can be changed just as images on a screen are changed. The holographic waveguide allows for daylight bright reticle systems without the need for traditional illumination methods.

The integration of the holographic waveguide creates the ability to create a non-static holographic sight. The out coupling hologram can send light as defined by the master optical system, allowing for changes in the sight picture of a holographic sight.

The integration of a holographic waveguide can be used with any monochromatic or polychromatic light source. The use of complex multiplexed Bragg gratings allow for the integration of multi-chromatic illumination systems.

3. Tracking Bullet Trajectory

One of the difficulties associated with long range engagements is the ability to determine the accuracy of an initial shot so that a timely correction can be made to improve the accuracy of the next shot. A traditional technique used to determine the round's point of impact is to attempt to detect bullet trace and/or actual splash point of bullet. This can be difficult in many long range engagements. In the case of a sniper team, the follow up shots also require feedback from the spotter to get the pertinent data back to the shooter. This can take several seconds using only verbal communications.

In one embodiment, the viewing optic can have an imaging sensor adapted to detect image frames associated with a bullet flight path and communicate said image frames to a computing device, which can then calculate bullet trajectory therefrom.

In one embodiment, the viewing optic with a main body and a base with an integrated display system can allow tracer rounds to be detected by on-board image processing capabilities so as to determine the bullet's trajectory just before it impacts the target area. In one embodiment, this data can be communicated back into a ballistics computer thereby quickly and efficiently creating a follow up firing solution for the second round, which can be communicated to the active display and the corrected aiming point superimposed into the first focal plane of the main body of the viewing optic.

Automating the feedback loop with trajectory and splash point detection by computer and combining this to the active display and superimposing an electronic aiming point correction in the first focal plane advantageously decreases the total time required to make an accurate second shot. This time reduction can be at a critical point in the engagement process. After the first shot is made, the window of opportunity to make a second shot can quickly narrow, especially if delays extend past the point in time when the sonic boom of the initial shot reaches the intended target.

Environmental conditions and windage drifts can have substantial impact on the ballistic trajectory of the round over large distances. For instance a M193 bullet can drift about 4 feet in a modest 10 mph crosswind at 500 yards. Windage effects become even more exaggerated at greater distances since the speed of the bullet decreases as the range and total time of flight increases.

A variety of tracer round options are available. A standard tracer is used conventionally by the shooter to see the trajectory of the bullets in-flight path. A tracer round can emit light in the visible or IR spectrum depending on the composition of the tracer material. The latter is effective when the shooter is using night vision equipment. In addition some tracers can emit light dimly at first and then brighten as the round travels downrange. A fuse element can control when the tracer lights up after firing of the round in order to delay igniting the tracer material until the bullet is well downrange. The fuse delay mitigates the risk of the tracer revealing the shooter's firing location.

In one embodiment, a viewing optic with an integrated display system can use tracer rounds to detect, determine and/or display a bullet's trajectory just before it impacts the target area. In one embodiment, covert tracers that have long delay fuses and emit in the near IR region (700 nm to 1000 nm) of the electromagnetic spectrum can be used. Light emitted in the near IR region is invisible to the human eye, but can be detected by an imaging sensor using conventional glass optics. .A tracer round of this type can be particularly effective in maintaining the shooter's covertness for Sniper operations while providing a significant automated bullet tracking capability for accurately determining next shot correction requirements. Thus, various embodiments are adapted to cooperate with one or more types of tracer rounds to implement the functions described herein.

Since the imaging sensor in the daylight embodiment is also sensitive to visible light, a standard daylight tracer can also be used for bullet tracking. In both the visible and near IR cases, the tracer rounds can take advantage of having long delay fuses to increase covertness as the system only needs to detect the bullet's flight in the final moments before impact.

In one embodiment, a camera associated with a viewing optic can record the trajectory of the bullet and using the suite of sensors embedded into the viewing optic, it can calculate the exact geo-positional trajectory of the bullet, as well as the bullet's point of impact.

In another embodiment, the viewing optic may also use a stabilized camera to compensate for recoil from the firearm. The viewing optic would accurately track the movement of the stabilized camera, and compensate for that movement to accurately calculate the geo-positional trajectory of the bullet. This embodiment would allow the shooter to track their own trajectory and compensate for any misses more accurately.

In both embodiments, the geo-positional trajectory of the bullet could then be shared to other users who also active displays in devices they are using, such as another riflescope, spotting scope, or goggles using a microdisplay or holographic technology to display the trajectory into their field of view.

In one embodiment, the tracking of the bullet's trajectory incorporates capturing video frame images of the glowing tracer bullet in flight. The spatial location of the bullet in selected image frames is extracted through image processing techniques and then correlated with data from other video frames to establish the bullet's trajectory.

Image frames are selected for processing based on correlation with the firing event. When the round is fired from the weapon, the time of muzzle exit is immediately determined by processing accelerometer data obtained from an on-board weapon axis accelerometer included in various embodiments. A correlation window from the time of muzzle exit is then started where various embodiments begin frame by frame processing of video images to identify therein a small cluster of pixels associated with the tracer round at a particular X-Y position in space. The frame images may be taken with an exposure time that is optimized to capture the bullet as it transmits a small number of individual pixels in the X-Y frame. Since the frame rate of the camera and time of muzzle exit is known, the bullet's distance from the weapon in each frame can be established using the known flight characteristic of the bullet. This data is contained in the onboard tables pertinent to each weapon and its associated rounds or, alternatively, received from a tactical network communication with the weapon sight.

If an absolute range to target is known from a laser rangefinder measurement, the position of the round at the target range can be calculated by determining the point in the trajectory that corresponds to the target range. The elegance of this technique is that the measurement is done from in-flight data and does not rely on bullet impact with a physical surface. The position calculated would correspond to an angular elevation and azimuth relative to the weapon's position and can be used to determine the ballistic pointing correction needed for increased accuracy. As part of this next shot ballistic correction calculation, various embodiments use inertial pointing angle data to calculate the relative reference point between inertial pointing angle of the gun at muzzle exit and the pointing angle at the time of splash. This allows the calculation to take into account any angular movement of the gun that occurred during the bullet's time of flight to target range.

4. Additional Configurations

Figure 50:
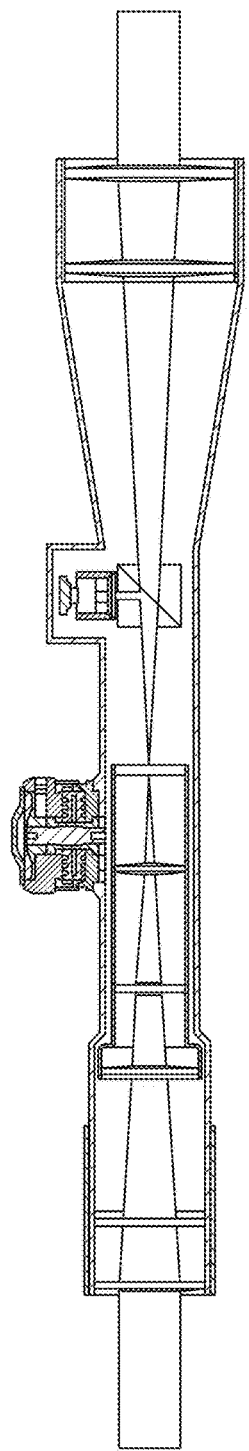
FIG. 50 is a representative schematic of an alternative configuration of a viewing optic according to one embodiment of the disclosure.

FIG. 50 depicts an alternative embodiment of a riflescope 5000 having a scope body 5005 and a compartment or notch 5010 on the top of the scope body 5005. The compartment 5010 has an integrated display system comprising an active display 5015, and collector optics 5020. The integrated display system is oriented such the display 5015 and the collector optics 5020 are parallel with the beam combiner 5025. In this embodiment, no reflective surface, such as a mirror, is needed.

Figure 51:
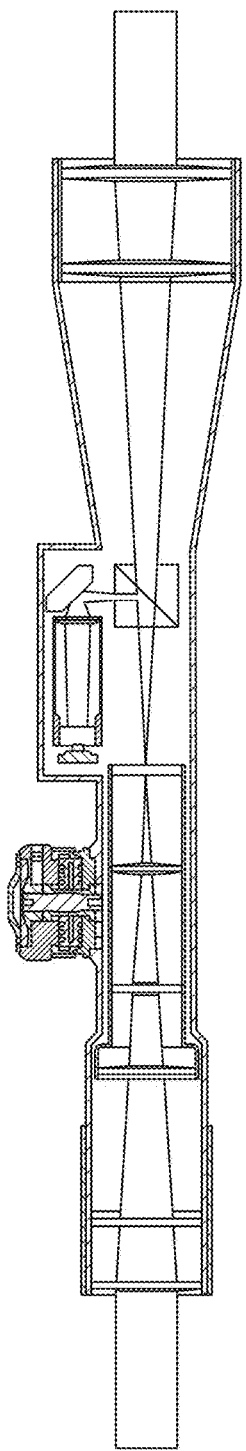
FIG. 51 is a representative schematic of an alternative configuration of a viewing optic according to one embodiment of the disclosure.

FIG. 51 depicts an alternative embodiment of a viewing optic 5000 having a scope body 5005 and a compartment or notch 5010 on the top of the scope body 5005. The compartment 5010 has an integrated display system comprising an active display 5105, collector optics 5110, and a mirror 5115. The integrated display system is oriented such the display 5115 and the collector optics 5110 are perpendicular with the beam combiner 5025. In FIG. 51, the active display 5105 is closer to the ocular system as compared to the objective system of the viewing optic.

Figure 52:
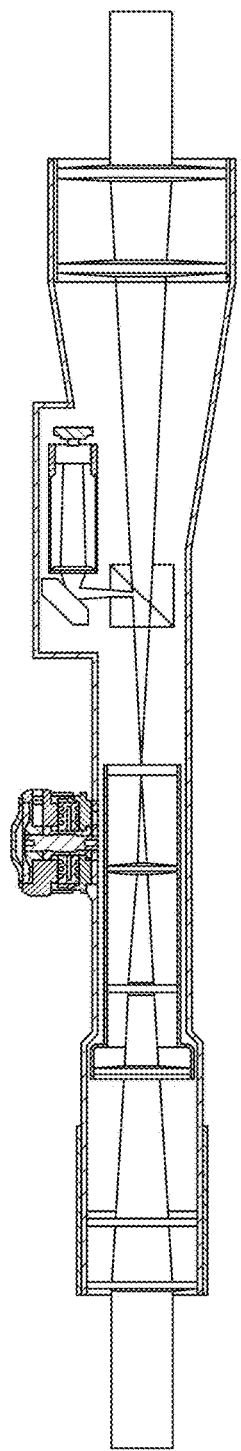
FIG. 52 is a representative schematic of an alternative configuration of a viewing optic according to one embodiment of the disclosure.

FIG. 52 depicts an alternative embodiment of a viewing optic 5000 having a scope body 5005 and a compartment or notch 5010 on the top of the scope body 5005. The compartment 5010 has an integrated display system comprising an active display 5105, collector optics 5110, and a mirror 5115. The integrated display system is oriented such the display 5105 and the collector optics 5110 are perpendicular with the beam combiner 5025. In FIG. 52, the active display 5105 is closer to the objective system as compared to the ocular system of the viewing optic.

The images generated from the active display 5105 can be directed to the mirror 5115 combined with the images of the scene viewed by the viewer through the viewing optics with a beam combiner 5025 in the scope body 5005 for simultaneously superimposing or overlaying the generated images and the viewed images, wherein the combined image is injected into the first focal plane. Because the beam combiner 5025 is positioned before the first focal plane, and the combined image is focused on the first focal plane, the displayed image and the viewed image do not move in relation to one another. This is a major advancement compared to devices that inject the image into the second focal plane.

In yet another alternative embodiment, the viewing optic has a scope body and a separable base having an active display and collector optics, with the active display and the collector optics being parallel with the beam combiner. In this embodiment, no reflective surface, such as a mirror, is needed. The base couples to the bottom of the main body of the viewing optic.

The images generated from the micro display can be combined with the images of the scene viewed by the viewer through the viewing optics with a beam combiner in the scope body for simultaneously superimposing or overlaying the generated images and the viewed images, wherein the combined image is injected into the first focal plane. Because the beam combiner is positioned before the first focal plane, and the combined image is focused on the first focal plane, the displayed image and the viewed image do not move in relation to one another. This is a major advancement compared to devices that inject the image into the second focal plane.

The optic sight and methods disclosed herein can be a display or viewing apparatus, device, sight, or scope, which can be for or on, or part of a weapon, gun, rifle, laser target locater, range finder, or as an add-on accessory thereto. Embodiments can be mounted on a weapon, or apparatus, or can be hand held or helmet mounted.

The apparatuses and methods disclosed herein can be further described in the following paragraphs:

1. A viewing optic comprising:

a body having (i) a first optical system having an objective lens system that focuses a target image from an outward scene to a first focal plane, an erector lens system that inverts the target image, a second focal plane, and (ii) a beam combiner between the objective lens system and the first focal plane; and a second optical system with an active display and a lens system that collects the light from the active display, and (ii) a mirror that directs the image from the active display to the beam combiner where the image from the active display and the target image from the objective lens system are combined into the first focal plane and viewed simultaneously.

2. A viewing optic comprising: an optical system configured to define a first focal plane; an active display for generating a digital image, wherein the digital image is superimposed on the first focal plane; and a controller coupled to the active display, the controller configured to selectively power one or more display elements to generate the digital image.

3. A viewing optic comprising: (a) a main tube; (b) an objective system coupled to a first end of the main tube; (c) an ocular system coupled to the second end of the main tube, the main tube, objective system and ocular system being configured to define at least a first focal plane; and (d) a beam combiner positioned between the objective assembly and the first focal plane.

4. A viewing optic comprising: (a) a main tube; (b) an objective system coupled to a first end of the main tube that focuses a target image from an outward scene; (c) an ocular system coupled to the second end of the main tube, the main tube, objective system and ocular system being configured to define at least a first focal plane; (d) a beam combiner positioned between the objective assembly and the first focal plane; and (e) an active display for generating an image and directing the image to the beam combiner, wherein the generated image and the target image are combined into the first focal plane.

5. A viewing optic comprising (i) a main body with an optical system for generating images of an outward scene and a beam combiner and (ii) a base coupled to the body and having an active display for generating images and a mirror for directing the generated images to the beam combiner for simultaneous overlaid viewing of the generated images and images of the outward scene in a first focal plane of the main body.

6. A viewing optic comprising:
a body having (i) a first optical system having an objective lens system that focuses a target image from an outward scene to a first focal plane, an erector lens system that inverts the target image, a second focal plane, and (ii) a beam combiner that is placed between the objective lens system and the first focal plane; and
a base with a second optical system with an active display and a lens system that collects the light from the active display, and (ii) a mirror that directs the image from the active display to the beam combiner where the image from the active display and the target image from the objective lens system are combined into the first focal plane and viewed simultaneously.

7. A viewing optic comprising a main body with an optical system for viewing an outward scene and a base coupled to the main body having an active display and a collector lens system for generating an image, wherein the generated image is combined into an image of the outward scene in a first focal plane of the optical system of the main body.

8. A viewing optic comprising:
(i) a main tube having (a) an objective system coupled to a first end of the main tube that focuses a target image from an outward scene; (b) an ocular system coupled to the second end of the main tube, the main tube, objective system and ocular system being configured to define at least a first focal plane; and (c) a beam combiner positioned between the objective assembly and the first focal plane; and
(ii) a base having an active display for generating an image and directing the image to the beam combiner, wherein the generated image and the target image are combined into the first focal plane.

9. A viewing optic comprising:
a body having (i) a first optical system having an objective lens system that focuses a target image from an outward scene to a first focal plane, an erector lens system that inverts the target image, a second focal plane, and an ocular lens system, (ii) a beam combiner between the objective lens system and the first focal plane, (iii) a focus cell between the beam combiner and the objective lens system; and (iv) a connecting element coupling the focus cell to a parallax adjustment assembly.

10. A viewing optic comprising: an optical system having a beam combiner between a first focal plane and an objective lens system, a focus cell positioned between the beam combiner and the objective lens system, and an active display for generating a digital image, wherein the digital image is superimposed on the first focal plane; and a controller coupled to the active display, the controller configured to selectively power one or more display elements to generate the digital image.

11. A viewing optic comprising: (a) a main tube; (b) an objective system coupled to a first end of the main tube; (c) an ocular system coupled to the second end of the main tube, (c) a beam combiner positioned between the objective assembly and the first focal plane; and (d) a focus cell positioned between the beam combiner and the objective assembly.

12. A viewing optic comprising: (a) a main tube; (b) an objective system coupled to a first end of the main tube that focuses a target image from an outward scene; (c) an ocular system coupled to the second end of the main tube, the main tube, objective system and ocular system being configured to define at least a first focal plane; (d) a beam combiner positioned between the objective assembly and the first focal plane; (e) a focus cell positioned between the beam combiner and the objective assembly; and (f) a connecting element coupling the focus cell to a parallax adjustment assembly.

13. A viewing optic comprising:
a body having (i) a first optical system having an objective lens system that focuses a target image from an outward scene to a first focal plane, an erector lens system that inverts the target image, a second focal plane, an ocular lens system for viewing the target image, and (ii) a beam combiner between the objective lens system and the first focal plane; and
a second optical system with (i) an active display and a lens system that collects the light from the active display, (ii) a reflective material that directs the image from the active display to the beam combiner, and (iii) an adjustment mechanism for performing one or more of the following tasks, (a) moving the active display in relation to the reflective material, (b) moving the reflective material in relation to the active display, (c) moving the reflective material in relation to the beam combiner, (d) moving the beam combiner in relation to the reflective material, and (e) moving the erector lens system in relation to the beam combiner, wherein the image from the active display and the target image from the objective lens system are combined into the first focal plane and viewed simultaneously.

14. A viewing optic comprising: an optical system configured to define a first focal plane; an active display for generating a digital image, and a reflective material for directing the digital image to the first focal plane; and one or more adjustment mechanisms for performing one or more of the following: (a) moving the active display in relation to the reflective material, and (b) moving the reflective material in relation to the active display.

15. A viewing optic comprising: (a) a main tube; (b) an objective system coupled to a first end of the main tube that focuses a target image from an outward scene; (c) an ocular system coupled to the second end of the main tube, the main tube, objective system and ocular system being configured to define at least a first focal plane; and (d) a beam combiner positioned between the objective assembly and the first focal plane, (e) an active display and a reflective material that directs the image from the active display to the beam combiner, and (f) an adjustment mechanism for performing one or more of the following: (i) moving the active display in relation to the reflective material, (ii) moving the reflective material in relation to the active display, (iii) moving the reflective material in relation to the beam combiner, (iv) moving the beam combiner in relation to the reflective material, and (v) moving the erector lens system in relation to the beam combiner, wherein the image from the active display and the target image from the objective lens system are combined into the first focal plane and viewed simultaneously.

16. A viewing optic comprising (i) a main body with an optical system for generating images of an outward scene and a beam combiner and (ii) a base coupled to the main body and having an active display for generating images and a mirror for directing the generated images to the beam combiner for simultaneous overlaid viewing of the generated images and images of the outward scene in a first focal plane of the main body, and wherein the base has a compartment for one or more power sources.

17. A viewing optic comprising:
a body having (i) a first optical system having an objective lens system that focuses a target image from an outward scene to a first focal plane, an erector lens system that inverts the target image, a second focal plane, and (ii) a beam combiner that is placed between the objective lens system and the first focal plane; and
a base with (i) a second optical system with (a) an active display and a lens system that collects the light from the active display, (b) a mirror that directs the image from the active display to the beam combiner where the image from the active display and the target image from the objective lens system are combined into the first focal plane and viewed simultaneously; and (ii) a compartment for one or more power sources.

18. A viewing optic comprising a main body with an optical system for viewing an outward scene and a base coupled to the main body having an active display and a collector lens system for generating an image, wherein the generated image is combined into an image of the outward scene in a first focal plane of the optical system of the main body, and further wherein the base has a compartment for one or more power sources.

19. A viewing optic comprising:
(i) a main tube having (a) an objective system coupled to a first end of the main tube that focuses a target image from an outward scene; (b) an ocular system coupled to the second end of the main tube, the main tube, objective system and ocular system being configured to define at least a first focal plane; and (c) a beam combiner positioned between the objective assembly and the first focal plane; and
(ii) a base having an active display for generating an image and directing the image to the beam combiner, wherein the generated image and the target image are combined into the first focal plane, and the base further having a compartment for one or more power sources.

20. A viewing optic comprising (i) a main body with an optical system for generating images of an outward scene; and (ii) a base coupled to the main body and having an active display for generating images and a compartment for a power source.

21. A viewing optic comprising (i) a main body with an optical system for generating images of an outward scene; and (ii) a base coupled to the main body and having a compartment for a power source.

22. A viewing optic comprising:
a body having (i) a first optical system having an objective lens system that focuses a target image from an outward scene to a first focal plane, an erector lens system that inverts the target image, a second focal plane, and (ii) a beam combiner between the objective lens system and the first focal plane; and
a second optical system with an active display and a lens system that collects the light from the active display, and (ii) a mirror that directs the image from the active display to the beam combiner where the image from the active display and the target image from the objective lens system are combined into the first focal plane and viewed simultaneously, and further wherein the lens system is a five lens system.

23. A viewing optic comprising: an optical system configured to define a first focal plane; an active display for generating a digital image and a lens system for collecting the light from the active display, wherein the digital image is superimposed on the first focal plane; and a controller coupled to the active display, the controller configured to selectively power one or more display elements to generate the digital image, and further wherein the lens system is composed of an inner cell having two lenses and an outer cell having three lenses, wherein the outer cell is fixed in relation to the inner cell.

24. A viewing optic comprising (i) a main body with an optical system for generating images of an outward scene and a beam combiner and (ii) a base coupled to the body and having an active display for generating images and a lens system for collecting light from the active display and a mirror for directing the generated images to the beam combiner for simultaneous overlaid viewing of the generated images and images of the outward scene in a first focal plane of the main body, and further wherein the lens system is a five lens system and the first lens is located no more than 2 mm from the active display.

25. A viewing optic comprising:
a body having (i) a first optical system having an objective lens system that focuses a target image from an outward scene to a first focal plane, an erector lens system that inverts the target image, a second focal plane, and (ii) a beam combiner that is placed between the objective lens system and the first focal plane; and
a base with a second optical system with an active display and a lens system that collects the light from the active display, and (ii) a mirror that directs the image from the active display to the beam combiner where the image from the active display and the target image from the objective lens system are combined into the first focal plane and viewed simultaneously, wherein the lens system is a five lens system comprised of three singlet lenses and a doublet lens.

26. A viewing optic comprising a main body with an optical system for viewing an outward scene and a base coupled to the main body having an active display and a collector lens system for generating an image, wherein the generated image is combined into an image of the outward scene in a first focal plane of the optical system of the main body, wherein the collector lens system has an inner cell having at least one lens and an outer cell having at least one lens and a mechanism to adjust the spacing between the lens of the inner cell and the lens of the outer cell.

27. A viewing optic comprising:
(i) a main tube having (a) an objective system coupled to a first end of the main tube that focuses a target image from an outward scene; (b) an ocular system coupled to the second end of the main tube, the main tube, objective system and ocular system being configured to define at least a first focal plane; and (c) a beam combiner positioned between the objective assembly and the first focal plane; and (ii) a base having an active display for generating an image and a lens system for collecting light from the active display and a mirror for directing the image to the beam combiner, wherein the generated image and the target image are combined into the first focal plane of the main tube, and wherein the lens system has an inner cell with two lenses and an outer cell with three lenses.

27A. A viewing optic comprising: (a) a main tube having an objective system coupled to a first end of the main tube and an ocular system coupled to the second end of the main tube and a beam combiner located between the objective assembly and a first focal plane of an optics system; (b) an integrated display system for generating a digital image; and (c) a computing device for processing ballistics relevant data and causing said integrated display system to adapt an aiming reticle within the digital image.

28. The viewing optic of any of the preceding paragraphs further comprising a base.

29. The viewing optic of any of the preceding paragraphs further comprising an integrated display system.

30. The viewing optic of any of the preceding paragraphs further comprising a base with an integrated display system.

31. The viewing optic of any of the preceding or following paragraphs wherein the base couples to the main body of the viewing optic.

32. The viewing optic of any of the preceding or following paragraphs wherein the base couples to the bottom side of the main body of the viewing optic.

33. The viewing optic of any of the preceding or following paragraphs wherein the integrated display system is contained in a housing.

34. The viewing optic of any of the preceding or following paragraphs wherein the housing couples to the top of the main body of the viewing optic.

35. The viewing optic of any of the preceding paragraphs, wherein the integrated display system has an active display.

36. The viewing optic of any of the preceding paragraphs, wherein the integrated display system has an active display and a reflective material.

37. The viewing optic of any of the preceding paragraphs wherein the integrated display system has an active display, a reflective material, and a collection optics system.

38. The viewing optic of any of the preceding paragraphs, wherein the reflective material is located beneath the beam combiner.

39. The viewing optic of any of the preceding paragraphs, wherein the reflective material is located above the beam combiner.

40. The viewing optic of any of the preceding paragraphs, wherein the reflective material is parallel to the beam combiner.

41. The viewing optic of any of the preceding paragraphs, wherein the active display and the reflective material are parallel to the beam combiner.

42. The viewing optic of any of the preceding paragraphs, wherein the reflective material is located on the objective side of the viewing optic.

43. The viewing optic of any of the preceding paragraphs, wherein the reflective material is located on the ocular side of the viewing optic.

44. The viewing optic of any of the preceding paragraphs, wherein active display is located on the objective side of the viewing optic.

45. The viewing optic of any of the preceding paragraphs, wherein active display is located on the ocular side of the viewing optic.

46. The viewing optic of any of the preceding paragraphs, wherein the second optical system is in a base coupled to the body of the viewing optic.

47. The viewing optic of any of the preceding paragraphs, wherein the beam combiner is located between an objective assembly of the main body and a first focal plane positioned and spaced along the viewing optical axis.

48. The viewing optic of any of the preceding paragraphs, wherein the beam combiner is located approximately beneath an elevation knob of the viewing optic.

49. The viewing optic of any of the preceding paragraphs, wherein the beam combiner is located closer to an objective assembly as compared to an ocular assembly of the viewing optic.

50. The viewing optic of any of the preceding paragraphs, wherein the integrated display system comprises an angled mirror.

51. The viewing optic of any of the preceding paragraphs wherein the mirror is angled from about 40° to about 50°.

52. The viewing optic of any of the preceding paragraphs wherein the mirror is angled at about 45°.

53. The viewing optic of any of the preceding paragraphs, wherein the integrated display system comprises collector optics having an inner lens cell and an outer lens cell.

54. The viewing optic of any of the preceding paragraphs, wherein one end of the base attaches near a magnification adjustment ring of the main body and the other end of the base attaches near the objective assembly of the main body.

55. The viewing optic of any of the preceding paragraphs, wherein the base is from 40% to 65% percent the length of the main body.

56. The viewing optic of any of the preceding paragraphs further comprising a focus cell.

57. The viewing optic of any of the preceding paragraphs further comprising a focus cell adjusted toward the objective side as compared to the location of a traditional focus cell.

58. The viewing optic of any of the preceding paragraphs further comprising a beam combiner.

59. The viewing optic of any of the preceding paragraphs further comprising a beam combiner positioned where a traditional focus cell is located.

60. The viewing optic of any of the preceding paragraphs further comprising a parallax adjustment assembly.

61. The viewing optic of any of the preceding paragraphs further comprising a connecting rod in the main body of the viewing optic.

62. The viewing optic of any of the preceding paragraphs wherein the connecting element is a rod or a shaft 63. The viewing optic of any of the preceding paragraphs wherein the connecting element is from about 5 mm to 50 mm in length.

64. The viewing optic of any of the preceding paragraphs wherein the connecting element is about 30 mm in length.

65. The viewing optic of any of the preceding paragraphs wherein the parallax adjustment assembly comprises a rotatable element.

66. The viewing optic of any of the preceding paragraphs wherein the parallax adjustment assembly comprises a knob.

67. The viewing optic of any of the preceding paragraphs wherein the connecting element couples the focus cell to the parallax adjustment assembly.

68. The viewing optic of any of the preceding paragraphs wherein one end of the connecting element is coupled to the focusing cell and the other end of the connecting element is coupled to a cam pin of the parallax adjustment assembly.

69. The viewing optic of any of the preceding paragraphs wherein the parallax adjustment assembly has a cam groove and a cam pin.

70. The viewing optic of any of the paragraphs enumerated herein comprising a lens system for collecting light from an active display.

71. The viewing optic of any of the paragraphs enumerated herein wherein the lens system is composed of one or more lens cells.

72. The viewing optic of any of the paragraphs enumerated herein wherein the lens system is composed of an inner lens cell and an outer lens cell.

73. The viewing optic of any of the paragraphs enumerated herein wherein the lens system is composed of a 5 lens system.

74. The viewing optic of any of the paragraphs enumerated herein wherein the lens system is composed of an inner lens cell having two lenses and an outer lens cell having three lenses.

75. The viewing optic of any of the paragraphs enumerated herein wherein the lens system is a five lens system with the first lens located within 2 mm of the active display.

76. The viewing optic of any of the paragraphs enumerated herein wherein the lens system is composed of a five lens system and the first lens is an aspheric lens.

77. The viewing optic of any of the paragraphs enumerated herein wherein the lens system is composed of an inner lens cell having at least one lens and an outer lens cell having at least one lens, and further comprising a mechanism to adjust the space between the at least one lens of the inner cell and the at least one lens of the outer cell.

78. The viewing optic of any of the paragraphs enumerated herein further wherein one or more springs are located between the outer lens cell and the inner lens cell.

79. The viewing optic of any of the paragraphs enumerated herein wherein the lens system is composed of a single lens cell.

80. The viewing optic of any of the paragraphs enumerated herein wherein the adjustment mechanism is a screw.

81. The viewing optic of any of the paragraphs enumerated herein wherein the adjustment mechanism is a wedge.

82. The viewing optic of any of the paragraphs enumerated herein wherein a screw can be tightened against a surface of the inner lens cell to align the vertical axis of the active display.

83. The viewing optic of any of the paragraphs enumerated herein wherein a screw can be tightened against a surface of the inner lens cell to adjust the active display active display.

84. The viewing optic of any of the paragraphs enumerated herein wherein the power source is one or more batteries.

85. The viewing optic of any of the paragraphs enumerated herein wherein the power source is one or more CR123 batteries.

86. The viewing optic of any of the paragraphs enumerated herein further comprising one or more of a global positioning system (GPS) receiver, a digital compass and a laser rangefinder for providing location data to said computing device, said computing device responsively using some or all of said received data to calculate a ballistic solution.

87. The viewing optic of any of the paragraphs enumerated herein, wherein said computing device receives one or more of inertial data, location data, environmental sensor data and image data, said computing device responsively using some or all of said received data to calculate a ballistic solution.

88. The viewing optic of any of the paragraphs enumerated herein wherein said viewing optic is adapted to communicate with a network as a network element (NE), said computing device propagating toward said network some or all of said received data.

89. The viewing optic of any of the paragraphs enumerated herein, wherein in response to first user interaction, said computing device enters a ranging mode in which target related information associated with a presently viewed aiming reticle is retrieved and stored in a memory.

90. The viewing optic of any of the paragraphs enumerated herein, wherein in response to a second user interaction, said computing device enters a reacquisition mode in which previously stored target related information is retrieved from memory and used to adapt reticle imagery to reacquire a target.

91. The viewing optic of any of the paragraphs enumerated herein, further comprising a rangefinder for determining a distance to target and communicating the determined distance to said computing device, said computing device responsively adapting said aiming reticle in response to said determined distance.

92. The viewing optic of any of the paragraphs enumerated herein, wherein said rangefinder comprises one of a laser rangefinder and a parallax rangefinder.

93. The viewing optic of any of the paragraphs enumerated herein, wherein said laser rangefinder comprises a near infrared (NIR) rangefinder.

94. The viewing optic of any of the paragraphs enumerated herein, further comprising an imaging sensor adapted to detect image frames associated with a bullet flight path and communicate said image frames to said computing device, said computing device operable to calculate bullet trajectory therefrom.

95. The viewing optic of any of the paragraphs enumerated herein, wherein said imaging sensor is adapted to detect emissions within a spectral region associated with a tracer round.

96. The viewing optic of any of the paragraphs enumerated herein, further comprising windage and elevation knobs adapted to communicate respective user input to said computing device, said computing device responsively adapting said aiming reticle in response to said user input.

97. The viewing optic of any of the paragraphs enumerated herein, wherein in response to user interaction indicative of a specific, said computing device enters an indirect fire targeting mode in which target related information is retrieved from memory and used to adapt aiming reticle imagery to reacquire a target.

98. The viewing optic of any of the paragraphs enumerated herein, wherein in response to user interaction indicative of a secondary ammunition mode, said computing device responsively adapting said aiming reticle in response to ballistic characteristics associated with the secondary ammunition.

99. The viewing optic of any of the paragraphs enumerated herein, wherein said environmental data comprises one or more of barometric pressure data, humidity data and temperature data, said computing device responsively using some or all of said environmental data to calculate the ballistic solution.

100. The viewing optic of any of the paragraphs enumerated herein, wherein in the case of an aiming reticle outside an optical scope field of view, said computing device utilizes inertial reference information to generate for display a simulated aim point reference.

101. A method of viewing with a viewing optic comprising: viewing a scene with a first optical system positioned along a viewing optical axis in a main body of the viewing optic; and simultaneously viewing images generated by an integrated display system located in a cavity of a base, wherein the base couples to the main body of the viewing optic.

102. A method of viewing with a viewing optic comprising: viewing a scene with a first optical system positioned along a viewing optical axis in a main body of the viewing optic; and simultaneously viewing images generated by an integrated display system located in a cavity of a base, wherein the image of the scene and the generated image are projected into a first focal plane of the optical system.

103. A method of viewing with a viewing optic comprising: viewing a scene with a first optical system positioned along a viewing optical axis in a main body of the viewing optic having an objective assembly and an ocular assembly; and simultaneously viewing images generated by an integrated display system located in a cavity of a base, wherein the image of the scene and the generated image are projected into a first focal plane of the optical system, the integrated display system having an active display for generating the image, a lens system for collecting light from the image, and a reflective surface for directing the generated image into a beam combiner located between an objective assembly and the first focal plane of the main body.

104. A method of viewing with a viewing optic comprising: viewing a scene with a first optical system positioned along a viewing optical axis in a main body of the viewing optic; and simultaneously viewing images generated by an integrated display system located in a cavity of a base, wherein the image of the scene and the generated image are projected into a first focal plane of the optical system, and eliminating parallax error by adjusting a parallax knob that is connected to a focusing cell by a connecting rod.

105. A method of viewing with a viewing optic comprising: viewing a scene with a first optical system positioned along a viewing optical axis in a main body of the viewing optic; and simultaneously viewing images generated by an integrated display system, wherein the image of the scene and the generated image are projected into a first focal plane of the optical system, and eliminating parallax error by adjusting a parallax knob that is connected to a focusing cell by a connecting rod.

106. A method of viewing with a viewing optic comprising: generating an image with an active display located in a base that couples to a main body of a viewing optic, collecting light from the active display with a lens system; reflecting the generated image from the base to a beam combiner in the main body, and projecting the generated image into the a first focal plane of the main body.

107. A method of viewing with a viewing optic comprising: viewing a scene with a first optical system positioned along a viewing optical axis in a main body of the viewing optic having an objective assembly and an ocular assembly; generating an image with an active display located in a base that couples to the main body of a viewing optic, collecting light from the active display with a lens system; reflecting the generated image from the base to a beam combiner located between the objective assembly and a first focal plane in the main body, and projecting the generated image into the a first focal plane of the main body so that the generated image and the imaged scene can be viewed simultaneously.

108. A method of providing information to a user of a viewing optic comprising:
(a) providing a viewing optic having a main body, the main body having an objective system coupled to a first end of a main tube and an ocular system coupled to the second end of the main tube, the main tube, objective system and ocular system being configured to define at least a first focal plane;
(b) generating an image from an active display located in a base that couples to the main body of the viewing optic;
(c) reflecting the emitted light from the display to a beam combiner located between the objective assembly and the first focal plane in the main body where the image from the active display and a target image from the objective lens system are combined into the first focal plane and viewed simultaneously.

109. The method of any of the paragraphs enumerated herein comprising controlling the active display with electronics.

110. The method of any of the paragraphs enumerated herein comprising providing images for at least one of the following: active target reticle, corrected aim point, range and wind information, elevation, GPS and compass information, target ID, external sensor information, ballistics information, with the active display.

111. The method of any of the paragraphs enumerated herein comprising controlling the active display brightness to allow for viewing under ambient conditions ranging from full sunlight to overcast starlight.

112. A viewing optic comprising: a body having an objective lens system at one end that focuses a target image from an outward scene, an ocular lens system at the other end and a movable erector tube with an erector lens system located between the objective and ocular systems, the movable erector lens system, the objective lens system and the ocular lens system forming a first optical system having a first focal plane and a second focal plane, with a first reticle at the first focal plane that moves in conjunction with the movable erector tube and a beam combiner located between the first focal plane and the objective assembly; and
a second optical system with an active display for generating an image and a lens system that collects light from the active display, and a reflective material that directs the generated image from the active display to the beam combiner where the image from the active display and the target image from the objective lens system are combined into the first focal plane and viewed simultaneously.

113. A viewing optic comprising: (a) a main tube; (b) an objective system coupled to a first end of the main tube that focuses a target image from an outward scene; (c) an ocular system coupled to the second end of the main tube, the main tube, objective system and ocular system being configured to define at least a first focal plane, with a first reticle at the first focal plane that moves in relation to turret adjustments; (d) a beam combiner positioned between the objective assembly and the first focal plane; and (e) an active display for generating an image and directing the image to the beam combiner, wherein the generated image and the target image are combined into the first focal plane.

114. A viewing optic comprising: (i) a main body with an optical system for generating images along a viewing optical axis of an outward scene and a beam combiner and (ii) a base coupled to the main body and having an active display for generating images and a mirror for directing the generated images to the beam combiner for simultaneous overlaid viewing of the generated images and images of the outward scene in a first focal plane of the main body.

115. A viewing optic comprising:
a main body having (i) a first optical system having an objective lens system that focuses a target image from an outward scene to a first focal plane, an erector lens system that inverts the target image, a second focal plane, and (ii) a beam combiner that is placed between the objective lens system and the first focal plane; and
a base that couples to the main body having a second optical system with (i) an active display that generates an image and a lens system that collects the light from the active display, and (ii) a mirror that directs the generated image from the active display to the beam combiner where the image from the active display and the target image from the objective lens system are combined into the first focal plane and viewed simultaneously.

116. An viewing optic comprising a main body with an optical system for viewing an outward scene and a base that couples to a bottom portion of the main body, the base having a cavity with an active display for generating an image, wherein the generated image is combined into the image of the outward scene in the first focal plane of the optical system.

117. A viewing optic comprising: an optical system having a beam combiner between a first focal plane and an objective lens system, a focus cell positioned between the beam combiner and the objective lens system, and an active display for generating an image, wherein the image is superimposed on the first focal plane; and a controller coupled to the active display, the controller configured to selectively power one or more display elements to generate the image.

118. A viewing optic comprising: a main body having an objective system coupled to a first end of a main tube that focuses a target image from an outward scene and an ocular system coupled to the second end of the main tube, the main tube, objective system and ocular system being configured to define at least a first focal plane; a beam combiner positioned between the objective assembly and the first focal plane; a focus cell positioned between the beam combiner and the objective assembly; a rod coupling the focus cell to a parallax adjustment assembly; and an active display for generating an image and a reflective surface for directing the digital image to the beam combiner, wherein the generated mage and target image can be focused on the first focal plane.

119. A viewing optic comprising:
a body having (i) a first optical system having an objective lens system that focuses a target image from an outward scene to a first focal plane, an erector lens system that inverts the target image, a second focal plane, and an ocular lens system, (ii) a beam combiner between the objective lens system and the first focal plane, (iii) a focus cell between the beam combiner and the objective lens system; and (iv) a connecting element coupling the focus cell to a parallax adjustment assembly.

120. A viewing optic comprising: (a) a main tube; (b) an objective system coupled to a first end of the main tube; (c) an ocular system coupled to the second end of the main tube, (c) a beam combiner positioned between the objective assembly and the first focal plane; and (d) a focus cell positioned between the beam combiner and the objective assembly.

121. A viewing optic comprising:
a main body having (i) an optical system having an objective lens system that focuses a target image from an outward scene to a first focal plane, an erector lens system that inverts the target image, a second focal plane, and (ii) a beam combiner; and
a base that couples to a bottom portion of the main body having a cavity housing an active display for generating an image, a lens system that collects the light from the active display, and a reflective material that directs the image from the active display to the beam combiner where the image from the active display and the target image from the objective lens system are combined into the first focal plane and viewed simultaneously, the base further having a compartment for one or more power sources.

122. A viewing optic comprising:
a main body having an objective system coupled to a first end of a main tube that focuses a target image from an outward scene and an ocular system coupled to the second end of the main tube, the main tube, objective system and ocular system being configured to define at least a first focal plane and a beam combiner positioned between the objective assembly and the first focal plane; and
a base having an active display for generating an image and directing the image to the beam combiner, wherein the generated image and the target image are combined into the first focal plane, the base further having a compartment for one or more power sources.

123. A viewing optic comprising (i) a main body with an optical system for generating images of an outward scene; and (ii) a base coupled to the main body and having an active display for generating images and directing the images into a first focal plane of the optical system and a compartment for one or more power sources.

124. A viewing optic comprising (i) a main body with an optical system for generating images of an outward scene and a beam combiner and (ii) a base coupled to the main body and having an active display for generating images and a reflective material for directing the generated images to the beam combiner for simultaneous overlaid viewing of the generated images and images of the outward scene in a first focal plane of the main body, and wherein the base has a compartment for one or more power sources.

125. A viewing optic comprising a main body with an optical system for viewing an outward scene and a base coupled to the main body having an active display and a collector lens system for generating an image, wherein the generated image is combined into an image of the outward scene in a first focal plane of the optical system of the main body, and further wherein the base has a compartment for one or more power sources.

126. A viewing optic comprising:
(i) a main tube having (a) an objective system coupled to a first end of the main tube that focuses a target image from an outward scene; (b) an ocular system coupled to the second end of the main tube, the main tube, objective system and ocular system being configured to define at least a first focal plane; and (c) a beam combiner positioned between the objective assembly and the first focal plane; and
(ii) a base having an active display for generating an image and directing the image to the beam combiner, wherein the generated image and the target image are combined into the first focal plane, and the base further having a compartment for one or more power sources.

127. A viewing optic comprising: an optical system configured to define a first focal plane; an active display for generating an image, and a reflective material for directing the image to the first focal plane; and one or more adjustment mechanisms for performing one or more of the following: (a) moving the active display in relation to the reflective material, and (b) moving the reflective material in relation to the active display.

128. A viewing optic comprising: (a) a main tube; (b) an objective system coupled to a first end of the main tube that focuses a target image from an outward scene; (c) an ocular system coupled to the second end of the main tube, the main tube, objective system and ocular system being configured to define at least a first focal plane; and (d) a beam combiner positioned between the objective assembly and the first focal plane, (e) an active display for generating an image and a reflective material that directs the image from the active display to the beam combiner, wherein the image from the active display and the target image from the objective lens system are combined into the first focal plane and viewed simultaneously and (f) an adjustment mechanism for performing one or more of the following: (i) moving the active display in relation to the reflective material, or (ii) moving the reflective material in relation to the active display.

129. A viewing optic comprising:
a body having (i) a first optical system having an objective lens system that focuses a target image from an outward scene to a first focal plane, an erector lens system that inverts the target image, a second focal plane, an ocular lens system for viewing the target image, (ii) a beam combiner; (iii) a second optical system with an active display for generating an image, and a reflective material that directs the generated image from the active display to the beam combiner, and one or more adjustment mechanisms for performing one or more of the following: (a) moving the active display in relation to the reflective material, (b) moving the reflective material in relation to the active display, (c) moving the reflective material in relation to the beam combiner, (d) moving the beam combiner in relation to the reflective material, and (e) moving the erector lens system in relation to the beam combiner, wherein the image from the active display and the target image from the objective lens system are combined into the first focal plane and viewed simultaneously.

While multiple embodiments of a viewing optic with an integrated display system have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A viewing optic comprising: (i) a main body with an optical system having a moveable optical element for generating an image of an outward scene, a turret for adjustment of the moveable optical element and a beam combiner and (ii) a base coupled to the main body and having an active display for generating an image and a reflective material for directing the generated image to the beam combiner for simultaneous viewing of the generated image and image of the outward scene in a first focal plane of the optical system, wherein the generated image from the active display is in focus regardless of the turret position.

2. The viewing optic of claim 1, wherein the beam combiner is located between an objective assembly of the main body and the first focal plane.

3. The viewing optic of claim 1, wherein the beam combiner is located approximately beneath an elevation knob of the viewing optic.

4. The viewing optic of claim 1, wherein the beam combiner is located closer to an objective assembly as compared to an ocular assembly of the viewing optic.

5. The viewing optic of claim 1, wherein the reflective material is a mirror that is angled.

6. The viewing optic of claim 5, wherein the mirror is angled from about 40° to about 50° relative to emitted light of the display.

7. The viewing optic of claim 5, wherein the mirror is angled at about 45° relative to emitted light of the display.

8. The viewing optic of claim 1, further comprising a collector lens system to collect light from the active display and having an inner lens cell and an outer lens cell.

9. The viewing optic of claim 1, wherein one end of the base attaches near a magnification adjustment ring of the main body and the other end of the base attaches near the objective assembly of the main body.

10. The viewing optic of claim 1, wherein the base is from 40% to 65% the length of the main body.

11. A viewing optic comprising:
a main body having (i) an optical system having an objective lens system that focuses a target image from an outward scene to a first focal plane, an erector system that inverts the target image, a second focal plane, and (ii) a beam combiner that is placed between the objective lens system and the first focal plane; and
a base that couples to the main body having (i) an active display that generates an image and a lens system that collects the light from the active display, and (ii) a reflective material that directs the generated image from the active display to the beam combiner, and wherein the generated image from the active display and the target image from the objective lens system are viewed in the first focal plane, and further wherein the generated image from the active display is in focus regardless of adjustment of the erector system.

12. The viewing optic of claim 11, wherein one end of the base attaches near a magnification adjustment ring of the main body and the other end of the base attaches near the objective assembly of the main body.

13. The viewing optic of claim 11, wherein the base is from 40% to 65% the length of the main body.

14. The viewing optic of claim 11, wherein the active display is selected from the group consisting of: a transmissive active matrix LCD display (AMLCD), an organic light-emitting diode (OLED) display, a Light-Emitting Diode (LED) display, an e-ink display, a plasma display, a segment display, an electroluminescent display, a surface-conduction electron-emitter display, and a quantum dot display.

15. The viewing optic of claim 11, wherein the image generated by the active display is selected from the group consisting of: text, alpha-numeric, graphics, symbols, video imagery, icons, active target reticles, range measurements, wind information, GPS and compass information, firearm inclination information, target finding, recognition and identification (ID) information, external sensor information, temperature, pressure, humidity, real time ballistic solutions, and next round ballistic correction through in-flight tracer round detection and tracking.

16. The viewing optic of claim 11, wherein the beam combiner is located from 5 to 25 mm from the objective assembly.

17. A viewing optic comprising a main body with an optical system for viewing an outward scene and a base that couples to a bottom portion of the main body, the base having a cavity with an active display for generating an image, wherein the generated image is combined into an image of the outward scene in a first focal plane of the optical system, wherein one end of the base attaches near a magnification adjustment ring of the main body and the other end of the base attaches near the objective assembly of the main body.

18. The viewing optic of claim 17, wherein the base is from 40% to 65% the length of the main body.

19. The viewing optic of claim 17, wherein the main body has a beam combiner.

20. The viewing optic of claim 19, wherein the beam combiner is located between an objective assembly of the main body and the first focal plane.

21. The viewing optic of claim 19, wherein the beam combiner is located approximately beneath an elevation knob of the viewing optic.

22. The viewing optic of claim 17, wherein the image generated by the active display is selected from the group consisting of: active target reticles, firearm inclination information, target finding, recognition and identification (ID) information, real time ballistic solutions, and next round ballistic correction through in-flight tracer round detection and tracking.

23. The viewing optic of claim 17, wherein the image generated by the active display is a real time ballistic solution.

24. The viewing optic of claim 17, wherein the image generated by the active display is a next round ballistic correction through in-flight tracer round detection and tracking.

* * * * *